United States Patent
Yamazaki et al.

(10) Patent No.: US 11,101,386 B2
(45) Date of Patent: Aug. 24, 2021

(54) SEMICONDUCTOR DEVICE AND METHOD FOR MANUFACTURING THE SAME

(71) Applicant: Semiconductor Energy Laboratory Co., Ltd., Atsugi (JP)

(72) Inventors: Shunpei Yamazaki, Setagaya (JP); Daisuke Matsubayashi, Yokohama (JP); Ryota Hodo, Atsugi (JP); Daigo Ito, Isehara (JP); Hiroaki Honda, Odawara (JP); Satoru Okamoto, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 17 days.

(21) Appl. No.: 16/634,493

(22) PCT Filed: Jul. 26, 2018

(86) PCT No.: PCT/IB2018/055581
§ 371 (c)(1),
(2) Date: Jan. 27, 2020

(87) PCT Pub. No.: WO2019/025912
PCT Pub. Date: Feb. 7, 2019

(65) Prior Publication Data
US 2020/0185528 A1  Jun. 11, 2020

(30) Foreign Application Priority Data

Aug. 4, 2017  (JP) .............................. JP2017-151412

(51) Int. Cl.
*H01L 29/786* (2006.01)
*G11C 11/4091* (2006.01)
(Continued)

(52) U.S. Cl.
CPC ...... *H01L 29/7869* (2013.01); *G11C 11/4091* (2013.01); *H01L 27/1052* (2013.01);
(Continued)

(58) Field of Classification Search
CPC ... H01L 29/7869; H01L 29/24; H01L 29/417; H01L 29/42384; H01L 29/4908;
(Continued)

(56) References Cited

U.S. PATENT DOCUMENTS 6,333,229 B1  12/2001  Furukawa et al.
6,673,683 B1  1/2004  Sheu et al.
(Continued)

FOREIGN PATENT DOCUMENTS

CN  001499646 A  5/2004
CN  106480415 A  3/2017
(Continued)

OTHER PUBLICATIONS

International Search Report (Application No. PCT/IB2018/055581) dated Oct. 30, 2018.
(Continued)

*Primary Examiner* — Tong-Ho Kim
(74) *Attorney, Agent, or Firm* — Robinson Intellectual Property Law Office; Eric J. Robinson

(57) ABSTRACT

A semiconductor device having favorable electrical characteristics is provided. The semiconductor device includes an oxide; a first conductor and a second conductor over the oxide; a third conductor over the oxide; a first insulator provided between the oxide and the third conductor and covering a side surface of the third conductor; a second insulator over the third conductor and the first insulator; a third insulator positioned over the first conductor and at a side surface of the second insulator; a fourth insulator positioned over the second conductor and at a side surface
(Continued)

of the second insulator; a fourth conductor being in contact with a top surface and a side surface of the third insulator and electrically connected to the first conductor; and a fifth conductor being in contact with a top surface and a side surface of the fourth insulator and electrically connected to the second conductor. The first insulator is between the third insulator and the third conductor, and between the fourth insulator and the third conductor.

20 Claims, 40 Drawing Sheets

(51) Int. Cl.
| | |
|---|---|
| *H01L 27/108* | (2006.01) |
| *H01L 27/105* | (2006.01) |
| *H01L 27/12* | (2006.01) |
| *H01L 29/423* | (2006.01) |
| *H01L 29/49* | (2006.01) |
| *H01L 29/66* | (2006.01) |
| *H01L 29/24* | (2006.01) |
| *H01L 29/417* | (2006.01) |

(52) U.S. Cl.
CPC .... *H01L 27/10808* (2013.01); *H01L 27/1225* (2013.01); *H01L 29/24* (2013.01); *H01L 29/417* (2013.01); *H01L 29/42384* (2013.01); *H01L 29/4908* (2013.01); *H01L 29/66969* (2013.01); *H01L 29/78648* (2013.01)

(58) Field of Classification Search
CPC ......... H01L 29/66969; H01L 29/78648; H01L 27/1052; H01L 27/10808; H01L 27/1225
USPC .......................................................... 257/43
See application file for complete search history.

(56) References Cited

U.S. PATENT DOCUMENTS

| | | | |
|---|---|---|---|
| 6,841,831 B2 | 1/2005 | Hanafi et al. | |
| 6,958,500 B2 | 10/2005 | Saito | |
| 8,547,771 B2 | 10/2013 | Koyama | |
| 8,809,854 B2 | 8/2014 | Isobe et al. | |
| 9,768,318 B2 | 9/2017 | Yamazaki et al. | |
| 10,147,681 B2 | 12/2018 | Yamazaki et al. | |
| 10,181,531 B2 | 1/2019 | Sasagawa et al. | |
| 2012/0223304 A1 | 9/2012 | Yoneda | |
| 2013/0334533 A1 | 12/2013 | Yamazaki | |
| 2016/0284859 A1 | 9/2016 | Asami | |
| 2017/0012139 A1* | 1/2017 | Sasagawa | H01L 21/32136 |
| 2017/0062192 A1 | 3/2017 | Oota et al. | |
| 2017/0110453 A1 | 4/2017 | Ikeda | |
| 2018/0166392 A1* | 6/2018 | Yamazaki | H01L 29/0847 |

FOREIGN PATENT DOCUMENTS

| | | |
|---|---|---|
| JP | 2004-152790 A | 5/2004 |
| JP | 2012-256314 A | 12/2012 |
| JP | 2012-257187 A | 12/2012 |
| JP | 2017-043843 A | 3/2017 |
| JP | 2017-050530 A | 3/2017 |
| JP | 2017-076789 A | 4/2017 |
| KR | 2004-0038710 A | 5/2004 |
| KR | 2012-0100806 A | 9/2012 |
| KR | 2017-0044595 A | 4/2017 |
| TW | 200411938 | 7/2004 |
| TW | 201241966 | 10/2012 |

OTHER PUBLICATIONS

Written Opinion (Application No. PCT/IB2018/055581) dated Oct. 30, 2018.
Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.
Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.
Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.
Yamazaki.S et al., "In—Ga—Zn-Oxide Semiconductor and Its Transistor Characteristics", ECS Journal of Solid State Science and Technology, Jul. 1, 2014, vol. 3, No. 9, pp. Q3012-Q3022.
Yamazaki.S, "Crystalline Oxide Semiconductor Using CAAC-IGZO and its Application", ECS Transactions, Oct. 1, 2014, vol. 64, No. 10, pp. 155-164, The Electrochemical Society.
Kato.K et al., "Evaluation of Off-State Current Characteristics of Transistor Using Oxide Semiconductor Material, Indium.Gallium. Zinc Oxide", Jpn. J. Appl. Phys. (Japanese Journal of Applied Physics) , 2012, vol. 51, pp. 021201-1-021201-7.
Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.
Amano.S et al., "Low Power LC Display Using In—Ga—Zn—Oxide TFTs Based on Variable Frame Frequency", SID Digest '10 : SID International Symposium Digest of Technical Papers, May 23, 2010, vol. 41, No. 1, pp. 626-629.

\* cited by examiner

SEMICONDUCTOR DEVICE AND METHOD FOR MANUFACTURING THE SAME

TECHNICAL FIELD

One embodiment of the present invention relates to a semiconductor device and a manufacturing method thereof. Another embodiment of the present invention relates to a semiconductor wafer, a module, and an electronic device.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. A display device (e.g., a liquid crystal display device and a light-emitting display device), a projection device, a lighting device, an electro-optical device, a power storage device, a memory device, a semiconductor circuit, an imaging device, an electronic device, and the like may include a semiconductor device.

Note that one embodiment of the present invention is not limited to the above technical field. One embodiment of the invention disclosed in this specification and the like relates to an object, a method, or a manufacturing method. Furthermore, one embodiment of the present invention relates to a process, a machine, manufacture, or a composition of matter.

BACKGROUND ART

In recent years, semiconductor devices have been developed to be used mainly for an LSI, a CPU, or a memory. A CPU is an aggregation of semiconductor elements each provided with an electrode which is a connection terminal, which includes a semiconductor integrated circuit (including at least a transistor and a memory) separated from a semiconductor wafer.

A semiconductor circuit (IC chip) of an LSI, a CPU, a memory, or the like is mounted on a circuit board, for example, a printed wiring board, to be used as one of components of a variety of electronic devices.

A technique by which a transistor is formed using a semiconductor thin film formed over a substrate having an insulating surface has attracted attention. The transistor is used in a wide range of electronic devices such as an integrated circuit (IC) or an image display device (also simply referred to as a display device). Silicon-based semiconductor materials are widely known as materials for semiconductor thin films which can be used in transistors; oxide semiconductors have been attracting attention as other materials. Examples of oxide semiconductors include not only single-component metal oxides, such as indium oxide and zinc oxide, but also multi-component metal oxides. Among the multi-component metal oxides, in particular, an In—Ga—Zn oxide (hereinafter also referred to as IGZO) has been actively studied.

From the studies on IGZO, in an oxide semiconductor, a c-axis aligned crystalline (CAAC) structure and a nanocrystalline (nc) structure, which are not single crystal nor amorphous, have been found (see Non-Patent Documents 1 to 3). In Non-Patent Documents 1 and 2, a technique for forming a transistor using an oxide semiconductor having a CAAC structure is disclosed. Moreover, Non-Patent Documents 4 and 5 disclose that a fine crystal is included even in an oxide semiconductor which has lower crystallinity than the CAAC structure and the nc structure.

In addition, a transistor which includes IGZO as an active layer has an extremely low off-state current (see Non-Patent Document 6), and an LSI and a display utilizing the characteristics have been reported (see Patent Document 1 and Non-Patent Documents 7 and 8).

It is known that a transistor including an oxide semiconductor has an extremely low leakage current in an off state. For example, a low-power-consumption CPU utilizing a characteristic of a low leakage current of the transistor including an oxide semiconductor has been disclosed (see Patent Document 1).

Furthermore, a method for manufacturing a transistor including an oxide semiconductor in which a gate electrode is embedded in an opening portion is disclosed (see Patent Document 2).

In recent years, demand for an integrated circuit in which transistors and the like are integrated with high density has risen with reductions in the size and weight of an electronic device. In addition, the productivity of a semiconductor device including an integrated circuit is required to be improved.

REFERENCE

Patent Document

[Patent Document 1] Japanese Published Patent Application No. 2012-257187
[Patent Document 2] Japanese Published Patent Application No. 2017-050530

Non-Patent Document

[Non-Patent Document 1] S. Yamazaki et al., "SID Symposium Digest of Technical Papers", 2012, volume 43, issue 1, pp. 183-186.
[Non-Patent Document 2] S. Yamazaki et al., "Japanese Journal of Applied Physics", 2014, volume 53, Number 4S, pp. 04ED18-1-04ED18-10.
[Non-Patent Document 3] S. Ito et al., "The Proceedings of AM-FPD'13 Digest of Technical Papers", 2013, pp. 151-154.
[Non-Patent Document 4] S. Yamazaki et al., "ECS Journal of Solid State Science and Technology", 2014, volume 3, issue 9, pp. Q3012-Q3022.
[Non-Patent Document 5] S. Yamazaki, "ECS Transactions", 2014, volume 64, issue 10, pp. 155-164.
[Non-Patent Document 6] K. Kato et al., "Japanese Journal of Applied Physics", 2012, volume 51, pp. 021201-1-021201-7.
[Non-Patent Document 7] S. Matsuda et al., "2015 Symposium on VLSI Technology Digest of Technical Papers", 2015, pp. T216-T217.
[Non-Patent Document 8] S. Amano et al., "SID Symposium Digest of Technical Papers", 2010, volume 41, issue 1, pp. 626-629.

DISCLOSURE OF INVENTION

An object of one embodiment of the present invention is to provide a semiconductor device that can be miniaturized or highly integrated. Another object of one embodiment of the present invention is to provide a semiconductor device having favorable electrical characteristics. Another object of one embodiment of the present invention is to provide a semiconductor device having favorable frequency characteristics. Another object of one embodiment of the present invention is to provide a highly reliable semiconductor device. Another object of one embodiment of the present invention is to provide a semiconductor device with high productivity.

Another object of one embodiment of the present invention is to provide a semiconductor device capable of retaining data for a long time. Another object of one embodiment of the present invention is to provide a semiconductor device capable of high-speed data writing. Another object of one embodiment of the present invention is to provide a semiconductor device with high design flexibility. Another object of one embodiment of the present invention is to provide a low-power semiconductor device. Another object of one embodiment of the present invention is to provide a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device that includes an oxide; a first conductor and a second conductor over the oxide; a third conductor over the oxide; a first insulator provided between the oxide and the third conductor and covering a side surface of the third conductor; a second insulator over the third conductor and the first insulator; a third insulator over the first conductor and in contact with a first side surface of the second insulator; a fourth insulator over the second conductor and in contact with a second side surface of the second insulator; a fourth conductor that is in contact with a top surface and a side surface of the third insulator and is electrically connected to the first conductor; and a fifth conductor that is in contact with a top surface and a side surface of the fourth insulator and is electrically connected to the second conductor. The first insulator is between the third insulator and the side surface of the third conductor. The first insulator is between the fourth insulator and the side surface of the third conductor.

In the above structure, it is preferable that the first insulator have a first thickness between the oxide and the third conductor and a second thickness between the third conductor and each of the first conductor and the second conductor and that the first thickness be smaller than the second thickness.

In the above structure, it is preferable that the first insulator include a fifth insulator between the oxide and the third conductor and include the fifth insulator and a sixth insulator between the third conductor and each of the first conductor and the second conductor.

In the above structure, it is preferable that the semiconductor device further include a seventh insulator and an eighth insulator, the seventh insulator be provided between the first conductor and the third insulator, the seventh insulator be an oxide including at least one of aluminum and hafnium, the eighth insulator be provided between the second conductor and the fourth insulator, and the eighth insulator be an oxide including at least one of aluminum and hafnium.

In the above structure, it is preferable that the semiconductor device further include a ninth insulator, the ninth insulator be provided between the third conductor and the first insulator, and the ninth insulator be an oxide containing at least one of aluminum and hafnium.

In the above structure, it is preferable that the second insulator include an oxide containing at least one of aluminum and hafnium or a nitride containing silicon.

In the above structure, it is preferable that the third insulator and the fourth insulator include an oxide containing at least one of aluminum and hafnium or a nitride containing silicon.

In the above structure, it is preferable that the oxide contain In, an element M (M is Al, Ga, Y, or Sn), and Zn.

In the above structure, it is preferable that the first conductor and the second conductor include at least one of aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum.

In the above structure, it is preferable that the first conductor and the second conductor include at least one of tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel.

According to one embodiment of the present invention, a semiconductor device that can be miniaturized or highly integrated can be provided. According to one embodiment of the present invention, a semiconductor device having favorable electrical characteristics can be provided. According to one embodiment of the present invention, a semiconductor device having favorable frequency characteristics can be provided. According to one embodiment of the present invention, a highly reliable semiconductor device can be provided. According to one embodiment of the present invention, a semiconductor device with high productivity can be provided.

According to one embodiment of the present invention, a semiconductor device capable of retaining data for a long time can be provided. According to one embodiment of the present invention, a semiconductor device capable of high-speed data writing can be provided. According to one embodiment of the present invention, a semiconductor device with high design flexibility can be provided. According to one embodiment of the present invention, a low-power semiconductor device can be provided. According to one embodiment of the present invention, a novel semiconductor device can be provided.

Note that the description of these effects does not preclude the existence of other effects. One embodiment of the present invention does not necessarily have all the effects listed above. Other effects will be apparent from and can be derived from the description of the specification, the drawings, the claims, and the like.

BEST MODE FOR CARRYING OUT THE INVENTION

Figure 1A:
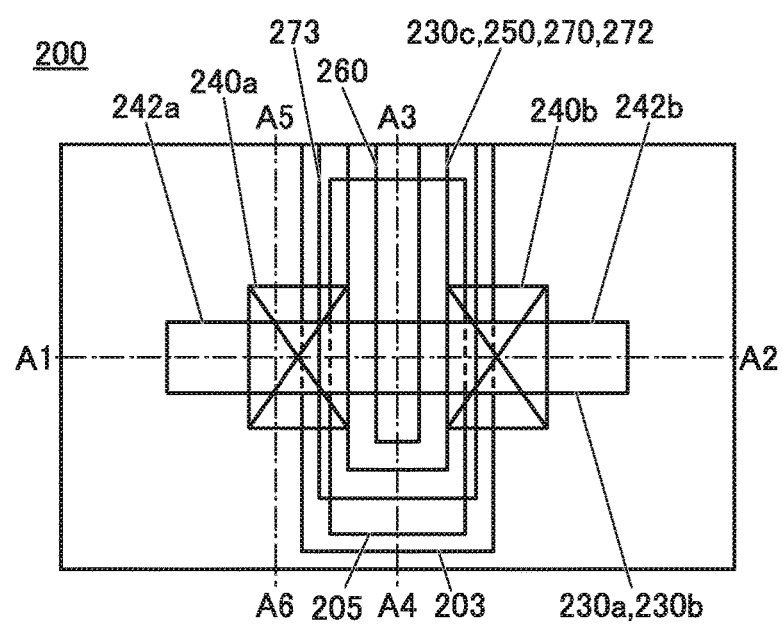
FIGS. 1A to 1C are a top view and cross-sectional views of a semiconductor device of one embodiment of the present invention.

Hereinafter, embodiments will be described with reference to drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings. For example, in the actual manufacturing process, a layer, a resist mask, or the like might be unintentionally reduced in size by treatment such as etching, which is not illustrated in some cases for easy understanding. In the drawings, the same portions or portions having similar functions are denoted by the same reference numerals in different drawings, and explanation thereof will not be repeated in some cases. Furthermore, the same hatching pattern is applied to portions having similar functions, and the portions are not especially denoted by reference numerals in some cases.

Especially in a top view (also referred to as a "plan view"), a perspective view, or the like, some components might not be illustrated for easy understanding of the invention. In addition, some hidden lines and the like might not be shown.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In this specification and the like, terms for describing arrangement, such as "over", "above", "under", and "below", are used for convenience in describing a positional relation between components with reference to drawings. Furthermore, the positional relationship between components is changed as appropriate in accordance with the direction in which each component is described. Thus, the positional relation is not limited to that described with a term used in this specification and can be explained with other terms as appropriate depending on the situation.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, or a load) is not connected between X and Y, and the case where X and Y are connected without the element that allows the electrical connection between X and Y provided therebetween.

For example, in the case where X and Y are electrically connected, one or more elements that allow an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is turned on or off to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that allow a functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

In this specification and the like, a transistor is an element having at least three terminals of a gate, a drain, and a source. The transistor has a region where a channel is formed between the drain (a drain terminal, a drain region, or a drain electrode) and the source (a source terminal, a source region, or a source electrode), and current can flow between the source and the drain through the region where a channel is formed. Note that in this specification and the like, a region where a channel is formed refers to a region through which current mainly flows.

Furthermore, functions of a source and a drain might be switched when a transistor of opposite polarity is employed or the direction of current flow is changed in circuit operation, for example. Therefore, the terms "source" and "drain" can be switched in some cases in this specification and the like.

Note that the channel length refers to, for example, the distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not fixed to one value in some cases. Thus, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not fixed to one value in some cases. Thus, in this specification, the channel width is any one of values, the maximum value, the minimum value, or the average value in a region where a channel is formed.

Note that depending on transistor structures, a channel width in a region where a channel is actually formed (hereinafter referred to as an "effective channel width") is different from a channel width shown in a top view of a transistor (hereinafter referred to as an "apparent channel width") in some cases. For example, in a transistor having a gate electrode covering the side surface of a semiconductor, an effective channel width is greater than an apparent channel width, and its influence cannot be ignored in some cases. For example, in a miniaturized transistor having a gate electrode covering the side surface of a semiconductor, the proportion of a channel formation region formed in the side surface of a semiconductor is increased. In that case, an effective channel width is greater than an apparent channel width.

In such a case, an effective channel width is difficult to measure in some cases. For example, to estimate an effective channel width from a design value, it is necessary to assume that the shape of a semiconductor is known as an assumption condition. Accordingly, in the case where the shape of a semiconductor is not known accurately, it is difficult to measure an effective channel width accurately.

Thus, in this specification, an apparent channel width is referred to as a surrounded channel width (SCW) in some cases. Furthermore, in this specification, in the case where the term "channel width" is simply used, it may represent a surrounded channel width or an apparent channel width. Alternatively, in this specification, in the case where the term "channel width" is simply used, it may represent an effective channel width. Note that a channel length, a channel width, an effective channel width, an apparent channel width, a surrounded channel width, and the like can be determined by analyzing a cross-sectional TEM image and the like.

Note that an impurity in a semiconductor refers to, for example, elements other than the main components of a semiconductor. For example, an element with a concentration lower than 0.1 atomic % can be regarded as an impurity. When an impurity is contained, the density of states (DOS) in a semiconductor may be increased, or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. For an oxide semiconductor, water also serves as an impurity in some cases. For an oxide semiconductor, entry of impurities may lead to formation of oxygen vacancies, for example. Furthermore, when the semiconductor is silicon, examples of an impurity which changes the characteristics of the semiconductor include oxygen, Group 1 elements except hydrogen, Group 2 elements, Group 13 elements, and Group 15 elements.

In this specification and the like, a silicon oxynitride film contains more oxygen than nitrogen. A silicon oxynitride film preferably contains, for example, oxygen, nitrogen, silicon, and hydrogen in the ranges of 55 atomic % to 65 atomic % inclusive, 1 atomic % to 20 atomic % inclusive, 25 atomic % to 35 atomic % inclusive, and 0.1 atomic % to 10 atomic % inclusive, respectively. A silicon nitride oxide film contains more nitrogen than oxygen. A silicon nitride oxide film preferably contains nitrogen, oxygen, silicon, and hydrogen in the ranges of 55 atomic % to 65 atomic % inclusive, 1 atomic % to 20 atomic % inclusive, 25 atomic % to 35 atomic % inclusive, and 0.1 atomic % to 10 atomic % inclusive, respectively.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

In addition, in this specification and the like, the term "insulator" can be replaced with the term "insulating film" or "insulating layer". Moreover, the term "conductor" can be replaced with the term "conductive film" or "conductive layer". Furthermore, the term "semiconductor" can be replaced with the term "semiconductor film" or "semiconductor layer".

Furthermore, unless otherwise specified, transistors described in this specification and the like are field effect transistors. Unless otherwise specified, transistors described in this specification and the like are n-channel transistors. Thus, unless otherwise specified, the threshold voltage (also referred to as "$V_{th}$") is higher than 0 V.

In this specification and the like, the term "parallel" indicates that the angle formed between two straight lines is greater than or equal to −10° and less than or equal to 100, and accordingly also includes the case where the angle is greater than or equal to −50 and less than or equal to 50. In addition, the term "substantially parallel" indicates that the angle formed between two straight lines is greater than or equal to −300 and less than or equal to 300. The term "perpendicular" indicates that the angle formed between two straight lines is greater than or equal to 800 and less than or equal to 1000, and accordingly also includes the case where the angle is greater than or equal to 850 and less than or equal to 950. In addition, the term "substantially perpendicular" indicates that the angle formed between two straight lines is greater than or equal to 600 and less than or equal to 1200.

Note that in this specification, a barrier film refers to a film having a function of inhibiting the penetration of oxygen and impurities such as hydrogen. The barrier film that has conductivity may be referred to as a conductive barrier film.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in a semiconductor layer of a transistor is called an oxide semiconductor in some cases. In other words, an OS FET or an OS transistor is a transistor including an oxide or an oxide semiconductor.

In this specification and the like, the term "normally off" means that current per micrometer of channel width flowing in a transistor when potential is not applied to a gate or the gate is supplied with a ground potential is $1 \times 10^{-20}$ A or lower at room temperature, $1 \times 10^{-18}$ A or lower at 85° C., or $1 \times 10^{-16}$ A or lower at 125° C.

Embodiment 1

An example of a semiconductor device including a transistor 200 of one embodiment of the present invention will be described below.

<Structure Example of Semiconductor Device>

Figure 1C:
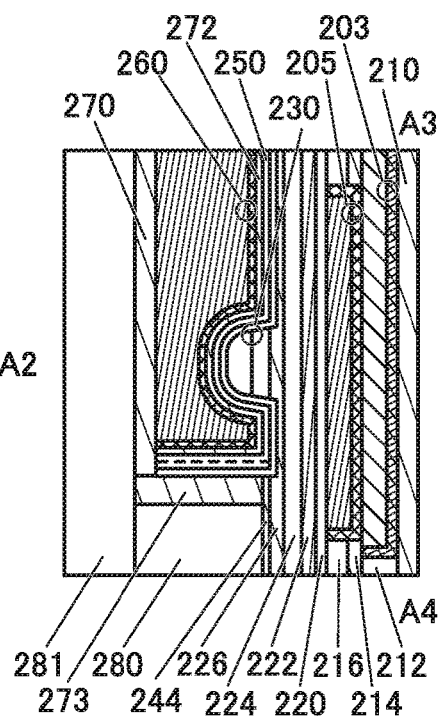
Figure 1B:
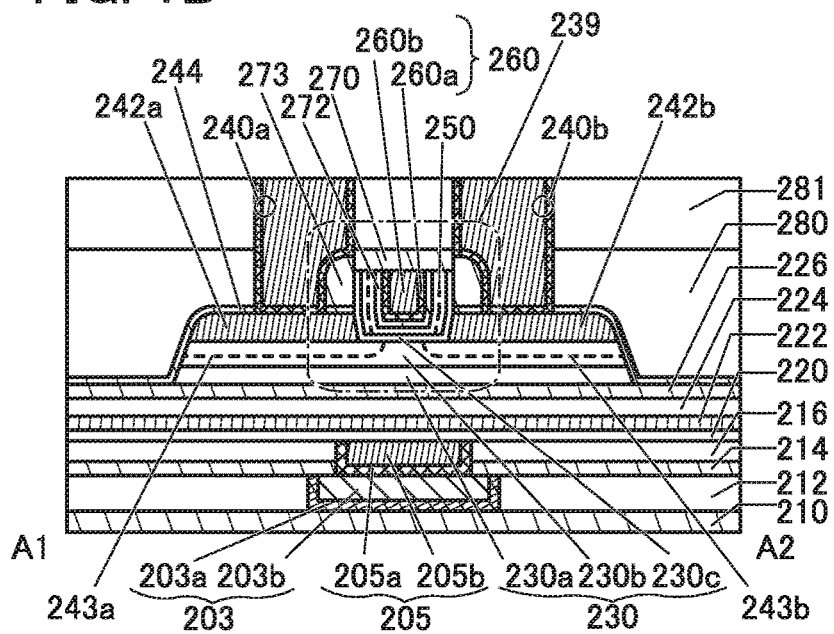

FIGS. 1A to 1C are a top view and cross-sectional views of the transistor 200 of one embodiment of the present invention and the periphery of the transistor 200.

FIG. 1A is a top view of the semiconductor device including the transistor 200. FIGS. 1B and 1C are cross-sectional views of the semiconductor device. FIG. 1B is a cross-sectional view taken along dashed-dotted line A1-A2 in FIG. 1A, which corresponds to a cross-sectional view in the channel length direction of the transistor 200. FIG. 1C is a cross-sectional view taken along dashed-dotted line A3-A4 in FIG. 1A, which corresponds to a cross-sectional view in the channel width direction of the transistor 200. Note that for simplification of the drawing, some components are not illustrated in the top view in FIG. 1A.

The semiconductor device of one embodiment of the present invention includes the transistor 200 and insulators 210, 212, 280, and 281 that function as interlayer films. The semiconductor device further includes a conductor 203 functioning as a wiring and a conductor 240 (a conductor 240*a* and a conductor 240*b*) functioning as a plug. The conductor 203 and the conductor 240 are electrically connected to the transistor 200.

The conductor 203 includes a conductor 203*a* that is in contact with an inner wall of an opening of the insulator 212 and a conductor 203*b* that is located inward from the conductor 203*a*. Here, the top surface of the conductor 203 can be at substantially the same level as the top surface of the insulator 212. Although the conductor 203a and the conductor 203b are stacked in the transistor 200, the present invention is not limited thereto. For example, the conductor 203 may have a single-layer structure or a stacked-layer structure of three or more layers. In the case where a stacked-layer structure is used, the layers may be distinguished by numbers corresponding to the formation order.

The conductor 240 includes a first conductor of the conductor 240 that is in contact with an inner wall of an opening of the insulators 244, 280, and 281 and a second conductor of the conductor 240 that is located inward from the first conductor. Here, the top surface of the conductor 240 can be at substantially the same level as the top surface of the insulator 281. Although the first conductor of the conductor 240 and the second conductor of the conductor 240 are stacked in the transistor 200, the present invention is not limited thereto. For example, the conductor 240 may have a single-layer structure or a stacked-layer structure of three or more layers. In the case where a stacked-layer structure is used, the layers may be distinguished by numbers corresponding to the formation order.

[Transistor 200]

As illustrated in FIGS. 1A to 1C, the transistor 200 includes an insulator 214 provided over a substrate (not illustrated); an insulator 216 provided over the insulator 214; a conductor 205 provided to be embedded in the insulators 214 and 216; an insulator 220 provided over the insulator 216 and the conductor 205; an insulator 222 provided over the insulator 220; an insulator 224 provided over the insulator 222; an insulator 226 provided over the insulator 224; an oxide 230a provided over the insulator 226; an oxide 230b provided over the oxide 230a; a conductor 242 provided over the oxide 230b; an insulator 244 covering the insulator 226, the oxide 230a, the oxide 230b, and the conductor 242; an insulator 280 provided over the insulator 244 and including an opening portion; an insulator 273 provided over the insulator 244 in the opening portion; an oxide 230c provided to be in contact with a top surface of the oxide 230b, a side surface of the conductor 242, a side surface of the insulator 244, and one side surface of the insulator 273; an insulator 250 provided inward from the oxide 230c; an insulator 272 provided inward from the insulator 250; a conductor 260a provided inward from the insulator 272; a conductor 260b provided to be embedded inward from the conductor 260a; an insulator 270 provided to be in contact with the one side surface of the insulator 273, a top surface of the oxide 230c, a top surface of the insulator 250, a top surface of the insulator 272, a top surface of the conductor 260a, and a top surface of the conductor 260b; and the conductor 240 being in contact with at least a top surface of the insulator 273 and the other side surface of the insulator 273 and electrically connected to the conductor 242.

The transistor 200 has, in the region where the channel is formed (hereinafter also referred to as channel formation region) and its vicinity, a structure in which the oxide 230a, the oxide 230b, and the oxide 230c are stacked; however, the present invention is not limited thereto. For example, the transistor 200 may have a single-layer structure of the oxide 230b, a two-layer structure of the oxide 230b and the oxide 230a or 230c, or a stacked-layer structure of four or more layers. Although a conductor 260 has a two-layer structure in the transistor 200, the present invention is not limited thereto. For example, the conductor 260 may have a single-layer structure or a stacked-layer structure of three or more layers.

Here, the conductor 260 functions as a gate electrode of the transistor and a conductor 242a and a conductor 242b function as a source electrode and a drain electrode. As described above, the conductor 260 is embedded in the opening of the insulator 280 and in a region between the conductor 242a and the conductor 242b, with the insulator 273, the insulator 250, and the like positioned between the conductor 260 and the inner wall of the opening. Here, the positions of the conductor 260, the conductor 242a, and the conductor 242b with respect to the opening of the insulator 280 are selected in a self-aligned manner. That is, in the transistor 200, the gate electrode can be positioned between the source electrode and the drain electrode in a self-aligned manner. Therefore, the conductor 260 can be formed without an alignment margin, resulting in a reduction in the footprint of the transistor 200. Accordingly, miniaturization and high integration of the semiconductor device can be achieved.

In addition, since the conductor 260 is formed in the region between the conductor 242a and the conductor 242b in a self-aligned manner, the conductor 260 has neither a region overlapping with the conductor 242a nor a region overlapping with the conductor 242b. Thus, parasitic capacitance formed between the conductor 260 and the conductors 242a and 242b can be reduced. As a result, the transistor 200 can have increased switching speed and excellent frequency characteristics.

In the transistor 200, the oxide 230 (the oxide 230a, the oxide 230b, and the oxide 230c), which includes a channel formation region, is preferably formed using a metal oxide functioning as an oxide semiconductor (hereinafter also referred to as an oxide semiconductor).

The transistor 200 including an oxide semiconductor in a channel formation region has an extremely low leakage current in an off state; thus, a semiconductor device with low power consumption can be provided. An oxide semiconductor can be formed by a sputtering method or the like and thus can be used in the transistor 200 included in a highly integrated semiconductor device.

For example, as the oxide 230, a metal oxide such as an In-M-Zn oxide (M is one or more of aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. An In—Ga oxide or an In—Zn oxide may be used as the oxide 230.

Here, when containing impurities such as hydrogen, nitrogen, and a metal element, an oxide 230 might have increased carrier density to have reduced resistance. Furthermore, when the oxygen concentration of the oxide 230 decreases, the oxide might have increased carrier density to have reduced resistance.

Part of the oxide 230 might have a low-resistance region when the conductor 242 (the conductor 242a and the conductor 242b) that is provided over and in contact with the oxide 230 and functions as the source electrode and the drain electrode has a function of absorbing oxygen in the oxide 230, or when the oxide 230 has a function of supplying an impurity such as hydrogen, nitrogen, or a metal element.

The thickness of the insulator 250 between the conductor 242 and the conductor 260 is preferably larger than that of the insulator 250 between the oxide 230b and the conductor 260. To obtain this structure, it is preferable that the insulator 250 positioned between the oxide 230b and the conductor 260 have a single-layer structure and the insulator 250 positioned between the conductor 242 and the conductor 260 have a stacked-layer structure. In the case where the insulator 250 positioned between the oxide 230b and the conductor 260 has a stacked-layer structure, the number of layers of the insulator 250 between the conductor 242 and the conductor 260 is set larger than the number of layers of the insulator 250 between the oxide 230b and the conductor 260.

When the thickness of the insulator 250 between the conductor 242 and the conductor 260 is larger than that of the insulator 250 between the oxide 230b and the conductor 260, the parasitic capacitance between the conductor 260 and the conductor 242 can be reduced and the transistor 200 can have excellent frequency characteristics. In addition, the small thickness of the insulator 250 between the oxide 230b and the conductor 260 does not weaken the electric field from the gate electrode, so that the transistor 200 having favorable electrical characteristics can be provided.

The insulator 244 is provided to inhibit oxidation of the conductor 242. Thus, the insulator 244 does not always need to be provided in the case where the conductor 242 is an oxidation-resistant material or the case where the conductor 242 does not significantly lose its conductivity even after absorbing oxygen.

The insulator 272 is provided to inhibit oxidation of the conductor 260. Thus, the insulator 272 does not always need to be provided in the case where the conductor 260 is an oxidation-resistant material or the case where the conductor 260 does not significantly lose its conductivity even after absorbing oxygen.

The insulator 273 functions as a sidewall. The insulator 270 functions as an etching stopper. The insulator 273 and the insulator 270 make it possible to form the openings for exposing the conductor 242 in a self-aligned manner so that the conductor 242 and the conductor 240 can be electrically connected to each other. In some cases, an opening formed with such a structure is referred to as a self-aligned contact and the method for forming the opening and the conductors is referred to as a self-aligned contact process.

Figure 2:
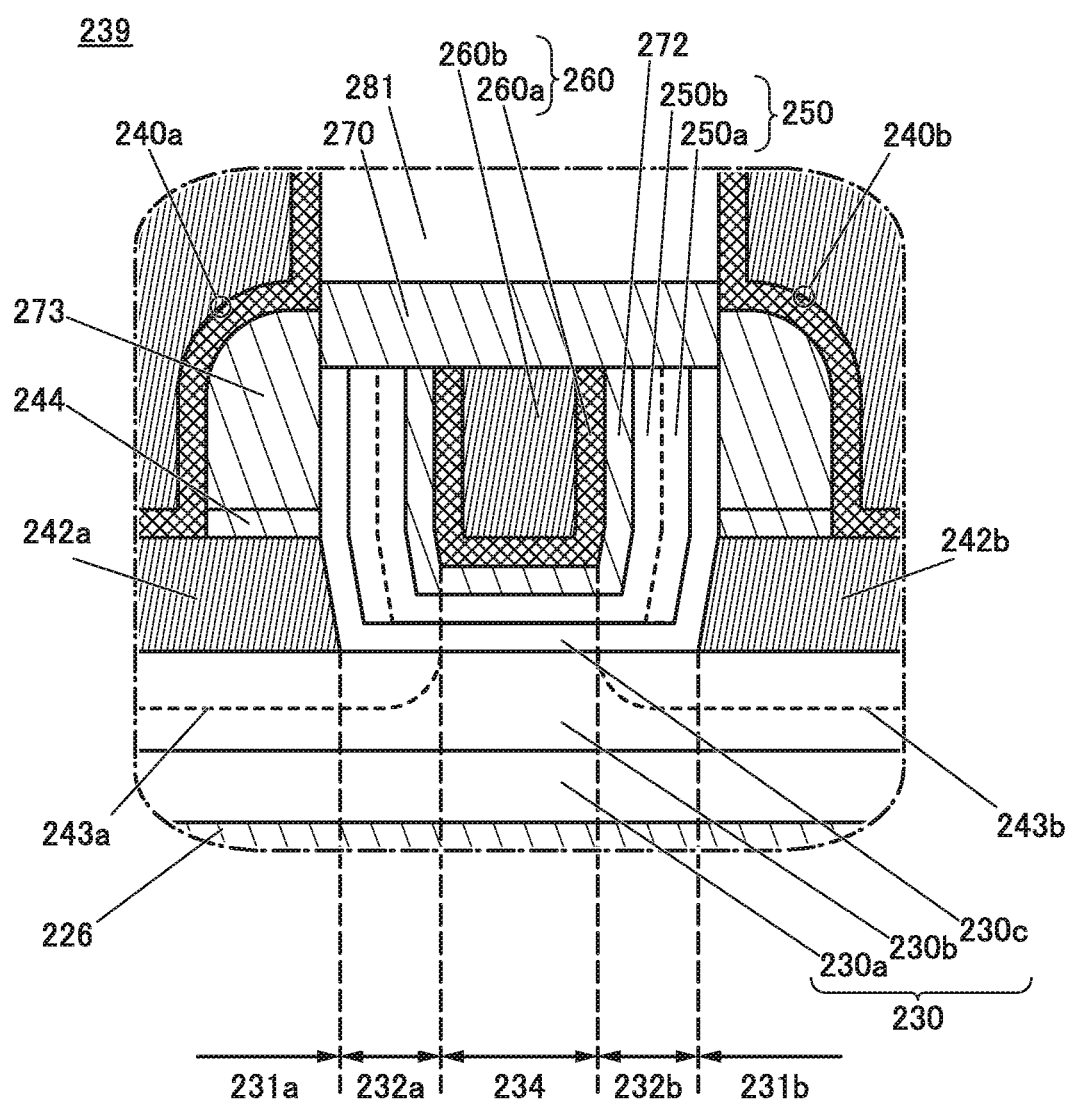
FIG. 2 is a cross-sectional view of a semiconductor device of one embodiment of the present invention.

FIG. 2 is an enlarged view illustrating a region 239 surrounded by a dashed-dotted line in FIG. 1B.

As illustrated in FIG. 2, the conductor 242 is provided over and in contact with the oxide 230b, and a region 243 (a region 243a and a region 243b) is provided as a low-resistance region at and near the interface of the oxide 230b with the conductor 242. The oxide 230 includes a region 234 functioning as the channel formation region of the transistor 200, a region 231 (a region 231a and a region 231b) including part of the region 243 and functioning as a source region and a drain region, and a region 232 (a region 232a and a region 232b) including part of the region 243 and functioning as a junction region.

In the region 231 functioning as the source region and the drain region, particularly the region 243 has reduced resistance by having an increased carrier concentration due to a low oxygen concentration or contained impurities such as hydrogen, nitrogen, or a metal element. In other words, the region 231 has higher carrier density and lower resistance than the region 234. Furthermore, the region 234 functioning as the channel formation region is a high-resistance region with a low carrier density because it has a higher oxygen concentration or a lower impurity concentration than the region 231, or specifically, the region 243 of the region 231. It is preferable that the oxygen concentration of the region 232 be higher than or equal to that of the region 231 and lower than or equal to that of the region 234. Instead, it is preferable that the impurity concentration of the region 232 be lower than or equal to that of the region 231 and higher than or equal to that of the region 234.

Note that when the region 243, which is the low-resistance region, contains a metal element, the region 243 preferably contains, in addition to the metal element contained in the oxide 230, one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like.

One embodiment of the present invention is not limited to the region 243 illustrated in FIG. 2, which is formed near the interface of the oxide 230b with the conductor 242 in the thickness direction of the oxide 230b. For example, the region 243 may have substantially the same thickness as the oxide 230b or may also be formed in the oxide 230a. Although the region 243 is formed in the regions 231 and 232 in FIG. 2, the present invention is not limited thereto. For example, the region 243 may be formed in only the region 231, in the region 231 and part of the region 232, or in the region 231, the region 232, and part of the region 234.

In the oxide 230, a boundary between the regions cannot be observed clearly in some cases. The concentration of a metal element and an impurity element such as hydrogen and nitrogen, which is detected in each region, may be gradually changed (such a change is also referred to as gradation) not only between the regions but also in each region. That is, the region closer to the channel formation region preferably has a lower concentration of a metal element and impurity elements such as hydrogen and nitrogen.

To selectively reduce the resistance of the oxide 230, the conductor 242 is preferably formed using, for example, a material that contains at least one of an impurity and metal elements that increase conductivity such as aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum. Alternatively, a conductive film 242A to be the conductor 242 is formed using a material, a film formation method, or the like that injects impurities (e.g., an element that forms oxygen vacancies or an element trapped by oxygen vacancies) into the oxide 230. Typical examples of the elements are hydrogen, boron, carbon, nitrogen, fluorine, phosphorus, sulfur, chlorine, and rare gas elements. Typical examples of the rare gas elements include helium, neon, argon, krypton, and xenon.

A transistor formed using an oxide semiconductor is likely to have its electrical characteristics changed by impurities and oxygen vacancies in a channel formation region in the oxide semiconductor; as a result, the reliability is reduced, in some cases. Moreover, if the channel formation region in the oxide semiconductor includes oxygen vacancies, the transistor tends to have normally-on characteristics. Thus, oxygen vacancies in the region 234 where a channel is formed are preferably reduced as much as possible.

To inhibit the transistor from becoming normally-on, the insulator 250 near the oxide 230 preferably contains oxygen (also referred to as excess oxygen) more than that in the stoichiometric composition. Oxygen in the insulator 250 is diffused to the oxide 230 to reduce the number of oxygen vacancies in the oxide 230 and inhibit the transistor from becoming normally-on.

That is, oxygen contained in the insulator 250 is diffused into the region 234 of the oxide 230, whereby the number of oxygen vacancies in the region 234 of the oxide 230 can be reduced.

Furthermore, it is preferable to provide the insulator 222, the insulator 226, the insulator 244, the insulator 273, the insulator 272, the insulator 270, and the like to inhibit diffusion of oxygen contained in the oxide 230 and the insulator 250 to the outside of the transistor 200. For those insulators, a material that does not easily pass oxygen is preferably used. For example, an oxide containing aluminum or hafnium or a nitride of silicon can be used. In addition, those insulators are preferably any of materials that do not easily pass impurities such as hydrogen, water, nitrogen, or a metal element. The use of such a material can inhibit entry of impurities outside the transistor 200 into the transistor 200.

An oxide semiconductor can be formed by a sputtering method or the like and thus can be used in a transistor included in a highly integrated semiconductor device. A transistor including an oxide semiconductor in a channel formation region has an extremely low leakage current (off-state current) in an off state; thus, a semiconductor device with low power consumption can be provided.

Accordingly, a semiconductor device including a transistor having a high on-state current can be provided. Alternatively, a semiconductor device including a transistor having a low off-state current can be provided. Alternatively, a semiconductor device that has small variation in electrical characteristics, i.e., stable electrical characteristics, and has high reliability can be provided.

The structure of the semiconductor device including the transistor 200 of one embodiment of the present invention will be described in detail below.

The conductor 203 extends in the channel width direction as illustrated in FIGS. 1A and 1C and functions as a wiring that applies a potential to the conductor 205. The conductor 203 is preferably provided to be embedded in the insulator 212.

The conductor 205 is provided to overlap with the oxide 230 and the conductor 260. Moreover, the conductor 205 may be provided over and in contact with the conductor 203. The conductor 205 is preferably provided to be embedded in the insulator 214 and the insulator 216.

Here, the conductor 260 functions as a first gate (also referred to as a top gate) electrode in some cases. The conductor 205 functions as a second gate (also referred to as a bottom gate) electrode in some cases. In that case, by changing a potential applied to the conductor 205 independently of a potential applied to the conductor 260, the $V_{th}$ of the transistor 200 can be controlled. In particular, by applying a negative potential to the conductor 205, the $V_{th}$ of the transistor 200 can be higher than 0 V, and the off-state current can be reduced. Thus, a drain current when a potential applied to the conductor 260 is 0 V can be smaller in the case where a negative potential is applied to the conductor 205 than in the case where the negative potential is not applied to the conductor 205.

When the conductor 205 is provided over the conductor 203, the distance between the conductor 203 and the conductor 260 functioning as the first gate electrode and the wiring can be set as appropriate. That is, the insulators 214 and 216 and the like are provided between the conductors 203 and 260, whereby parasitic capacitance between the conductors 203 and 260 can be reduced, and the withstand voltage between the conductors 203 and 260 can be increased.

The reduction in the parasitic capacitance between the conductors 203 and 260 can improve the switching speed of the transistor 200, so that the transistor 200 can have high frequency characteristics. The increase in the withstand voltage between the conductors 203 and 260 can improve the reliability of the transistor 200. Therefore, the insulator 214 and the insulator 216 are preferably thick. Note that the extending direction of the conductor 203 is not limited to this example; for example, the conductor 203 may extend in the channel length direction of the transistor 200.

As illustrated in FIG. 1A, the conductor 205 is provided to overlap with the oxide 230 and the conductor 260. The conductor 205 is preferably larger than the region 234 of the oxide 230. As illustrated in FIG. 1C, it is particularly preferable that the conductor 205 extend beyond the end portion of the region 234 of the oxide 230 that intersects with the channel width direction. That is, the conductor 205 and the conductor 260 preferably overlap with each other with the insulator positioned therebetween outside side surfaces of the oxides 230a and 230b in the channel width direction.

With the above structure, in the case where potentials are applied to the conductor 260 and the conductor 205, an electric field generated from the conductor 260 and an electric field generated from the conductor 205 are connected, so that the channel formation region in the oxide 230 can be covered.

That is, the channel formation region in the region 234 can be electrically surrounded by the electric field of the conductor 260 functioning as the first gate electrode and the electric field of the conductor 205 functioning as the second gate electrode. In this specification, such a transistor structure in which the channel formation region is electrically surrounded by the electric fields of the first gate electrode and the second gate electrode is referred to as a surrounded channel (s-channel) structure.

The conductor 205 includes the conductor 205a that is in contact with an inner wall of an opening of the insulators 214 and 216 and the conductor 205b that is located inward from the conductor 205a. Here, top surfaces of the conductors 205a and 205b can be at substantially the same level as a top surface of the insulator 216. Although the conductors 205a and 205b are stacked in the transistor 200, the present invention is not limited thereto. For example, the conductor 205 may have a single-layer structure or a stacked-layer structure of three or more layers. In the case where a stacked-layer structure is used, the layers may be distinguished by numbers corresponding to the formation order.

The conductor 205a or 203a is preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom, that is, a conductive material through which the above impurities are less likely to pass. Alternatively, the conductor 205a or 203a is preferably formed using a conductive material having a function of inhibiting diffusion of oxygen (e.g., at least one of oxygen atoms, oxygen molecules, and the like), that is, a conductive material through which the above oxygen is less likely to pass. Note that in this specification, a function of inhibiting diffusion of impurities or oxygen means a function of inhibiting diffusion of any one or all of the above impurities and the above oxygen.

When the conductor 205a or 203a has a function of inhibiting diffusion of oxygen, the conductivity of the conductor 205b or 203b can be prevented from being lowered because of oxidization of the conductor 205b or 203b. As a conductive material having a function of inhibiting diffusion of oxygen, for example, tantalum, tantalum nitride, ruthenium, ruthenium oxide, or the like is preferably used. Thus, the conductor 205a or 203a may be a single layer or a stacked layer of the above conductive materials. Thus, impurities such as water or hydrogen can be inhibited from being diffused into the transistor 200 side through the conductors 203 and 205.

A conductive material containing tungsten, copper, or aluminum as its main component is preferably used for the conductor 205b. Note that the conductor 205b is a single layer in the drawing but may have a stacked-layer structure, for example, a stacked-layer structure of titanium, titanium nitride, and any of the above conductive materials.

The conductor 203b functions as a wiring and thus is preferably a conductor having higher conductivity than the conductor 205b. For example, a conductive material containing copper or aluminum as its main component can be used. The conductor 203b may have a stacked-layer structure, for example, a stacked-layer structure of titanium, titanium nitride, and any of the above conductive materials.

It is particularly preferable to use copper for the conductor 203b. Copper is preferably used for the wiring and the like because of its low resistance. However, copper is easily diffused. Copper may deteriorate the electrical characteristics of the transistor 200 when diffused into the oxide 230. In view of the above, for example, the insulator 214 is formed using a material such as aluminum oxide or hafnium oxide having a low copper-transmitting property, whereby diffusion of copper can be inhibited.

The conductor 205, the insulator 214, and the insulator 216 are not necessarily provided. In this case, part of the conductor 203 can function as the second gate electrode.

Each of the insulators 210 and 214 preferably functions as a barrier insulating film for inhibiting impurities such as water or hydrogen from entering the transistor 200 from the substrate side. Accordingly, each of the insulators 210 and 214 is preferably formed using an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, $NO$, and $NO_2$), and a copper atom, that is, an insulating material through which the above impurities are less likely to pass. Alternatively, each of the insulators 210 and 214 is preferably formed using an insulating material having a function of inhibiting diffusion of oxygen (e.g., at least one of oxygen atoms, oxygen molecules, and the like), that is, an insulating material through which the above oxygen is less likely to pass.

For example, it is preferable that aluminum oxide or the like be used for the insulator 210 and that silicon nitride or the like be used for the insulator 214. Accordingly, impurities such as water or hydrogen can be inhibited from being diffused into the transistor 200 side from the substrate side from the insulators 210 and 214. In addition, oxygen contained in the insulator 224 and the like can be inhibited from being diffused into the area closer to the substrate than the insulators 210 and 214 are.

Furthermore, with the structure in which the conductor 205 is stacked over the conductor 203, the insulator 214 can be provided between the conductor 203 and the conductor 205. Here, even when a metal that is easily diffused, such as copper, is used as the conductor 203b, silicon nitride or the like provided as the insulator 214 can inhibit diffusion of the metal to a layer positioned above the insulator 214.

The dielectric constant of each of the insulators 212, 216, 280, and 281 functioning as an interlayer film is preferably lower than that of the insulator 210 or 214. When a material with a low dielectric constant is used as an interlayer film, the parasitic capacitance between wirings can be reduced.

For example, the insulators 212, 216, 280, and 281 can be formed to have a single-layer structure or a stacked-layer structure using any of insulators such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), and (Ba, Sr)$TiO_3$ (BST). Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. Silicon oxide, silicon oxynitride, or silicon nitride may be stacked over the insulator.

The insulators 220, 222, 224, and 250 function as gate insulators.

The insulator 226 functions as an etching stopper in formation of the opening for forming the oxide 230c, the insulator 250, the insulator 272, the conductor 260, and the like, or in formation of the insulator 244, the conductor 242a, and the conductor 242b. Note that the insulator 226 does not always need to be provided when the insulator 224 or the like functions as an etching stopper in such processing.

Here, in the case where the insulator 226 is not provided and the oxide 230 and the insulator 224 are in contact with each other, an insulator containing oxygen more than that in the stoichiometric composition is preferably used as the insulator 224. That is, an excess-oxygen region is preferably formed in the insulator 224. When such an insulator containing excess oxygen is provided in contact with the oxide 230, the number of oxygen vacancies in the oxide 230 can be reduced, leading to an improvement in reliability of the transistor 200.

As the insulator including the excess-oxygen region, specifically, an insulator that releases part of oxygen by heating is preferably used. An insulator that releases oxygen by heating is an insulator in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in thermal desorption spectroscopy (TDS) analysis. In the TDS analysis, the film surface temperature is preferably higher than or equal to 100° C. and lower than or equal to 700° C., or higher than or equal to 100° C. and lower than or equal to 400° C.

In the case where the insulator 224 includes an excess-oxygen region, the insulator 222 preferably has a function of inhibiting diffusion of oxygen (e.g., at least one of oxygen atoms or oxygen molecules). That is, it is preferable that the above oxygen be less likely to pass through the insulator 222.

The insulator 222 or the insulator 226 preferably has a function of inhibiting diffusion of oxygen or impurities, in which case diffusion of oxygen contained in the oxide 230 to the insulator 220 side is prevented. The conductor 205 can be inhibited from reacting with oxygen in the insulator 224 or the oxide 230.

The insulator 222 or 226 preferably has a single-layer structure or a stacked-layer structure using an insulator containing what is called a high-k material such as aluminum oxide, hafnium oxide, tantalum oxide, zirconium oxide, lead zirconate titanate (PZT), strontium titanate ($SrTiO_3$), or (Ba,Sr)$TiO_3$ (BST). With miniaturization and high integration of a transistor, a problem such as generation of leakage current sometimes arises because of a thin gate insulator. When a high-k material is used for an insulator functioning as the gate insulator, a gate potential at the time of operating the transistor can be reduced while keeping the physical thickness of the gate insulator.

It is particularly preferable to use an insulator containing an oxide of one or both of aluminum and hafnium, which is an insulating material having a function of inhibiting diffusion of impurities, oxygen, and the like, i.e., an insulating material through which the above oxygen is less likely to pass. Aluminum oxide, hafnium oxide, an oxide containing aluminum and hafnium (hafnium aluminate), or the like is preferably used for the insulator containing an oxide of one or both of aluminum and hafnium. The insulator 222 or 226 formed of such a material serves as a layer that prevents release of oxygen from the oxide 230 and entry of impurities such as hydrogen from the periphery of the transistor 200 into the oxide 230.

Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. Silicon oxide, silicon oxynitride, or silicon nitride may be stacked over the insulator.

It is preferable that the insulators 220 and 226 be thermally stable. Silicon oxide and silicon oxynitride are suitable because of their thermal stability. Furthermore, combination of an insulator which is a high-k material and silicon oxide or silicon oxynitride enables the insulator 220 or 226 to have a stacked-layer structure that is thermally stable and has a high dielectric constant.

Note that the insulators 220, 222, and 224 each may have a stacked-layer structure of two or more layers. In this case, the stacked layers are not necessarily formed of the same material but may be formed of different materials.

The oxide 230 includes the oxide 230*a*, the oxide 230*b* over the oxide 230*a*, and the oxide 230*c* over the oxide 230*b*. When the oxide 230*a* is provided below the oxide 230*b*, impurities can be inhibited from being diffused into the oxide 230*b* from the components formed below the oxide 230*a*. When the oxide 230*c* is provided over the oxide 230*b*, impurities can be inhibited from being diffused into the oxide 230*b* from the components formed above the oxide 230*c*.

The oxide 230 preferably has a stacked-layer structure of oxides which differ in the atomic ratio of metal elements. Specifically, the atomic ratio of the element M to constituent elements in the metal oxide used as the oxide 230*a* is preferably greater than that in the metal oxide used as the oxide 230*b*. Moreover, the atomic ratio of the element M to In in the metal oxide used as the oxide 230*a* is preferably greater than that in the metal oxide used as the oxide 230*b*. Moreover, the atomic ratio of In to the element M in the metal oxide used as the oxide 230*b* is preferably greater than that in the metal oxide used as the oxide 230*a*. The oxide 230*c* can be formed using a metal oxide which can be used as the oxide 230*a* or 230*b*.

The energy of the conduction band minimum of each of the oxides 230*a* and 230*c* is preferably higher than that of the oxide 230*b*. In other words, the electron affinity of each of the oxides 230*a* and 230*c* is preferably smaller than that of the oxide 230*b*.

Here, the energy level of the conduction band minimum is gradually varied at a junction portion of each of the oxides 230*a*, 230*b*, and 230*c*. In other words, the energy level of the conduction band minimum at a junction portion of each of the oxides 230*a*, 230*b*, and 230*c* is continuously varied or continuously connected. To vary the energy level gradually, the density of defect states in a mixed layer formed at the interface between the oxides 230*a* and 230*b* and the interface between the oxides 230*b* and 230*c* is decreased.

Specifically, when the oxides 230*a* and 230*b* or the oxides 230*b* and 230*c* contain the same element (as a main component) in addition to oxygen, a mixed layer with a low density of defect states can be formed. For example, in the case where the oxide 230*b* is an In—Ga—Zn oxide, it is preferable to use an In—Ga—Zn oxide, a Ga—Zn oxide, gallium oxide, or the like as each of the oxides 230*a* and 230*c*.

At this time, the oxide 230*b* serves as a main carrier path. When the oxides 230*a* and 230*c* have the above structure, the density of defect states at the interface between the oxides 230*a* and 230*b* and the interface between the oxides 230*b* and 230*c* can be made low. Thus, the influence of interface scattering on carrier conduction is small, and the transistor 200 can have a high on-state current.

The oxide 230 includes the regions 231 and 234. Note that at least part of the region 231 is in contact with the conductor 242.

When the transistor 200 is turned on, the region 231*a* or 231*b* functions as the source region or the drain region. At least part of the region 234 functions as a channel formation region. In addition, the region 232 functioning as the junction region may be provided between the region 231 and the region 234.

Thus, by appropriately selecting the areas of the regions, a transistor having electrical characteristics necessary for the circuit design can be easily provided.

The oxide 230 is preferably formed using a metal oxide functioning as an oxide semiconductor (hereinafter, the metal oxide is also referred to as an oxide semiconductor). For example, the metal oxide to be the region 234 preferably has a band gap of 2 eV or more, preferably 2.5 eV or more. In this manner, off-state current of a transistor can be reduced by using a metal oxide having a wide band gap.

A transistor including an oxide semiconductor has an extremely low leakage current in an off state; thus, a semiconductor device with low power consumption can be provided. An oxide semiconductor can be formed by a sputtering method or the like and thus can be used in a transistor included in a highly integrated semiconductor device.

The conductor 242 (the conductor 242*a* and the conductor 242*b*) functioning as the source electrode and the drain electrode is provided over the oxide 230*b*. For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

When the conductor 242 is provided in contact with the oxide 230, the oxygen concentration of the region 243 sometimes decreases. In addition, a metal compound layer that contains the metal contained in the conductor 242 and the component of the oxide 230 is sometimes formed in the region 243. In such a case, the region 243 has increased carrier density to be a low-resistance region.

Here, the region between the conductor 242a and the conductor 242b is formed to overlap with the opening of the insulator 280. In this manner, the conductor 260 can be formed between the conductor 242a and the conductor 242b in a self-aligned manner.

The insulator 244 is provided to cover the conductor 242 and inhibits oxidation of the conductor 242. The insulator 244 may be provided to cover the side surface of the oxide 230 and to be in contact with the insulator 226.

A metal oxide containing one or more of hafnium, aluminum, gallium, yttrium, zirconium, tungsten, titanium, tantalum, nickel, germanium, magnesium, and the like can be used as the insulator 244.

It is particularly preferable to use an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film and thus is less likely to be crystallized in a thermal budget in a later step. Therefore, it is preferable to use hafnium aluminate. Note that the insulator 244 is not necessarily provided when the conductor 242 is oxidation-resistant or does not significantly lose its conductivity even after absorbing oxygen. Design is appropriately determined in consideration of required transistor characteristics.

The insulator 273 is provided over the insulator 244. The insulator 273 functions as the sidewall. A metal oxide containing one or more of hafnium, aluminum, gallium, yttrium, zirconium, tungsten, titanium, tantalum, nickel, germanium, magnesium, and the like can be used as the insulator 273. Alternatively, a nitride of silicon such as silicon nitride or silicon nitride oxide can be used.

It is particularly preferable to use an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film and thus is less likely to be crystallized in a thermal budget in a later step. Therefore, it is preferable to use hafnium aluminate.

The oxide 230c is provided in contact with a top surface of the oxide 230b, a side surface of the conductor 242, a side surface of the insulator 244, and the side surface of the insulator 273.

The insulator 250 functions as a gate insulator. The insulator 250 is preferably in contact with the inside (a top surface of the bottom portion and a side surface) of the oxide 230c. The insulator 250 is preferably formed using an insulator from which oxygen is released by heating. The insulator 250 is an insulator of which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS analysis, for example. In the TDS analysis, the film surface temperature is preferably higher than or equal to 100° C. and lower than or equal to 700° C.

Specifically, any of silicon oxide, silicon oxynitride, silicon nitride oxide, silicon oxide to which fluorine is added, silicon oxide to which carbon is added, silicon oxide to which carbon and nitrogen are added, and porous silicon oxide each containing excess oxygen can be used. In particular, silicon oxide and silicon oxynitride, which have thermal stability, are preferable.

When as the insulator 250, an insulator from which oxygen is released by heating is provided in contact with the top surface of the oxide 230c, oxygen can be effectively supplied from the insulator 250 to the region 234 of the oxide 230b through the oxide 230c. Furthermore, like the insulator 224, the concentration of impurities such as water or hydrogen in the insulator 250 is preferably lowered. The thickness of the insulator 250 is preferably greater than or equal to 1 nm and less than or equal to 20 nm.

The insulator 250 is provided not only between the oxide 230b and the conductor 260 but also between the conductor 242 and the conductor 260. Depending on the thickness required for the insulator 250, parasitic capacitance is sometimes formed between the conductor 242 and the conductor 260 to adversely affect the characteristics of the transistor 200 or the semiconductor device. In that case, the thickness of the insulator 250 between the conductor 242 and the conductor 260 is preferably larger than that of the insulator 250 between the oxide 230b and the conductor 260. To obtain this structure, the insulator 250 between the conductor 242 and the conductor 260 may have a two-layer structure and the insulator 250 between the oxide 230b and the conductor 260 may have a single-layer structure. As described later in detail, an insulating film to be a first insulator is formed inward from an oxide film 230C to be the oxide 230c and the insulating film is anisotropically etched to form the first insulator on only the inner wall of the oxide film 230C. Then, an insulating film to be a second insulator is formed, whereby the insulator 250 between the oxide 230b and the conductor 260 has a single-layer structure and the insulator 250 between the conductor 242 and the conductor 260 has a two-layer structure. Accordingly, the thickness of the insulator 250 between the conductor 242 and the conductor 260 can be larger than that of the insulator 250 between the oxide 230b and the conductor 260.

Furthermore, in order that excess oxygen of the insulator 250 can be efficiently supplied to the oxide 230, the insulator 272 may be provided between the insulator 250 and the conductor 260. The insulator 272 preferably inhibits diffusion of oxygen from the insulator 250. Provision of the insulator 272 that inhibits diffusion of oxygen inhibits diffusion of excess oxygen from the insulator 250 to the conductor 260. That is, a reduction in the amount of excess oxygen supplied to the oxide 230 can be suppressed. Moreover, oxidization of the conductor 260 due to excess oxygen can be suppressed.

The insulator 272 functions as part of the gate insulator in some cases. Therefore, when silicon oxide, silicon oxynitride, or the like is used for the insulator 250, a metal oxide that is a high-k material with a high dielectric constant is preferably used as the insulator 272. The gate insulator having a stacked-layer structure of the insulator 250 and the insulator 272 can be thermally stable and can have a high dielectric constant. Accordingly, a gate potential applied during operation of the transistor can be reduced while keeping the physical thickness of the gate insulator. In addition, an equivalent oxide thickness (EOT) of an insulator functioning as the gate insulator can be reduced.

Specifically, a metal oxide containing one or more of hafnium, aluminum, gallium, yttrium, zirconium, tungsten, titanium, tantalum, nickel, germanium, magnesium, and the like can be used as the insulator 272.

It is particularly preferable to use an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film and thus is less likely to be crystallized in a thermal budget in a later step. Therefore, it is preferable to use hafnium aluminate. Note that the insulator 272 is not necessarily provided. Design is appropriately determined in consideration of required transistor characteristics.

Although the conductor 260 serving as the first gate electrode has a two-layer structure in FIGS. 1A to 1C, the conductor 260 may have a single-layer structure or a stacked-layer structure of three or more layers. For example, when the conductor 260 has a two-layer structure, like the conductor 205a, the conductor 260a is preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, the conductor 260a is preferably formed using a conductive material having a function of inhibiting diffusion of oxygen (e.g., at least one of oxygen atoms, oxygen molecules, and the like).

When the conductor 260a has a function of inhibiting diffusion of oxygen, the conductivity of the conductor 260b can be prevented from being lowered because of oxidization due to oxygen in the insulator 250. As a conductive material having a function of inhibiting diffusion of oxygen, for example, tantalum, tantalum nitride, ruthenium, ruthenium oxide, or the like is preferably used.

The conductor 260 also functions as a wiring and thus is preferably a conductor having high conductivity. For example, a conductive material containing tungsten, copper, or aluminum as its main component can be used as the conductor 260b. The conductor 260b may have a stacked-layer structure, for example, a stacked-layer structure of titanium, titanium nitride, and any of the above conductive materials.

In the case where the conductor 205 extends beyond the end portions of the oxide 230 that intersect with the channel width direction as illustrated in FIG. 1C, the conductor 260 preferably overlaps with the conductor 205 with the insulator 250 positioned therebetween. That is, a stacked-layer structure of the conductor 205, the insulator 250, and the conductor 260 is preferably formed outside the side surfaces of the oxides 230a and 230b.

With the above structure, in the case where potentials are applied to the conductor 260 and the conductor 205, an electric field generated from the conductor 260 and an electric field generated from the conductor 205 are connected, so that the channel formation region in the oxide 230 can be covered.

That is, the channel formation region in the region 234 can be electrically surrounded by the electric field of the conductor 260 functioning as the first gate electrode and the electric field of the conductor 205 functioning as the second gate electrode.

It is preferable that the insulator 270 functioning as the etching stopper be provided over the conductor 260, the insulator 272, the insulator 250, and the oxide 230c, to be in contact with the side surface of the insulator 273. A metal oxide containing one or more of hafnium, aluminum, gallium, yttrium, zirconium, tungsten, titanium, tantalum, nickel, germanium, magnesium, and the like can be used as the insulator 270. Alternatively, a nitride of silicon such as silicon nitride or silicon nitride oxide can be used.

It is particularly preferable to use an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film and thus is less likely to be crystallized in a thermal budget in a later step. Therefore, it is preferable to use hafnium aluminate.

The insulator 280 is provided over the conductor 242 with the insulator 244 positioned therebetween. The insulator 280 preferably includes an excess-oxygen region. For example, the insulator 280 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride, which have thermal stability, are preferable.

When the insulator 244 is not provided, the insulator 280 is in contact with the side surfaces of the oxide 230a and the oxide 230b. In that case, oxygen contained in the insulator 280 is sometimes supplied to the region 234 of the oxide 230 owing to heating. The concentration of impurities such as water or hydrogen in the insulator 280 is preferably lowered.

The insulator 281 functioning as an interlayer film is preferably provided over the insulator 280. Like the insulator 224, the insulator 280, or the like, the concentration of impurities such as water or hydrogen in the insulator 281 is preferably lowered.

The conductor 240a and the conductor 240b are provided in the openings formed in the insulator 281, the insulator 280, and the insulator 244. Part of the opening overlaps with the insulator 273. The conductors 240a and 240b are provided to face each other with the conductor 260 positioned therebetween. The conductor 240a and the conductor 240b are in contact with the top surface and the side surface of the insulator 273 and are electrically connected to the conductor 242a and the conductor 242b, respectively. Note that the top surfaces of the conductors 240a and 240b may be at the same level as the top surface of the insulator 281.

The first conductor of the conductor 240a is formed in contact with the inner wall of the opening of the insulator 281, the insulator 280, and the insulator 244. The conductor 242a is positioned in at least part of the bottom of the opening, and thus the conductor 240a is in contact with the conductor 242a. Similarly, the first conductor of the conductor 240b is formed in contact with the inner wall of the opening of the insulator 281, the insulator 280, and the insulator 244. The conductor 242b is positioned in at least part of the bottom of the opening, and thus the conductor 240b is in contact with the conductor 242b.

Figure 3A:
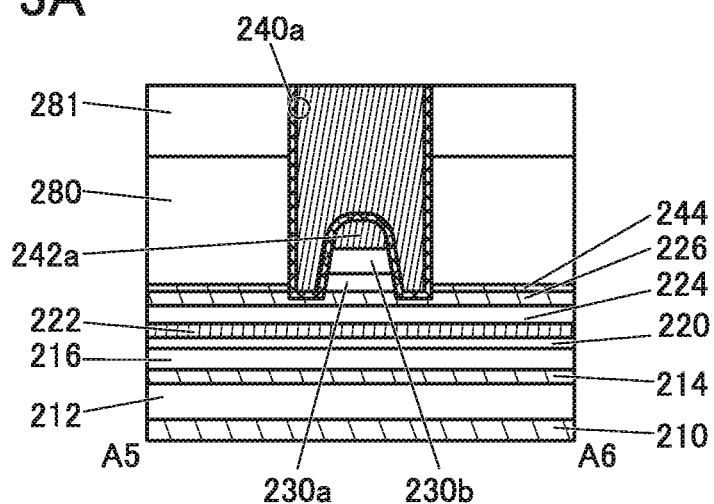
FIGS. 3A and 3B are cross-sectional views of a semiconductor device of one embodiment of the present invention.
Figure 3B:
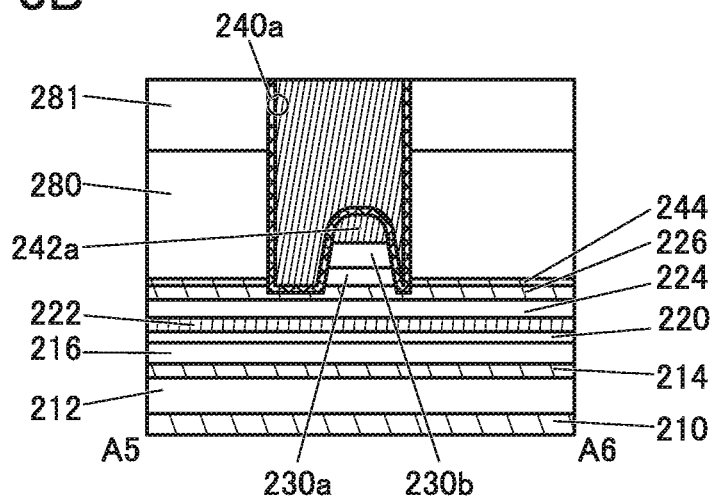

Here, FIG. 3A is a cross-sectional view illustrating the part along the dashed-dotted line A5-A6 in FIG. 1A, i.e., the source region or the drain region of the transistor 200. As illustrated in FIGS. 3A and 3B, it is preferable that the conductor 240a (the conductor 240b) be in contact with at least a top surface and a side surface of the conductor 242a (the conductor 242b) and in contact with the side surface of the oxide 230b and the side surface of the oxide 230a. It is particularly preferable that the conductor 240a (the conductor 240b) be in contact with one or both of the side surface of the oxide 230 on the A5 side and the side surface of the oxide 230 on the A6 side, which intersect with the channel width direction. The conductor 240a (the conductor 240b) may be in contact with the side surface of the oxide 230 on the A1 side (the A2 side), which intersects with the channel length direction of the oxide 230. When the conductors 240a and 240b are in contact with not only the top surface and the side surface of the conductor 242a (the conductor 242b) but also the side surfaces of the oxide 230b and the oxide 230a in this manner, the area of a portion where the conductor 240a (the conductor 240b) and the conductor 242a (the conductor 242b) are in contact with each other can be increased without an increase in the area of the top surface of the contact portion, so that the contact resistance between the conductor 240a (the conductor 240b) and the conductor 242a (the conductor 242b) can be reduced. Accordingly, miniaturization of the source electrode and the drain electrode of the transistor can be achieved and, in addition, the on-state current can be increased.

FIG. 3B illustrates an example of the case where a mask used in the lithography method for forming the openings exposing part of the conductor 242a (the conductor 242b) is misaligned in the A5 direction. When the width of the opening is larger than the widths of the conductor 242a (the conductor 242b), the oxide 230b, and the oxide 230a in the channel width direction, even misalignment does not prevent the conductor 240a (the conductor 240b) from being in contact with the top surface and side surface of the conductor 242a (the conductor 242b), the side surface of the oxide 230b, and the side surface of the oxide 230a and favorable contact is obtained.

The conductors 240a and 240b are each preferably formed using a conductive material containing tungsten, copper, or aluminum as its main component. The conductors 240a and 240b may have a stacked-layer structure.

In the case where the conductor 240 has a stacked-layer structure, a conductive material having a function of inhibiting the penetration of impurities such as water or hydrogen is preferably used for the conductor in contact with the oxide 230a, the oxide 230b, the conductor 242, the insulator 244, the insulator 280, and the insulator 281, as in the case of the conductor 205a or the like. For example, tantalum, tantalum nitride, titanium, titanium nitride, ruthenium, ruthenium oxide, or the like is preferably used. The conductive material having a function of inhibiting the penetration of impurities such as water or hydrogen may have a single-layer structure or a stacked-layer structure. With the use of the conductive material, impurities such as water or hydrogen can be inhibited from entering the oxide 230 through the conductors 240a and 240b from a layer above the insulator 281.

Although not illustrated, conductors functioning as wirings may be provided in contact with the top surfaces of the conductors 240a and 240b. The conductor functioning as a wiring is preferably formed using a conductive material containing tungsten, copper, or aluminum as its main component. The conductor may have a stacked-layer structure, for example, a stacked layer of titanium, titanium nitride, and any of the above conductive materials. Note that like the conductor 203 or the like, the conductor may be formed to be embedded in an opening provided in an insulator.

<Material for Semiconductor Device>

Materials that can be used for a semiconductor device will be described below.

<<Substrate>>

As a substrate over which the transistor 200 is formed, for example, an insulator substrate, a semiconductor substrate, or a conductor substrate may be used. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a semiconductor substrate of silicon, germanium, or the like, or a compound semiconductor substrate of silicon carbide, silicon germanium, gallium arsenide, indium phosphide, zinc oxide, or gallium oxide can be used, for example. A semiconductor substrate in which an insulator region is provided in the above semiconductor substrate, e.g., a silicon on insulator (SOI) substrate or the like can also be used. As the conductor substrate, a graphite substrate, a metal substrate, an alloy substrate, a conductive resin substrate, or the like is used. A substrate including a nitride of a metal, a substrate including an oxide of a metal, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate. As a method for providing a transistor over a flexible substrate, there is a method in which the transistor is formed over a non-flexible substrate and then the transistor is separated and transferred to the substrate which is a flexible substrate. In that case, a separation layer is preferably provided between the non-flexible substrate and the transistor. The substrate may have elasticity. The substrate may have a property of returning to its original shape when bending or pulling is stopped. Alternatively, the substrate may have a property of not returning to its original shape. The substrate has a region with a thickness of, for example, greater than or equal to 5 µm and less than or equal to 700 µm, preferably greater than or equal to 10 µm and less than or equal to 500 µm, further preferably greater than or equal to 15 µm and less than or equal to 300 µm. When the substrate has a small thickness, the weight of the semiconductor device including the transistor can be reduced. When the substrate has a small thickness, even in the case of using glass or the like, the substrate may have elasticity or a property of returning to its original shape when bending or pulling is stopped. Therefore, an impact applied to the semiconductor device over the substrate due to dropping or the like can be reduced. That is, a durable semiconductor device can be provided.

For the substrate which is a flexible substrate, metal, an alloy, a resin, glass, or fiber thereof can be used, for example. As the substrate, a sheet, a film, or a foil containing a fiber may be used. The flexible substrate preferably has a lower coefficient of linear expansion because deformation due to an environment is suppressed. The flexible substrate is formed using, for example, a material whose coefficient of linear expansion is lower than or equal to $1 \times 10^{-3}$/K, lower than or equal to $5 \times 10^{-5}$/K, or lower than or equal to $1 \times 10^{-5}$/K. Examples of the resin include polyester, polyolefin, polyamide (e.g., nylon or aramid), polyimide, polycarbonate, and acrylic. In particular, aramid is preferably used for the flexible substrate because of its low coefficient of linear expansion.

<<Insulator>>

Examples of an insulator include an insulating oxide, an insulating nitride, an insulating oxynitride, an insulating nitride oxide, an insulating metal oxide, an insulating metal oxynitride, and an insulating metal nitride oxide.

With miniaturization and high integration of a transistor, for example, a problem such as generation of leakage current sometimes arises because of a thin gate insulator. When a high-k material is used for an insulator functioning as the gate insulator, driving voltage of the transistor can be reduced while keeping the physical thickness of the gate insulator. By contrast, when a material with a low dielectric constant is used for the insulator functioning as an interlayer film, the parasitic capacitance between wirings can be reduced. Accordingly, a material is preferably selected depending on the function of an insulator.

As the insulator having a high dielectric constant, gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, or the like can be given.

As the insulator having a low dielectric constant, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like can be given.

In particular, silicon oxide and silicon oxynitride are thermally stable. Accordingly, a stacked-layer structure which is thermally stable and has a low dielectric constant can be obtained by combination with a resin, for example. Examples of the resin include polyester, polyolefin, polyamide (e.g., nylon or aramid), polyimide, polycarbonate, and acrylic. Furthermore, combination of silicon oxide or silicon oxynitride with an insulator with a high dielectric constant allows the stacked-layer structure to be thermally stable and have a high dielectric constant, for example.

Note that when the transistor including an oxide semiconductor is surrounded by an insulator that has a function of inhibiting the penetration of oxygen and impurities such as hydrogen, the electrical characteristics of the transistor can be stabilized.

The insulator that has a function of inhibiting the penetration of oxygen and impurities such as hydrogen can have, for example, a single-layer structure or a stacked-layer structure of an insulator including boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting the penetration of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide, silicon nitride oxide, silicon nitride, or the like can be used.

For example, a metal oxide containing one or more of hafnium, aluminum, gallium, yttrium, zirconium, tungsten, titanium, tantalum, nickel, germanium, magnesium, and the like can be used as the insulator 270 and the insulator 273. It is also possible to use a nitride of silicon or a nitride of silicon containing oxygen, such as silicon nitride or silicon nitride oxide.

Since the insulator 270 and the insulator 273 function as etching stoppers in formation of the openings in the insulator 280 and the insulator 281, the insulators 270 and 273 are preferably formed using a material whose etching rate is lower than the etching rate of the insulator 280 and the insulator 281 in processing the insulator 280 and the insulator 281.

In particular, aluminum oxide has a high barrier property, so that even a thin aluminum oxide film having a thickness of greater than or equal to 0.5 nm and less than or equal to 3.0 nm can inhibit diffusion of hydrogen and nitrogen. Although hafnium oxide has a lower barrier property than aluminum oxide, hafnium oxide having a large thickness can have a high barrier property. Therefore, the appropriate addition amount of hydrogen and nitrogen can be adjusted by adjustment of the thickness of hafnium oxide.

For example, the insulator 250 functioning as the gate insulator is preferably an insulator including an excess-oxygen region. In the case where the insulator 226 is not provided and the insulator 224 functioning as part of the gate insulator is in contact with the oxide 230, the insulator 224 preferably includes an excess-oxygen region. When a structure in which silicon oxide or silicon oxynitride including an excess-oxygen region is in contact with the oxide 230 is employed, oxygen vacancies in the oxide 230 can be filled.

An insulator containing an oxide of one or more of aluminum, hafnium, and gallium can be used for each of the insulator 222 and the insulator 226, which function as part of the gate insulator, for example. It is particularly preferable to use an insulator containing an oxide of one or both of aluminum and hafnium, for example, aluminum oxide, hafnium oxide, or an oxide containing aluminum and hafnium (hafnium aluminate).

The insulator 220 is preferably formed using silicon oxide or silicon oxynitride, which is thermally stable, for example. When the gate insulator has a stacked-layer structure of a thermally stable film and a film with a high dielectric constant, an equivalent oxide thickness (EOT) of the gate insulator can be reduced while keeping the physical thickness of the gate insulator.

With the above stacked-layer structure, on-state current can be increased without a reduction in the influence of the electric field applied from the gate electrode. Since the distance between the gate electrode and the channel formation region is kept by the physical thickness of the gate insulator, leakage current between the gate electrode and the channel formation region can be suppressed.

The insulators 212, 216, 280, and 281 preferably include an insulator with a low dielectric constant. For example, the insulators 212, 216, 280, and 281 preferably include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, each of the insulators 212, 216, 280, and 281 preferably has a stacked-layer structure of a resin and one of the following materials: silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide. When silicon oxide or silicon oxynitride, which is thermally stable, is combined with a resin, the stacked-layer structure can have thermal stability and a low dielectric constant. Examples of the resin include polyester, polyolefin, polyamide (e.g., nylon or aramid), polyimide, polycarbonate, and acrylic.

As the insulators 210, 214, 244, and 272, an insulator having a function of inhibiting the penetration of oxygen and impurities such as hydrogen may be used. For the insulators 210, 214, 244, and 272, a metal oxide such as aluminum oxide, hafnium oxide, magnesium oxide, gallium oxide, germanium oxide, yttrium oxide, zirconium oxide, lanthanum oxide, neodymium oxide, or tantalum oxide; silicon nitride oxide; silicon nitride; or the like may be used, for example.

<<Conductor>>

The conductors can be formed using a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like. Alternatively, a semiconductor having a high electric conductivity typified by polycrystalline silicon including an impurity element such as phosphorus, or silicide such as nickel silicide may be used.

A stack of a plurality of conductive layers formed with the above materials may be used. For example, a stacked-layer structure formed using a combination of a material containing any of the metal elements listed above and a conductive material containing oxygen may be used. Alternatively, a stacked-layer structure formed using a combination of a material containing any of the metal elements listed above and a conductive material containing nitrogen may be used. Alternatively, a stacked-layer structure formed using a combination of a material containing any of the metal elements listed above, a conductive material containing oxygen, and a conductive material containing nitrogen may be used.

When oxide is used for the channel formation region of the transistor, a stacked-layer structure formed using a material containing the above-described metal element and a conductive material containing oxygen is preferably used for the conductor functioning as the gate electrode. In this case, the conductive material containing oxygen is preferably formed on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide in which a channel is formed. A conductive material containing the above metal element and nitrogen may be used. For example, a conductive material containing nitrogen such as titanium nitride or tantalum nitride may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material, hydrogen contained in the metal oxide in which a channel is formed can be captured in some cases. Alternatively, hydrogen entering from an external insulator or the like can be captured in some cases.

For the conductor 260, the conductor 203, the conductor 205, the conductor 242, and the conductor 240, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Alternatively, a semiconductor having a high electric conductivity typified by polycrystalline silicon including an impurity element such as phosphorus, or silicide such as nickel silicide may be used.

<<Metal Oxide>>

The oxide 230 is preferably formed using a metal oxide functioning as an oxide semiconductor (hereinafter, the metal oxide is also referred to as an oxide semiconductor). A metal oxide that can be used for the oxide 230 of one embodiment of the present invention will be described below.

The metal oxide preferably contains at least indium or zinc. In particular, indium and zinc are preferably contained. In addition, aluminum, gallium, yttrium, tin, or the like is preferably contained. Furthermore, one or more elements selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide that contains indium, an element M, and zinc is considered. The element M is aluminum, gallium, yttrium, tin, or the like. Other elements that can be used as the element M include boron, titanium, iron, nickel, germanium, zirconium, molybdenum, lanthanum, cerium, neodymium, hafnium, tantalum, tungsten, and magnesium. Note that two or more of the above elements may be used in combination as the element M.

Note that in this specification and the like, a metal oxide containing nitrogen is also called a metal oxide in some cases. Moreover, a metal oxide containing nitrogen may be called a metal oxynitride.

Oxide semiconductors are classified as a single-crystal oxide semiconductor or a non-single-crystal oxide semiconductor. Examples of a non-single-crystal oxide semiconductor include a polycrystalline oxide semiconductor and an amorphous oxide semiconductor.

As an oxide semiconductor used for a semiconductor of a transistor, a thin film having high crystallinity is preferably used. With the thin film, the stability or the reliability of the transistor can be improved. As the thin film, for example, a thin film of a single-crystal oxide semiconductor or a thin film of a polycrystalline oxide semiconductor can be used. However, for forming the thin film of a single-crystal oxide semiconductor or the thin film of a polycrystalline oxide semiconductor over a substrate, a high-temperature process or a laser heating process is needed. Thus, the manufacturing cost is increased, and moreover, the throughput is decreased.

Non-Patent Documents 1 and 2 have reported that, in 2009, an In—Ga—Zn oxide having a CAAC structure (referred to as CAAC-IGZO) was found. It has been reported that CAAC-IGZO has c-axis alignment, a grain boundary is not clearly observed in CAAC-IGZO, and CAAC-IGZO can be formed over a substrate at low temperatures. It has also been reported that a transistor including CAAC-IGZO has excellent electrical characteristics and reliability.

In addition, in 2013, an In—Ga—Zn oxide having an nc structure (referred to as nc-IGZO) was found (see Non-Patent Document 3). It has been reported that nc-IGZO has periodic atomic arrangement in a microscopic region (for example, a region with a size greater than or equal to 1 nm and less than or equal to 3 nm) and there is no regularity of crystal orientation between different regions.

Non-Patent Documents 4 and 5 have shown a change in average crystal size due to electron beam irradiation to thin films of the above-described CAAC-IGZO, the above-described nc-IGZO, and IGZO having low crystallinity. In the thin film of IGZO having low crystallinity, crystalline IGZO with a crystal size of approximately 1 nm was observed even before the electron beam irradiation. Thus, it has been reported that a completely amorphous structure was not observed in IGZO. In addition, it has been shown that the thin films of CAAC-IGZO and nc-IGZO each have higher stability against electron beam irradiation than the thin film of IGZO having low crystallinity. Thus, a semiconductor of a transistor is preferably formed using the thin film of CAAC-IGZO or the thin film of nc-IGZO.

Non-Patent Document 6 discloses that a transistor including an oxide semiconductor has an extremely low leakage current in an off state; specifically, the off-state current per micrometer of the channel width of the transistor is of the order of yA/μm ($10^{-24}$ A/μm). For example, a CPU and the like with low power consumption utilizing a characteristic of a low leakage current of a transistor including an oxide semiconductor have been disclosed (see Non-Patent Document 7).

Furthermore, application of a transistor including an oxide semiconductor to a display device that utilizes a characteristic of a low leakage current of the transistor has been reported (see Non-Patent Document 8). In the display device, a displayed image is changed several tens of times per second. The number of times an image is changed per second is called a refresh rate. The refresh rate is also referred to as driving frequency. Such high-speed screen change that is hard to be recognized by human eyes is considered as a cause of eye strain. Thus, Non-Patent Document 8 has proposed that the refresh rate of the display device is lowered to reduce the number of image rewriting operations. Moreover, driving with a lowered refresh rate enables the power consumption of the display device to be reduced. Here, such a driving method is referred to as idling stop (IDS) driving.

The discovery of the CAAC structure and the nc structure has contributed to an improvement in electrical characteristics and reliability of a transistor including an oxide semiconductor having the CAAC structure or the nc structure, a reduction in manufacturing cost, and an improvement in throughput. Furthermore, applications of the transistor to a display device and an LSI utilizing a low leakage current of the transistor have been studied.

[Composition of Metal Oxide]

Described below is the composition of a cloud-aligned composite oxide semiconductor (CAC-OS) applicable to a transistor disclosed in one embodiment of the present invention.

In this specification and the like, "c-axis aligned crystal (CAAC)" or "cloud-aligned composite (CAC)" might be stated. Note that CAAC refers to an example of a crystal structure, and CAC refers to an example of a function or a material composition.

A CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in a semiconductor layer of a transistor, the conducting function is to allow electrons (or holes) functioning as carriers to flow, and the insulating function is to prevent electrons functioning as carriers from flowing. By the complementary action of the conducting function and the insulating function, the CAC-OS or the CAC metal oxide can have a switching function (on/off function). In the CAC-OS or the CAC metal oxide, separation of the functions can maximize each function.

The CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size greater than or equal to 0.5 nm and less than or equal to 10 nm, preferably greater than or equal to 0.5 nm and less than or equal to 3 nm and are dispersed in the material, in some cases.

The CAC-OS or the CAC metal oxide includes components having different band gaps. For example, the CAC-OS or the CAC metal oxide contains a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel formation region of a transistor, high current drive capability in the on state of the transistor, that is, a high on-state current and high field-effect mobility, can be obtained.

In other words, the CAC-OS or the CAC metal oxide can be called a matrix composite or a metal matrix composite.

[Structure of Metal Oxide]

An oxide semiconductor (metal oxide) is classified into a single-crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in some cases. A pentagonal lattice arrangement, a heptagonal lattice arrangement, and the like are included in the distortion in some cases. Note that it is difficult to observe a clear crystal grain boundary even in the vicinity of distortion in the CAAC-OS. That is, a lattice arrangement is distorted and thus formation of a grain boundary is inhibited. This is because the CAAC-OS can tolerate distortion owing to a low density of oxygen atom arrangement in the a-b plane direction, a change in interatomic bond distance by substitution of a metal element, and the like.

The CAAC-OS tends to have a layered crystal structure (also referred to as a stacked-layer structure) in which a layer containing indium and oxygen (hereinafter, In layer) and a layer containing the element M, zinc, and oxygen (hereinafter, (M, Zn) layer) are stacked. Note that indium and the element M can be replaced with each other, and when the element M of the (M, Zn) layer is replaced by indium, the layer can also be referred to as an (In, M, Zn) layer. When indium of the In layer is replaced by the element M, the layer can also be referred to as an (In, M) layer.

The CAAC-OS is a metal oxide with high crystallinity. By contrast, in the CAAC-OS, a reduction in electron mobility due to the grain boundary is less likely to occur because it is difficult to observe a clear grain boundary. Entry of impurities, formation of defects, or the like might decrease the crystallinity of a metal oxide. This means that the CAAC-OS has small amounts of impurities and defects (e.g., oxygen vacancies (Vo)). Thus, a metal oxide containing a CAAC-OS is physically stable. Therefore, the metal oxide containing a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, in some cases, the nc-OS cannot be distinguished from an a-like OS or an amorphous oxide semiconductor, depending on an analysis method.

Note that indium-gallium-zinc oxide (hereinafter referred to as IGZO) that is a metal oxide containing indium, gallium, and zinc has a stable structure in some cases by being formed of the above-described nanocrystals. In particular, IGZO crystals tend not to grow in the air and thus, a stable structure is obtained when IGZO is formed of smaller crystals (e.g., the above-described nanocrystals) rather than larger crystals (here, crystals with a size of several millimeters or several centimeters).

The a-like OS is a metal oxide having a structure between those of the nc-OS and the amorphous oxide semiconductor. The a-like OS has a void or a low-density region. That is, the a-like OS has low crystallinity as compared with the nc-OS and the CAAC-OS.

An oxide semiconductor (metal oxide) can have any of various structures which show various different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Transistor Including Metal Oxide]

Next, the case where the metal oxide is used for a channel formation region of a transistor will be described.

When the metal oxide is used for a channel formation region of a transistor, the transistor can have high field-effect mobility. In addition, the transistor can have high reliability.

Moreover, a metal oxide with low carrier density is preferably used for the transistor. In order to reduce the carrier density of the metal oxide film, the concentration of impurities in the metal oxide film is reduced so that the density of defect states can be reduced. In this specification and the like, a state with a low impurity concentration and a low density of defect states is referred to as a highly purified intrinsic or substantially highly purified intrinsic state. The metal oxide has, for example, a carrier density lower than $8 \times 10^{11}/cm^3$, preferably lower than $1 \times 10^{11}/cm^3$, and further preferably lower than $1 \times 10^{10}/cm^3$, and higher than or equal to $1 \times 10^{-9}/cm^3$.

A highly purified intrinsic or substantially highly purified intrinsic metal oxide film has a low density of defect states and accordingly has a low density of trap states in some cases.

Charges trapped by the trap states in the metal oxide take a long time to be released and may behave like fixed charges. Thus, a transistor whose channel formation region is formed in a metal oxide having a high density of trap states has unstable electrical characteristics in some cases.

In order to obtain stable electrical characteristics of the transistor, it is effective to reduce the concentration of impurities in the metal oxide. In addition, in order to reduce the concentration of impurities in the metal oxide, the concentration of impurities in a film that is adjacent to the metal oxide is preferably reduced. As examples of the impurities, hydrogen, nitrogen, an alkali metal, an alkaline earth metal, iron, nickel, silicon, and the like are given.

[Impurity]

Here, the influence of impurities in the metal oxide is described.

When silicon or carbon that is one of Group 14 elements is contained in the metal oxide, defect states are formed. Thus, the concentration of silicon or carbon (the concentration is measured by SIMS) in the metal oxide and the concentration of silicon or carbon in the vicinity of an interface with the metal oxide (the concentration is measured by secondary ion mass spectrometry, SIMS) is set to be lower than or equal to $2 \times 10^{18}$ atoms/cm$^3$, preferably lower than or equal to $2 \times 10^{17}$ atoms/cm$^3$.

When the metal oxide contains an alkali metal or an alkaline earth metal, defect states are formed and carriers are generated, in some cases. Thus, a transistor including a metal oxide that contains an alkali metal or an alkaline earth metal for a channel formation region is likely to be a normally-on transistor. Therefore, it is preferable to reduce the concentration of an alkali metal or an alkaline earth metal in the metal oxide. Specifically, the concentration of an alkali metal or an alkaline earth metal in the metal oxide, which is measured by SIMS, is lower than or equal to $1 \times 10^{18}$ atoms/cm$^3$, preferably lower than or equal to $2 \times 10^{16}$ atoms/cm$^3$.

When the metal oxide contains nitrogen, the metal oxide easily becomes n-type by generation of electrons functioning as carriers and an increase of carrier density. Thus, a transistor whose channel formation region includes a metal oxide that contains nitrogen is likely to be a normally-on transistor. For this reason, the amount of nitrogen in the channel formation region in the metal oxide is preferably reduced as much as possible; for example, the concentration of nitrogen in the metal oxide measured by SIMS is set to lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, and still further preferably lower than or equal to $5 \times 10^{17}$ atoms/cm$^3$.

Hydrogen contained in a metal oxide reacts with oxygen bonded to a metal atom to be water, and thus causes an oxygen vacancy, in some cases. Entry of hydrogen into the oxygen vacancy generates an electron functioning as a carrier in some cases. Furthermore, in some cases, bonding of part of hydrogen to oxygen bonded to a metal atom causes generation of an electron functioning as a carrier. Thus, a transistor including a metal oxide that contains hydrogen is likely to be normally-on.

Hydrogen contained in a metal oxide sometimes forms shallow defect states in the metal oxide. Shallow defect states refer to interface states near the conduction band minimum. Shallow defect states probably exist near the boundary between a high-density region and a low-density region in the metal oxide. Here, the high-density region and the low-density region in the metal oxide are distinguished by the amounts of hydrogen contained in the regions. That is, the high-density region contains more hydrogen than the low-density region. It is probable that near the boundary between the high-density region and the low-density region in the metal oxide, stress distortion between the regions easily causes minute cracks, oxygen vacancies and dangling bonds of indium are generated near the cracks, and impurities such as hydrogen and water are localized there to form shallow defect states.

The high-density region in the metal oxide sometimes has higher crystallinity than the low-density region. Furthermore, the high-density region in the metal oxide sometimes has higher film density than the low-density region. When the metal oxide has a composition including indium, gallium, and zinc, the high-density region contains indium, gallium, and zinc and the low-density region contains indium and zinc, in some cases. In other words, the proportion of gallium in the low-density region is lower than that in the high-density region in some cases.

Note that such shallow defect states probably result from oxygen vacancies. An increase in the number of oxygen vacancies in the metal oxide probably leads to an increase in the density of deep defect states (dDOS: deep-level density of states) as well as an increase in the density of shallow defect states (sDOS: shallow-level density of states). This is because deep defect states also result from oxygen vacancies. Note that deep defect states refer to defect states that are located around the center of the band gap.

Therefore, a reduction in the number of oxygen vacancies in the metal oxide can lead to a reduction in both the density of shallow defect states and the density of deep defect states. Furthermore, shallow defect states can possibly be controlled to some extent by adjusting the temperature at the time of deposition of the metal oxide. Specifically, the temperature at the time of deposition of the metal oxide is set around 170° C., preferably around 130° C., further preferably room temperature, whereby the density of shallow defect states can be reduced.

Sallow defect states in a metal oxide affect the electrical characteristics of the transistor that uses the metal oxide in its semiconductor layer. In other words, owing to shallow defect states, the drain current $I_d$ changes only gently as a function of the gate voltage $V_g$ in the drain current-gate voltage ($I_d$-$V_g$) characteristics of the transistor, worsening the S value (subthreshold swing, or SS), which is a criterion for judging the rising characteristics of a transistor from an off state to an on state. This is probably because of trapping of electrons by shallow defect states.

For this reason, the amount of hydrogen in the metal oxide is preferably reduced as much as possible. Specifically, the hydrogen concentration of the metal oxide measured by SIMS is lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$. When a metal oxide with sufficiently reduced impurity concentration is used for a channel formation region in a transistor, the transistor can have stable electrical characteristics.

<Method for Manufacturing Semiconductor Device>

Next, a method for manufacturing a semiconductor device including the transistor 200 of the present invention will be described with reference to FIGS. 4A to 4C to FIGS. 19A to 19C. FIG. 4A, FIG. 5A, FIG. 6A, FIG. 7A, FIG. 8A, FIG. 9A, FIG. 10A, FIG. 11A, FIG. 12A, FIG. 13A, FIG. 14A, FIG. 15A, FIG. 16A, FIG. 17A, FIG. 18A, and FIG. 19A are top views. FIG. 4B, FIG. 5B, FIG. 6B, FIG. 7B, FIG. 8B, FIG. 9B, FIG. 10B, FIG. 1iB, FIG. 12B, FIG. 13B, FIG. 14B, FIG. 15B, FIG. 16B, FIG. 17B, FIG. 18B, and FIG. 19B are cross-sectional views taken along dashed-dotted lines A1-A2 in FIG. 4A, FIG. 5A, FIG. 6A, FIG. 7A, FIG. 8A, FIG. 9A, FIG. 10A, FIG. 11A, FIG. 12A, FIG. 13A, FIG. 14A, FIG. 15A, FIG. 16A, FIG. 17A, FIG. 18A, and FIG. 19A, which correspond to cross-sectional views in the channel length direction of the transistor 200. FIG. 4C, FIG. 5C, FIG. 6C, FIG. 7C, FIG. 8C, FIG. 9C, FIG. 10C, FIG. 11C, FIG. 12C, FIG. 13C, FIG. 14C, FIG. 15C, FIG. 16C, FIG. 17C, FIG. 18C, and FIG. 19C are cross-sectional views taken along dashed-dotted lines A3-A4 in FIG. 4A, FIG. 5A, FIG. 6A, FIG. 7A, FIG. 8A, FIG. 9A, FIG. 10A, FIG. 11A, FIG. 12A, FIG. 13A, FIG. 14A, FIG. 15A, FIG. 16A, FIG. 17A, FIG. 18A, and FIG. 19A, which correspond to cross-sectional views in the channel width direction of the transistor 200. Note that in the top views in FIG. 4A, FIG. 5A, FIG. 6A, FIG. 7A, FIG. 8A, FIG. 9A, FIG. 10A, FIG. 11A, FIG. 12A, FIG. 13A, FIG. 14A, FIG. 15A, FIG. 16A, FIG. 17A, FIG. 18A, and FIG. 19A, some components are not illustrated for simplification of the drawings.

First, a substrate (not illustrated) is prepared, and the insulator 210 is formed over the substrate. The insulator 210 can be formed by a sputtering method, a chemical vapor deposition (CVD) method, a molecular beam epitaxy (MBE) method, a pulsed laser deposition (PLD) method, an atomic layer deposition (ALD) method, or the like.

Note that CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas.

The use of a PECVD method can provide a high-quality film at a relatively low temperature. Furthermore, a thermal CVD method does not use plasma and thus causes less plasma damage to an object. For example, a wiring, an electrode, an element (e.g., transistor or capacitor), or the like included in a semiconductor device might be charged up by receiving charges from plasma. In that case, accumulated charges might break the wiring, electrode, element, or the like included in the semiconductor device. By contrast, when a thermal CVD method not using plasma is employed, such plasma damage is not caused and the yield of the semiconductor device can be increased. A thermal CVD method does not cause plasma damage during deposition, so that a film with few defects can be obtained.

An ALD method also causes less plasma damage to an object. An ALD method does not cause plasma damage during deposition, so that a film with few defects can be obtained. Note that a precursor used in the ALD method sometimes contains impurities such as carbon. Thus, a film formed by the ALD method may contain impurities such as carbon in a larger amount than a film formed by another deposition method. Note that impurities can be quantified by X-ray photoelectron spectroscopy (XPS).

Unlike in a deposition method in which particles ejected from a target or the like are deposited, in a CVD method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening portion with a high aspect ratio, for example. On the other hand, an ALD method has a relatively low deposition rate; thus, it is sometimes preferable to combine an ALD method with another deposition method with a high deposition rate such as a CVD method.

When a CVD method or an ALD method is used, composition of a film to be formed can be controlled with a flow rate ratio of the source gases. For example, by a CVD method or an ALD method, a film with a certain composition can be formed depending on a flow rate ratio of the source gases. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the film formation can be reduced because time taken for transfer and pressure adjustment is omitted. Thus, semiconductor devices can be manufactured with improved productivity in some cases.

In this embodiment, aluminum oxide is formed as the insulator 210 by a sputtering method. The insulator 210 may have a multilayer structure. For example, the multilayer structure may be formed in such a manner that aluminum oxide is formed by a sputtering method and aluminum oxide is formed over the aluminum oxide by an ALD method. Alternatively, the multilayer structure may be formed in such a manner that aluminum oxide is formed by an ALD method and aluminum oxide is formed over the aluminum oxide by a sputtering method.

Then, the insulator 212 is formed over the insulator 210. The insulator 212 can be formed by a sputtering method, a CVD method, an MBE method, a PLD method, an ALD method, or the like. In this embodiment, as the insulator 212, silicon oxide is formed by a CVD method.

Then, an opening is formed in the insulator 212 to reach the insulator 210. Examples of the opening include grooves and slits. A region where the opening is formed may be referred to as an opening portion. The opening can be formed by a wet etching method; however, a dry etching method is suitable for microfabrication. The insulator 210 is preferably an insulator that serves as an etching stopper used in forming the opening by etching the insulator 212. For example, in the case where silicon oxide is used for the insulator 212 in which the opening is to be formed, the insulator 210 is preferably formed using silicon nitride, aluminum oxide, or hafnium oxide.

After the formation of the opening, a conductive film to be the conductor 203a is formed. The conductive film preferably includes a conductor that has a function of inhibiting the penetration of oxygen. For example, tantalum nitride, tungsten nitride, or titanium nitride can be used. Alternatively, a stacked-layer film formed using the conductor and tantalum, tungsten, titanium, molybdenum, aluminum, copper, or a molybdenum-tungsten alloy can be used. The conductive film to be the conductor 203a can be formed by a sputtering method, a CVD method, an MBE method, a PLD method, an ALD method, or the like.

In this embodiment, as the conductive film to be the conductor 203a, tantalum nitride or a stacked film of tantalum nitride and titanium nitride formed over the tantalum nitride is formed by a sputtering method. Even when a metal that is easily diffused, such as copper, is used for the conductor 203b to be described later, the use of such a metal nitride as the conductor 203a can inhibit diffusion of the metal to the outside of the conductor 203a.

Next, a conductive film to be the conductor 203b is formed over the conductive film to be the conductor 203a. The conductive film can be formed by a sputtering method, a CVD method, an MBE method, a PLD method, an ALD method, or the like. In this embodiment, as the conductive film to be the conductor 203b, a low-resistant conductive material such as copper is formed.

Next, by CMP treatment, the conductive film to be the conductor 203a and the conductive film to be the conductor 203b are partly removed to expose the insulator 212. As a result, the conductive film to be the conductor 203a and the conductive film to be the conductor 203b remain only in the opening portion. Thus, the conductor 203 including the conductors 203a and 203b, which has a flat top surface, can be formed (see FIGS. 4A to 4C). Note that the insulator 212 is partly removed by the CMP treatment in some cases.

Next, the insulator 214 is formed over the insulator 212 and the conductor 203. The insulator 214 can be formed by a sputtering method, a CVD method, an MBE method, a PLD method, an ALD method, or the like. In this embodiment, as the insulator 214, silicon nitride is formed by a CVD method. Even when metal that is likely to be diffused, such as copper, is used for the conductor 203b, the use of an insulator through which copper is less likely to pass, such as silicon nitride, as the insulator 214 can inhibit diffusion of the metal into the layers above the insulator 214.

Next, the insulator 216 is formed over the insulator 214. The insulator 216 can be formed by a sputtering method, a CVD method, an MBE method, a PLD method, an ALD method, or the like. In this embodiment, silicon oxide is formed as the insulator 216 by a CVD method.

Next, an opening reaching the conductor 203 is formed in the insulators 214 and 216. The opening can be formed by a wet etching method; however, a dry etching method is suitable for microfabrication.

After the formation of the opening, a conductive film to be the conductor 205a is formed. The conductive film preferably includes a conductive material having a function of inhibiting the penetration of oxygen. For example, tantalum nitride, tungsten nitride, or titanium nitride can be used. Alternatively, a stacked-layer film formed using the conductor and tantalum, tungsten, titanium, molybdenum, aluminum, copper, or a molybdenum-tungsten alloy can be used. The conductive film to be the conductor 205a can be formed by a sputtering method, a CVD method, an MBE method, a PLD method, an ALD method, or the like.

In this embodiment, tantalum nitride is formed as the conductive film to be the conductor 205a by a sputtering method.

Next, a conductive film to be the conductor 205b is formed over the conductive film to be the conductor 205a. The conductive film can be formed by a sputtering method, a CVD method, an MBE method, a PLD method, an ALD method, or the like.

In this embodiment, as the conductive film to be the conductor 205b, titanium nitride is formed by a CVD method and tungsten is formed by a CVD method over the titanium nitride.

Next, by CMP treatment, the conductive film to be the conductor 205a and the conductive film to be the conductor 205b are partly removed to expose the insulator 216. As a result, the conductive film to be the conductor 205a and the conductive film to be the conductor 205b remain only in the opening portion. Thus, the conductor 205 including the conductors 205a and 205b, which has a flat top surface, can be formed (see FIGS. 4A to 4C). Note that the insulator 216 is partly removed by the CMP treatment in some cases.

Next, the insulator 220 is formed over the insulator 216 and the conductor 205. The insulator 220 can be formed by a sputtering method, a CVD method, an MBE method, a PLD method, an ALD method, or the like. In this embodiment, as the insulator 220, silicon oxide is formed by a CVD method.

Then, the insulator 222 is formed over the insulator 220. An insulator containing an oxide of one or both of aluminum and hafnium is preferably formed as the insulator 222. As the insulator containing an oxide of one or both of aluminum and hafnium, aluminum oxide, hafnium oxide, an oxide containing aluminum and hafnium (hafnium aluminate), or the like is preferably used. The insulator containing an oxide of one or both of aluminum and hafnium has a barrier property against oxygen, hydrogen, and water. When the insulator 222 has a barrier property against hydrogen and water, diffusion of hydrogen and water contained in a structure body provided around the transistor 200 into the transistor 200 through the insulator 222 is inhibited, and generation of an oxygen vacancy in the oxide 230 can be inhibited.

The insulator 222 can be formed by a sputtering method, a CVD method, an MBE method, a PLD method, an ALD method, or the like.

Then, the insulator 224 is formed over the insulator 222. The insulator 224 can be formed by a sputtering method, a CVD method, an MBE method, a PLD method, an ALD method, or the like. In this embodiment, as the insulator 224, silicon oxide is formed by a CVD method.

Subsequently, heat treatment is preferably performed. The heat treatment can be performed at a temperature higher than or equal to 250° C. and lower than or equal to 650° C., preferably higher than or equal to 300° C. and lower than or equal to 500° C., further preferably higher than or equal to 320° C. and lower than or equal to 450° C. The heat treatment is performed in a nitrogen atmosphere, an inert gas atmosphere, or an atmosphere containing an oxidizing gas at 10 ppm or more, 1% or more, or 10% or more. The heat treatment may be performed under a reduced pressure. Alternatively, the heat treatment may be performed in such a manner that heat treatment is performed in a nitrogen atmosphere or an inert gas atmosphere, and then another heat treatment is performed in an atmosphere containing an oxidizing gas at 10 ppm or more, 1% or more, or 10% or more in order to compensate for released oxygen.

In this embodiment, heat treatment is performed in a nitrogen atmosphere at 400° C. for one hour after the formation of the insulator 224. By the above heat treatment, impurities such as water or hydrogen included in the insulator 224 can be removed, for example.

This heat treatment can also be performed after the formation of the insulator 220 and after the formation of the insulator 222. Although the heat treatment can be performed under the above-described conditions for the heat treatment, heat treatment after the formation of the insulator 220 is preferably performed in an atmosphere containing nitrogen.

Here, in order to form an excess-oxygen region in the insulator 224, plasma treatment using oxygen may be performed under a reduced pressure. The plasma treatment using oxygen is preferably performed using an apparatus including a power source for generating high-density plasma using microwaves, for example. Alternatively, a power source for applying a radio frequency (RF) to a substrate side may be provided. The use of high-density plasma enables high-density oxygen radicals to be produced, and application of the RF to the substrate side allows oxygen radicals generated by the high-density plasma to be efficiently introduced into the insulator 224. Alternatively, after plasma treatment using an inert gas with the apparatus, plasma treatment using oxygen in order to compensate for released oxygen may be performed. Note that impurities such as water or hydrogen included in the insulator 224 can be removed by selecting the conditions of the plasma treatment appropriately. In this case, the heat treatment is unnecessary.

Then, the insulator 226 is formed over the insulator 224. The insulator 226 functions as a stopper in a later step of etching the insulator 280, an insulator 273A, an insulator 244A, and the conductor 242B. An insulator containing an oxide of one or both of aluminum and hafnium is preferably formed as the insulator 226. As the insulator containing an oxide of one or both of aluminum and hafnium, aluminum oxide, hafnium oxide, an oxide containing aluminum and hafnium (hafnium aluminate), or the like is preferably used. The insulator containing an oxide of one or both of aluminum and hafnium has a barrier property against oxygen, hydrogen, and water. When the insulator 226 has a barrier property against hydrogen and water, diffusion of hydrogen and water contained in a structure body provided around the transistor 200 into the transistor 200 through the insulator 226 is inhibited, and generation of an oxygen vacancy in the oxide 230 can be inhibited.

The insulator 226 can be formed by a sputtering method, a CVD method, an MBE method, a PLD method, an ALD method, or the like.

After the insulator 226 is formed, the above-described heat treatment may be performed.

Figure 4A:
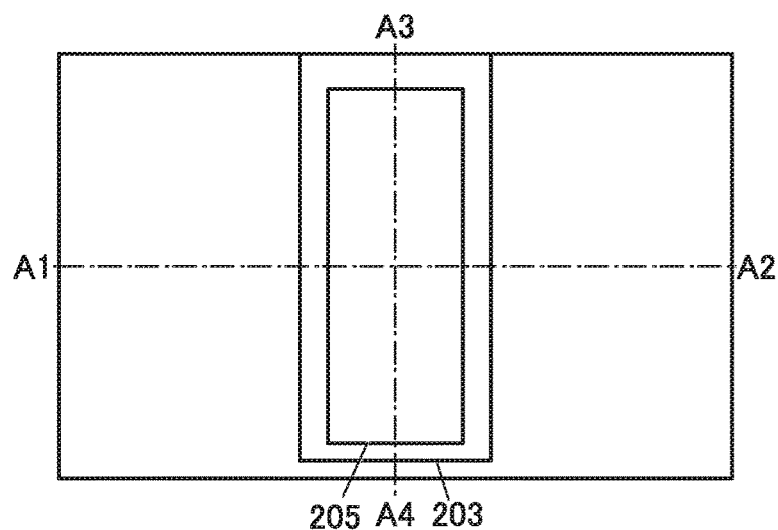
FIGS. 4A to 4C are a top view and cross-sectional views illustrating a method for manufacturing a semiconductor device of one embodiment of the present invention.
Figure 4C:
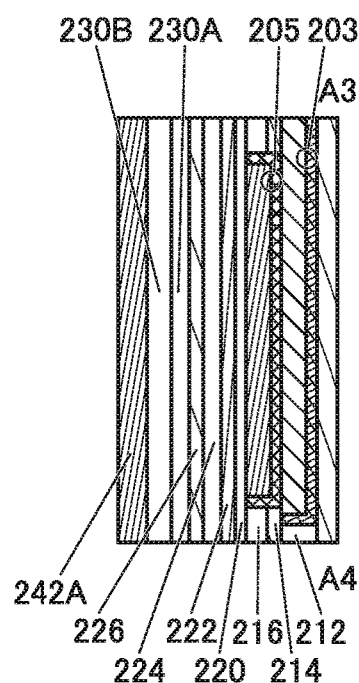
Figure 4B:
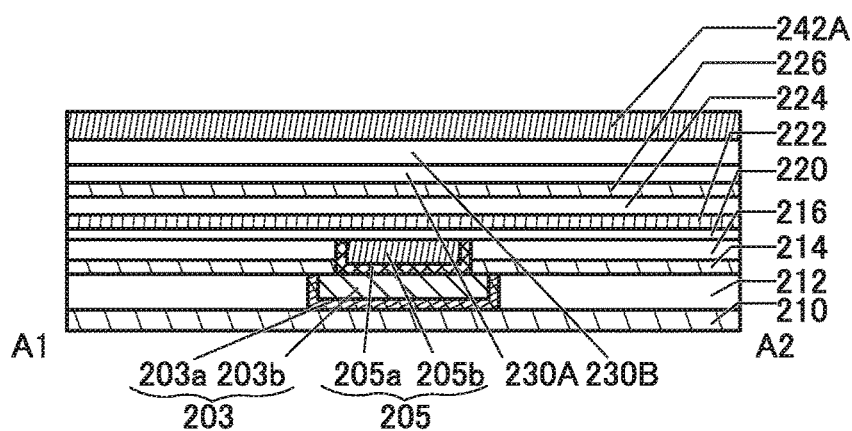

Next, an oxide film 230A to be the oxide 230$a$ and an oxide film 230B to be the oxide 230$b$ are sequentially formed over the insulator 226 (see FIGS. 4A to 4C). Note that the oxide films are preferably formed successively without exposure to the air. When the oxide films are formed without exposure to the air, impurities or moisture from the air can be prevented from being attached to the oxide films 230A and 230B, so that an interface between the oxide films 230A and 230B and the vicinity of the interface can be kept clean.

The oxide films 230A and 230B can be formed by a sputtering method, a CVD method, an MBE method, a PLD method, an ALD method, or the like.

In the case where the oxide films 230A and 230B are formed by a sputtering method, for example, oxygen or a mixed gas of oxygen and a rare gas is used as a sputtering gas. By increasing the proportion of oxygen in the sputtering gas, the amount of excess oxygen in the oxide films to be formed can be increased. In the case where the above oxide films are formed by a sputtering method, an In-M-Zn oxide target can be used, for example.

In particular, when the oxide film 230A is formed, part of oxygen contained in the sputtering gas is supplied to the insulator 224 and the insulator 226 in some cases. Therefore, the proportion of oxygen in the sputtering gas for formation of the oxide film 230A is preferably 70% or higher, further preferably 80% or higher, and still further preferably 100%.

In the case where the oxide film 230B is formed by a sputtering method, when the proportion of oxygen in the sputtering gas is higher than or equal to 1% and lower than or equal to 30%, preferably higher than or equal to 5% and lower than or equal to 20%, an oxygen-deficient oxide semiconductor is formed. A transistor including an oxygen-deficient oxide semiconductor in a channel formation region can have relatively high field-effect mobility.

In this embodiment, the oxide film 230A is formed using a target with an atomic ratio of In:Ga:Zn=1:3:4 by a sputtering method. The oxide film 230B is formed using a target with an atomic ratio of In:Ga:Zn=4:2:4.1 by a sputtering method. Note that each of the oxide films is preferably formed by appropriate selection of film formation conditions and an atomic ratio to have characteristics required for the oxide 230.

Next, heat treatment may be performed. For the heat treatment, the conditions for the heat treatment can be used. By the heat treatment, impurities such as water or hydrogen contained in the oxide films 230A and 230B can be removed, for example. In this embodiment, treatment is performed in a nitrogen atmosphere at 400° C. for one hour, and successively another treatment is performed in an oxygen atmosphere at 400° C. for one hour.

Next, the conductive film 242A is formed over the oxide film 230B (see FIGS. 4A to 4C). For the conductive film 242A, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Note that the conductive film 242A can be formed by a sputtering method, a CVD method, an MBE method, a PLD method, an ALD method, or the like.

Then, the conductive film 242A is processed to form a hard mask for processing the oxide film 230A and the oxide film 230B.

Note that the conductive film 242A may be processed by a lithography method. The processing can be performed by a dry etching method or a wet etching method. A dry etching method is suitable for microfabrication.

In the lithography method, first, a resist is exposed to light through a mask. Next, a region exposed to light is removed or left using a developing solution, so that a resist mask is formed. Then, etching through the resist mask is conducted. As a result, a conductor, a semiconductor, an insulator, or the like can be processed into a desired shape. The resist mask is formed by, for example, exposure of the resist to light using KrF excimer laser light, ArF excimer laser light, extreme ultraviolet (EUV) light, or the like. Alternatively, a liquid immersion technique may be employed in which a portion between a substrate and a projection lens is filled with liquid (e.g., water) to perform light exposure. An electron beam or an ion beam may be used instead of the above-mentioned light. Note that a mask for the exposure of the resist to light is unnecessary in the case of using an electron beam or an ion beam because direct writing is performed on the resist. To remove the resist mask, dry etching treatment such as ashing or wet etching treatment can be used. Alternatively, wet etching treatment can be performed after dry etching treatment. Further alternatively, dry etching treatment can be performed after wet etching treatment.

Figure 5A:
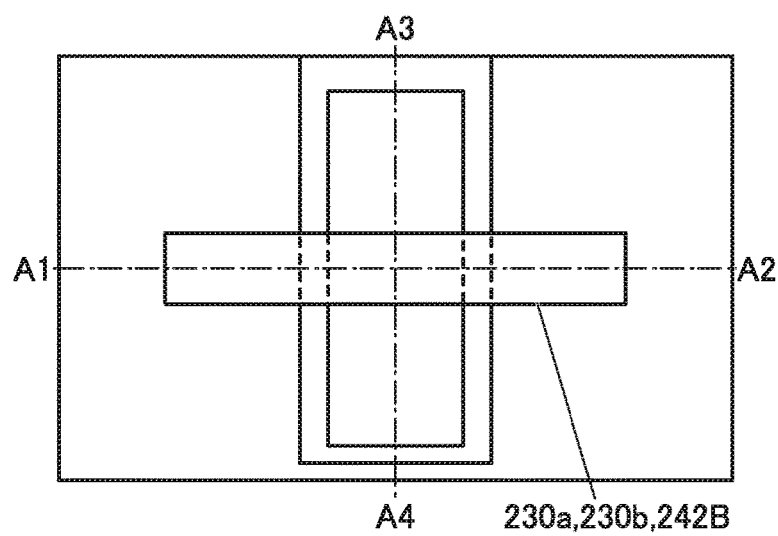
FIGS. 5A to 5C are a top view and cross-sectional views illustrating a method for manufacturing a semiconductor device of one embodiment of the present invention.
Figure 5C:
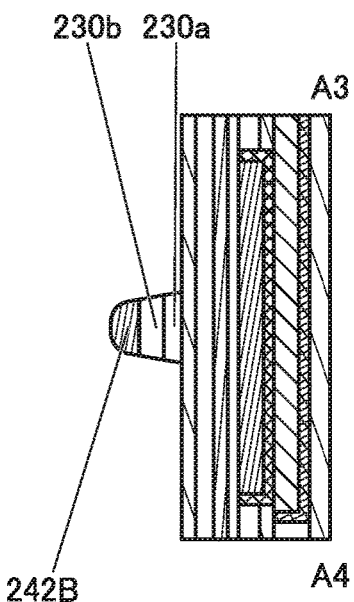
Figure 5B:
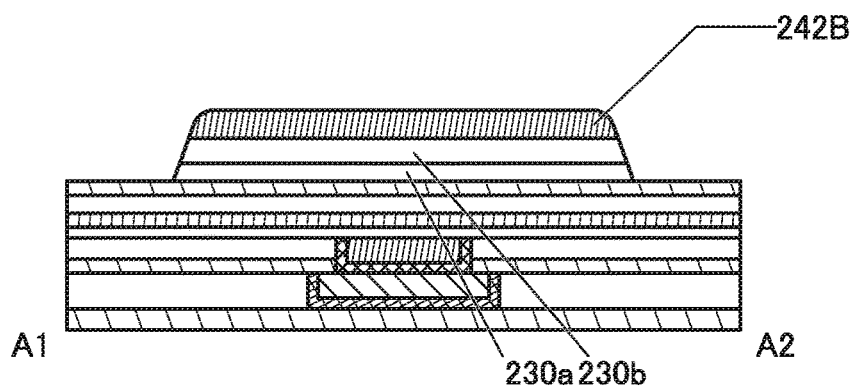

In this embodiment, the conductive film 242A is etched using a resist mask, so that the conductor 242B functioning as the hard mask is formed (see FIGS. 5A to 5C). After the formation of the conductor 242B, the oxide films may be processed after or without removal of the resist mask. In the latter case, the resist mask may be removed during the etching. The conductor 242B functioning as the hard mask may be removed by etching after the oxide films are etched; however, since the conductor 242B is further processed to form the source electrode and the drain electrode in this embodiment, the conductor 242B is left.

As a dry etching apparatus, a capacitively coupled plasma (CCP) etching apparatus including parallel plate type electrodes can be used. The capacitively coupled plasma etching apparatus including the parallel plate type electrodes may have a structure in which a high-frequency power is applied to one of the parallel plate type electrodes. Alternatively, the capacitively coupled plasma etching apparatus may have a structure in which different high-frequency powers are applied to one of the parallel plate type electrodes. Alternatively, the capacitively coupled plasma etching apparatus may have a structure in which high-frequency powers with the same frequency are applied to the parallel plate type electrodes. Alternatively, the capacitively coupled plasma etching apparatus may have a structure in which high-frequency powers with different frequencies are applied to the parallel plate type electrodes. Alternatively, a dry etching apparatus including a high-density plasma source can be used. As the dry etching apparatus including a high-density plasma source, an inductively coupled plasma (ICP) etching apparatus can be used, for example.

Then, with the use of the conductor 242B as the hard mask, the oxide films 230A and 230B are processed into island shapes to form the oxides 230a and 230b (see FIGS. 5A to 5C). Note that the insulator 226 is partly removed by the processing treatment in some cases.

The oxide 230a and the oxide 230b are formed to at least partly overlap with the conductor 205. It is preferable that the side surfaces of the oxides 230a and 230b be tapered with respect to a top surface of the insulator 222 or a top surface of the substrate, in which case a film formed on the side surfaces of the oxide 230a and the oxide 230b in a later step can be easily removed.

There is a curved surface between the side surfaces of the oxide 230a, the oxide 230b, and the conductor 242B and the top surface of the conductor 242B. That is, an end portion of the side surface and an end portion of the top surface are preferably curved (hereinafter such a curved shape is also referred to as a rounded shape). A radius of curvature of the curved surface at the end portion of the conductor 242B is greater than or equal to 3 nm and less than or equal to 10 nm, preferably greater than or equal to 5 nm and less than or equal to 6 nm. When the end portions are not angular, the coverage with films formed later in the film formation process can be improved.

Note that the oxide films can be processed by a dry etching method or a wet etching method with the use of the conductor 242B as the hard mask. A dry etching method is suitable for microfabrication.

In some cases, the treatment such as dry etching causes the attachment or diffusion of impurities due to an etching gas or the like to a side surface or an inside of the oxide 230a, the oxide 230b, or the like. Examples of the impurities include fluorine and chlorine.

In order to remove the impurities, cleaning is performed. As the cleaning, any of wet cleaning using a cleaning solution or the like, plasma treatment using plasma, cleaning by heat treatment, and the like can be performed by itself or in appropriate combination.

The wet cleaning may be performed using an aqueous solution in which oxalic acid, phosphoric acid, a hydrogen peroxide solution, hydrofluoric acid, or the like is diluted with carbonated water or pure water. Alternatively, ultrasonic cleaning using pure water or carbonated water may be performed. In this embodiment, ultrasonic cleaning using pure water or carbonated water is performed.

Next, heat treatment may be performed. For the heat treatment, the conditions for the above heat treatment can be used. Note that in the case where the heat treatment might cause oxidation of the conductor 242B, the heat treatment is preferably performed in an atmosphere containing no oxygen. When the conductor 242B contains an oxidation-resistant material, the heat treatment may be performed in an oxygen-containing atmosphere.

Figure 6A:
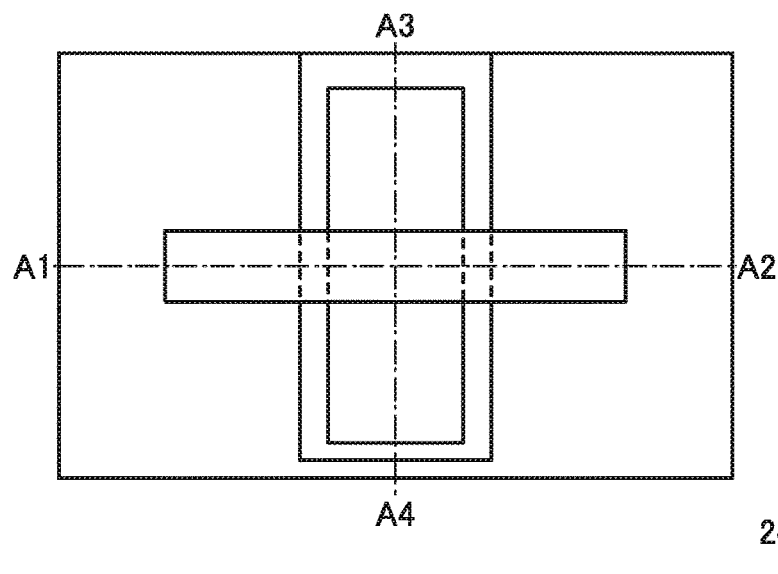
FIGS. 6A to 6C are a top view and cross-sectional views illustrating a method for manufacturing a semiconductor device of one embodiment of the present invention.
Figure 6C:
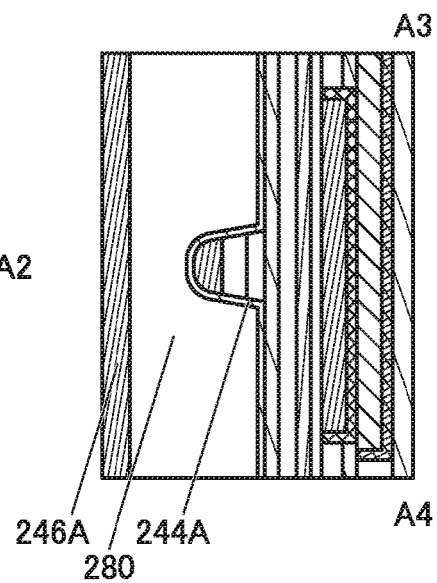
Figure 6B:
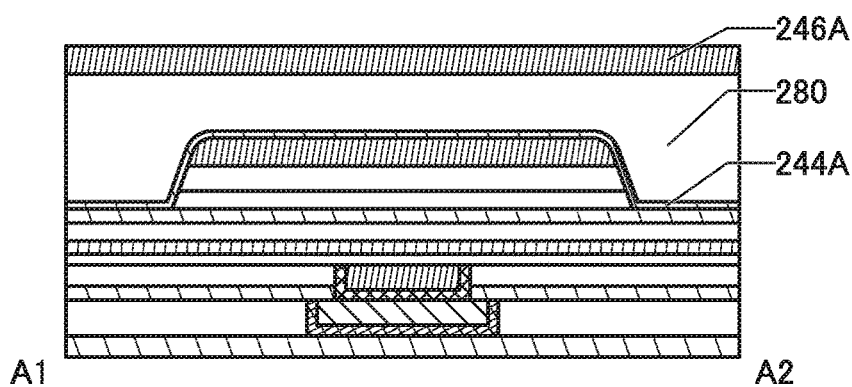

Then, the insulator 244A is formed over the insulator 226, the oxide 230a, the oxide 230b, and the conductor 242B (see FIGS. 6A to 6C). Note that the insulator 244A preferably functions as an insulating barrier, and as the insulator 244A, an insulator containing an oxide of one or both of aluminum and hafnium is preferably formed. As the insulator containing an oxide of one or both of aluminum and hafnium, aluminum oxide, hafnium oxide, an oxide containing aluminum and hafnium (hafnium aluminate), or the like is preferably used. The insulator 244A having a barrier property can inhibit oxidation of the conductor 242B. Note that when the conductor 242B contains an oxidation-resistant material, the insulator 244A does not always need to be provided. The insulator 244A can be formed by a sputtering method, a CVD method, an MBE method, a PLD method, an ALD method, or the like.

Then, the insulator 280 is formed over the insulator 244A. The insulator 280 preferably includes an insulator with a low dielectric constant. For example, the insulator 280 preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide, silicon oxynitride, silicon nitride oxide, and porous silicon oxide are preferable because an excess-oxygen region can be easily formed in the insulator 280 in a later step. In addition, silicon oxide and silicon oxynitride are preferable because silicon oxide and silicon oxynitride are thermally stable. The insulator 280 can be formed by a sputtering method, a CVD method, an MBE method, a PLD method, an ALD method, or the like. Alternatively, the insulator 280 can be formed by a spin coating method, a dipping method, a droplet discharging method (such as an ink-jet method), a printing method (such as screen printing or offset printing), a doctor knife method, a roll coater method, a curtain coater method, or the like. In this embodiment, silicon oxynitride is deposited as the insulator 280 by a CVD method.

The insulator 280 is preferably formed to have a flat top surface. For example, the insulator 280 may have a flat top surface right after the formation. Alternatively, the insulator 280 may be planarized by removing the insulator or the like from the top surface after the deposition so that the top surface becomes parallel to a reference surface such as a rear surface of the substrate. Such treatment is referred to as planarization treatment. As the planarization treatment, for example, chemical mechanical polishing (CMP) treatment, dry etching treatment, or the like can be performed. In this embodiment, CMP treatment is used as planarization treatment. Note that the top surface of the insulator 280 does not necessarily have planarity.

Next, a conductor 246A is formed over the insulator 280. Note that it is acceptable as long as the conductor 246A functions as a hard mask in the later step of etching the insulator 280, the insulator 273A, the insulator 244A, and the conductor 242B, and does not always need to have conductivity. The component over the insulator 280, which is denoted by 246A, may be an insulator as long as it functions as the hard mask.

Figure 7A:
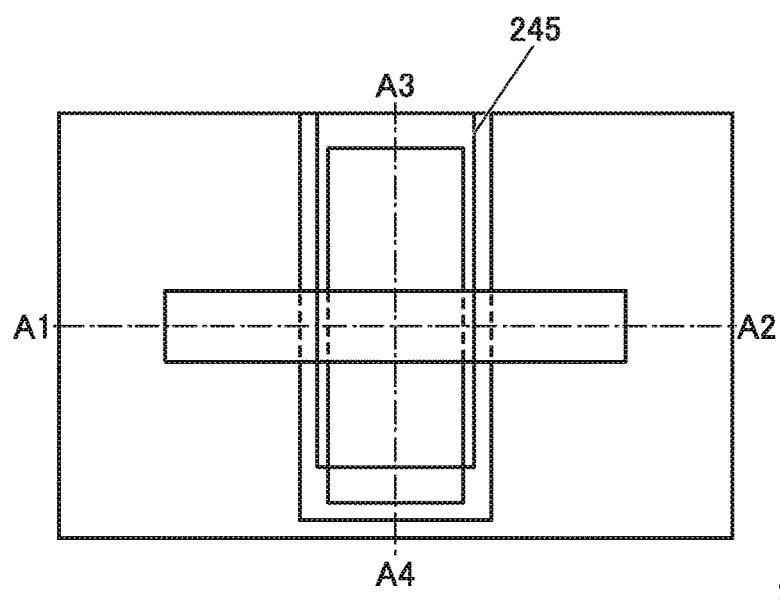
FIGS. 7A to 7C are a top view and cross-sectional views illustrating a method for manufacturing a semiconductor device of one embodiment of the present invention.
Figure 7C:
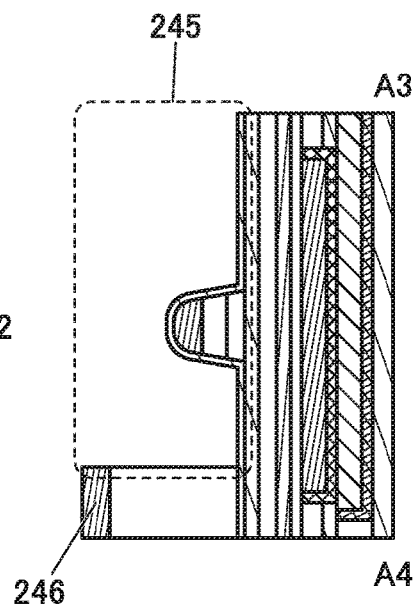
Figure 7B:
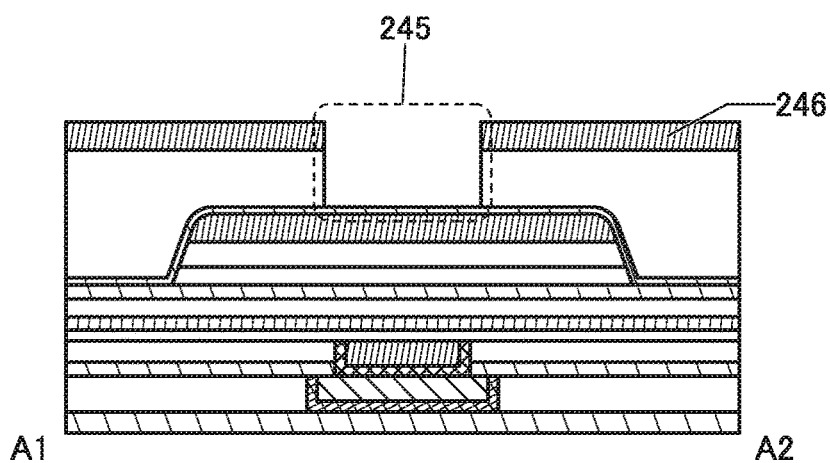

Next, a conductor 246 functioning as the hard mask is formed by processing the conductor 246A by a lithography method (see FIGS. 7A to 7C).

Then, the insulator 280 is processed with the use of the conductor 246 as the hard mask, whereby an opening 245 is formed to have a region overlapping with at least the conductor 205 (see FIGS. 7A to 7C). Although a wet etching method may be used for the formation of the opening, a dry etching method is preferred because it enables microfabrication and enables a side surface of the insulator 280 to be processed substantially vertically with respect to the surface of the insulator 222 or the insulator 280. The side surface of the insulator 280 is processed substantially vertically with respect to the surface of the insulator 222 or the insulator 280 and in a later step, the insulator 273 functioning as the sidewall is formed on the side surface of the insulator 280.

Figure 8A:
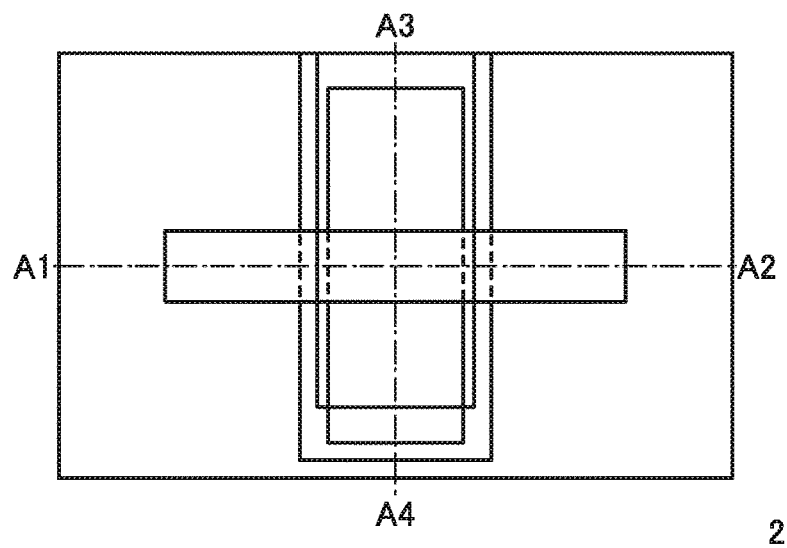
FIGS. 8A to 8C are a top view and cross-sectional views illustrating a method for manufacturing a semiconductor device of one embodiment of the present invention.
Figure 8C:
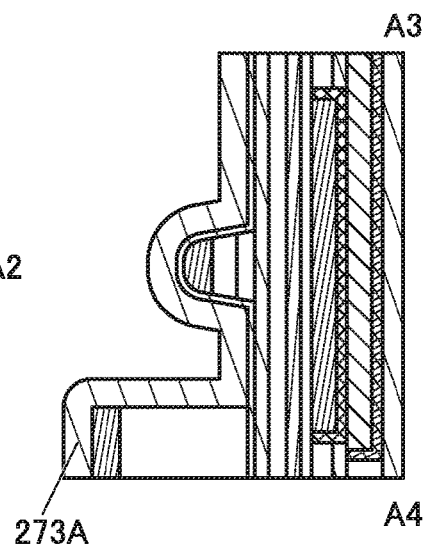
Figure 8B:
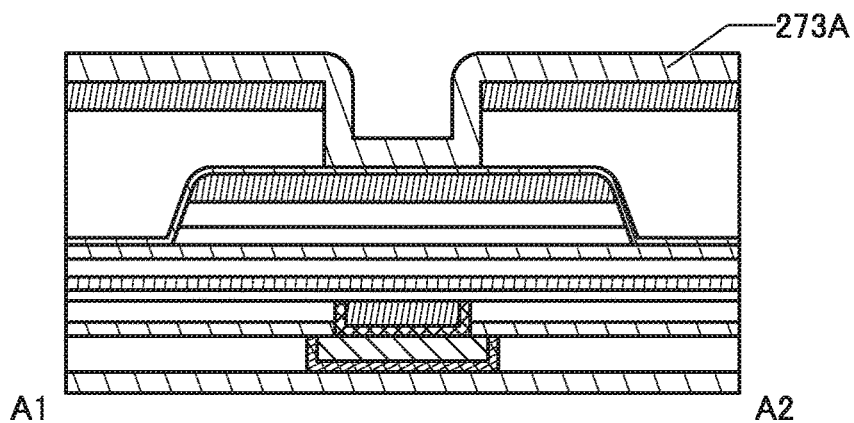

Next, the insulator 273A is formed in the opening 245 and over the conductor 246 (see FIGS. 8A to 8C). A metal oxide containing one or more of hafnium, aluminum, gallium, yttrium, zirconium, tungsten, titanium, tantalum, nickel, germanium, magnesium, and the like can be used as the insulator 273A. The insulator 273A can be formed by a sputtering method, a CVD method, an MBE method, a PLD method, an ALD method, or the like using a nitride of silicon or a nitride of silicon containing oxygen, i.e., silicon nitride, silicon nitride oxide, or the like.

A later step processes the insulator 273A into the insulator 273 functioning as the sidewall. The width of the sidewall depends on the thickness of the insulator 273A. The thickness of the insulator 273A can be greater than or equal to 5 nm and less than or equal to 30 nm, preferably greater than or equal to 5 nm and less than or equal to 15 nm. In that case, the width of the completed sidewall can be greater than or equal to 5 nm and less than or equal to 30 nm, or greater than or equal to 5 nm and less than or equal to 15 nm.

Figure 9A:
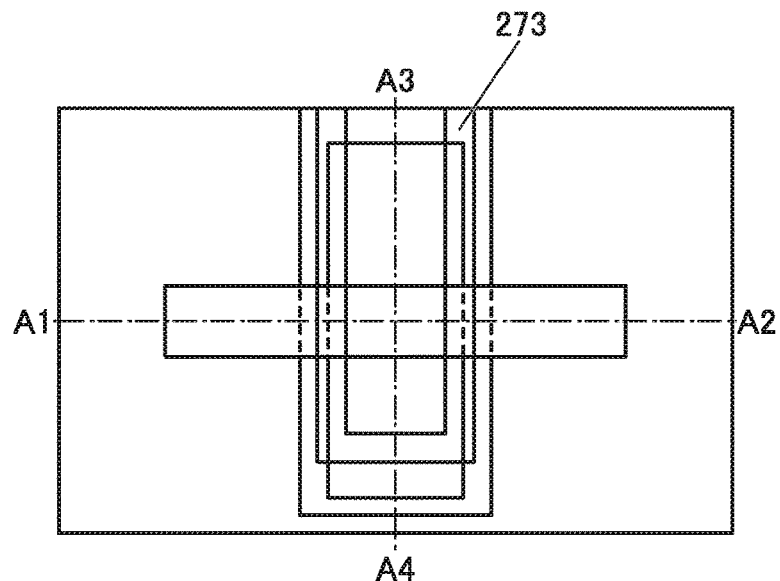
FIGS. 9A to 9C are a top view and cross-sectional views illustrating a method for manufacturing a semiconductor device of one embodiment of the present invention.
Figure 9C:
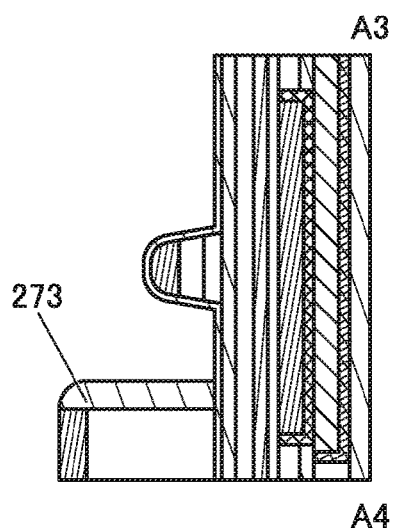
Figure 9B:
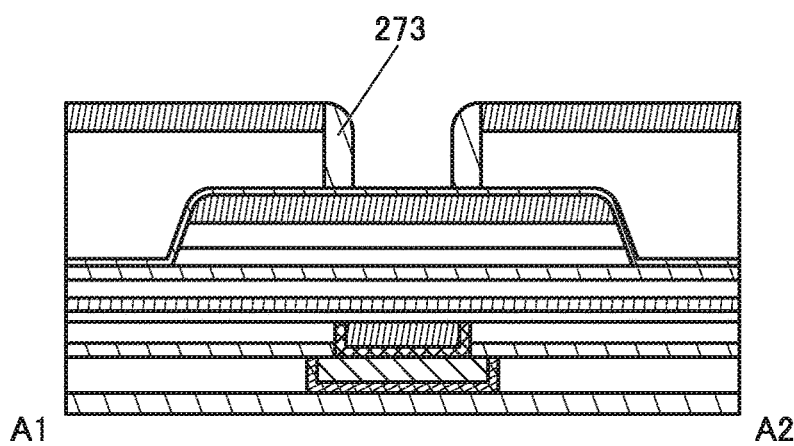

Next, the insulator 273A is processed by anisotropic etching, whereby the insulator 273 functioning as the sidewall is formed (see FIGS. 9A to 9C). Dry etching is preferably used as the anisotropic etching.

Figure 10A:
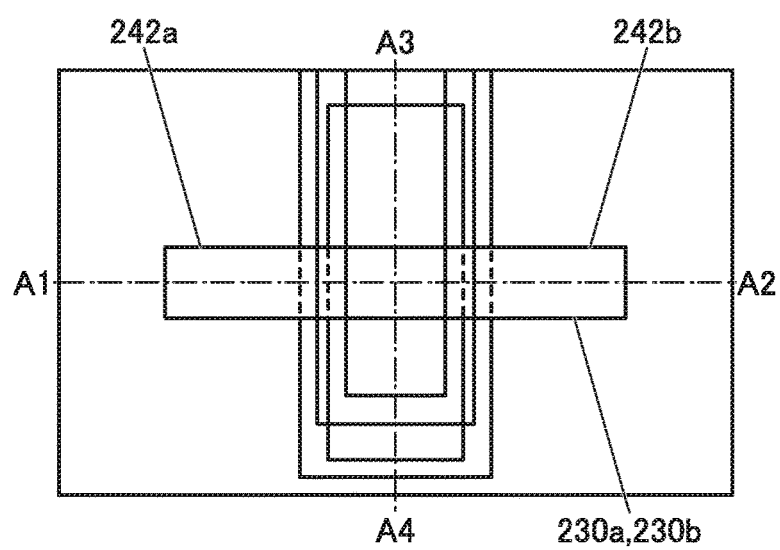
FIGS. 10A to 10C are a top view and cross-sectional views illustrating a method for manufacturing a semiconductor device of one embodiment of the present invention.
Figure 10C:
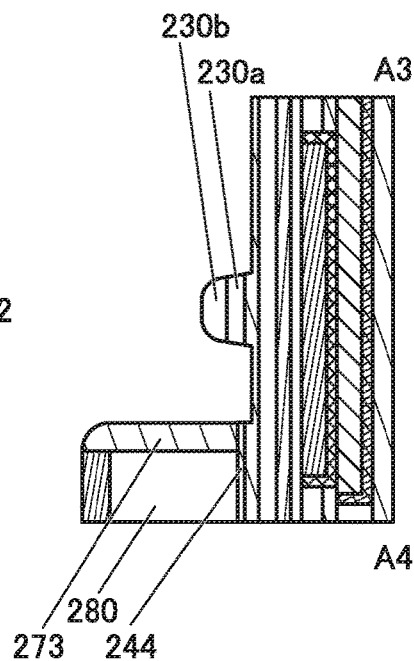
Figure 10B:
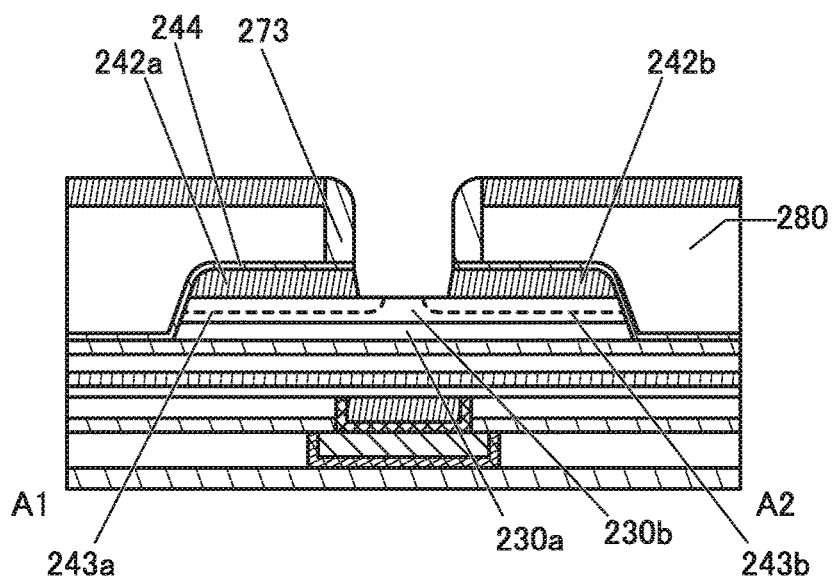

Then, with the use of the insulator 273 as a mask, the insulator 244A and the conductor 242B are processed to form the insulator 244 and the conductor 242 (the conductor 242a and the conductor 242b) (see FIGS. 10A to 10C). The processing is preferably performed by dry etching capable of anisotropic etching. The processing exposes the side surface of the oxide 230a, the top surface and side surface of the oxide 230b, and part of a surface of the insulator 226. In addition, the processing etches part of the insulator 226 in some cases. The facing cross sections of the conductor 242a and the conductor 242b sometimes have tapered shapes with respect to the surface of the insulator 222 or the insulator 280. Alternatively, the cross sections may be substantially vertical with respect to the surface of the insulator 222 or the insulator 280.

Note that the conductor 260 formed in a later step is provided between parts of the insulator 273, i.e., between the conductor 242a and the conductor 242b, in a self-aligned manner.

Here, heat treatment is preferably performed. The heat treatment can be performed at a temperature higher than or equal to 250° C. and lower than or equal to 650° C., preferably higher than or equal to 300° C. and lower than or equal to 500° C., further preferably higher than or equal to 320° C. and lower than or equal to 450° C. The heat treatment is performed in a nitrogen atmosphere or an inert gas atmosphere. In the case where the conductor 242 has oxidation resistance, the heat treatment may be performed in an oxygen-containing atmosphere. The heat treatment may be performed under a reduced pressure. The heat treatment is performed at 400° C. in a nitrogen atmosphere for one hour, for example.

By the heat treatment, impurities such as water or hydrogen contained in the oxides 230a and 230b can be removed, for example. Furthermore, damages that have been caused in the oxide 230a or the oxide 230b by the dry etching in the above processing can be recovered. In the case where the heat treatment is performed in an oxygen-containing atmosphere, oxygen can be added to the oxide 230a and the oxide 230b.

By the heat treatment, the metal element contained in the conductor 242 is diffused from the conductor 242 into the oxide 230b and added to the oxide 230b in some cases. Moreover, oxygen in the oxide 230b at and near the interface with the conductor 242 may be absorbed by the conductor 242. As a result, the oxide 230b at and near the interface with the conductor 242 becomes a metal compound and the resistance thereof is reduced. At this time, part of the oxide 230b may be alloyed with the metal element. When part of the oxide 230b is alloyed with the metal element, the metal element added to the oxide 230b becomes relatively stable; therefore, a highly reliable semiconductor device can be provided. Note that in FIG. 10B, the region 243a and the region 243b are shown by dotted lines as examples of such a low-resistance region of the oxide 230b.

The region 243a and the region 243b spread in the depth direction and the horizontal direction in the oxide 230b near the conductor 242 in the shown example; however, one embodiment of the present invention is not limited to this example. The region 243a and the region 243b may be formed in the whole oxide 230b in the depth direction or may be formed in the oxide 230a. The region 243a and the region 243b are formed in the horizontal direction in the regions spreading in the horizontal direction from the conductor 242 (the region 231 and the region 232 illustrated in FIG. 2) in the shown example; however, one embodiment of the present invention is not limited to this example. The region 243a and the region 243b may be formed in only the region overlapping with the conductor 242 (the region 231) or may also be formed in the region (part of the region 234) overlapping with part of the conductor 260 which is formed in a later step.

If hydrogen in the oxide 230 diffuses into the region 231 illustrated in FIG. 2 and enters an oxygen vacancy in the region 231, the hydrogen becomes relatively stable. Hydrogen in an oxygen vacancy in the region 234 is released from the oxygen vacancy by heat treatment at 250° C. or higher, diffuses into the region 231, enters an oxygen vacancy in the region 231, and becomes relatively stable. Thus, by heat treatment, the resistance of the region 231 is further reduced and the region 234 is purified (the amount of impurities such as water or hydrogen therein is reduced) to have increased resistance.

Heat treatment may be performed in a nitrogen atmosphere or an inert gas atmosphere, and then another heat treatment may be performed in an atmosphere containing an oxidizing gas at 10 ppm or more, 1% or more, or 10% or more. The heat treatment can be performed at a temperature higher than or equal to 250° C. and lower than or equal to 650° C., preferably higher than or equal to 300° C. and lower than or equal to 500° C., further preferably higher than or equal to 320° C. and lower than or equal to 450° C.

After the formation of the conductive film 242A or during the heat treatment following the formation of the conductor 242, the conductive film 242A or the conductor 242 sometimes absorbs oxygen in the region 231 of the oxide 230, which causes oxygen vacancies in the region 231. When hydrogen in the oxide 230 enters the oxygen vacancies, the carrier density of the region 231 is increased. Therefore, the region 231 of the oxide 230 becomes an n-type low-resistance region.

The oxygen concentration of the region 231 is lower than that of the region 234 in some cases. The oxygen concentration of the region 232 is higher than or equal to that of the region 231 and lower than or equal to that of the region 234, in some cases. The hydrogen concentration of the region 231 is higher than that of the region 234 in some cases. The hydrogen concentration of the region 232 is higher than or equal to that of the region 234 and lower than or equal to that of the region 231, in some cases.

Figure 11A:
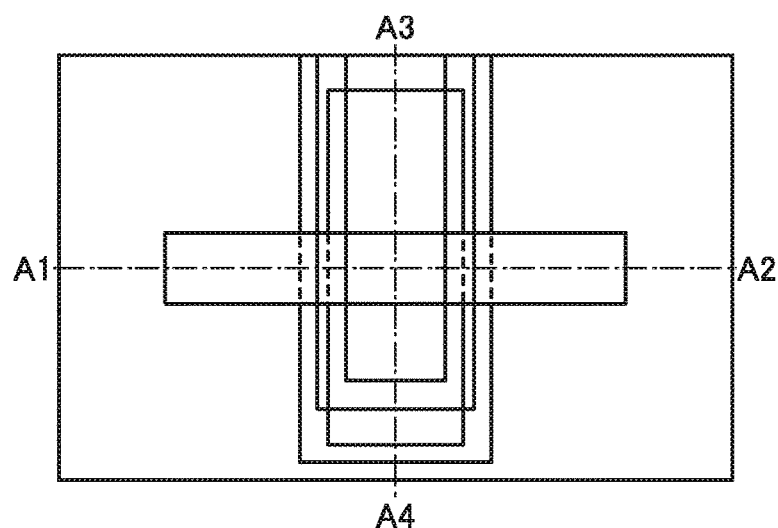
FIGS. 11A to 11C are a top view and cross-sectional views illustrating a method for manufacturing a semiconductor device of one embodiment of the present invention.
Figure 11C:
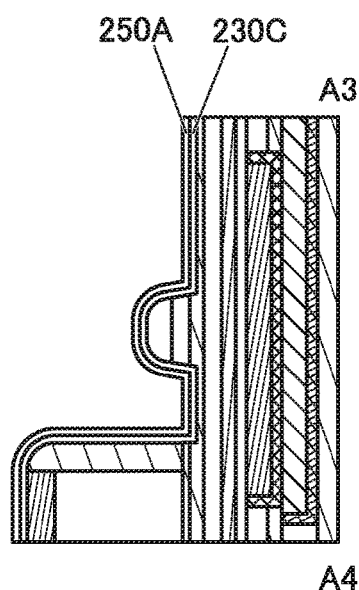
Figure 11B:
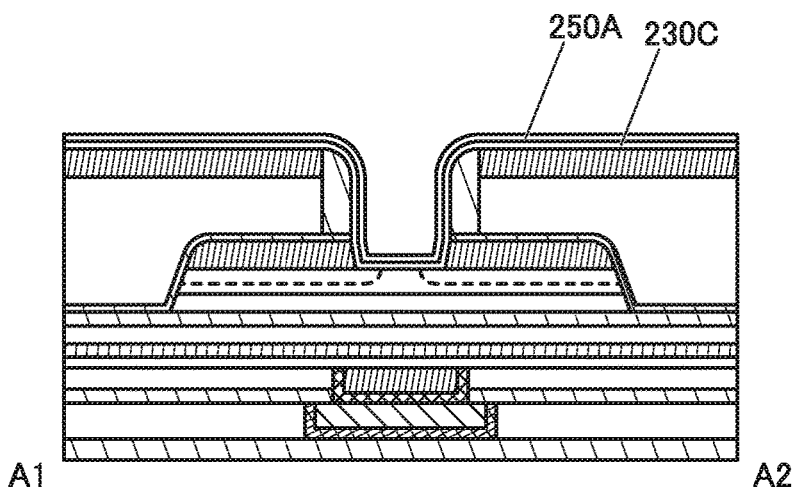

Then, the oxide film 230C to be the oxide 230c is formed over the conductor 246 to have regions that are in contact with the side surface of the oxide 230a, the top surface and side surface of the oxide 230b, the side surface of the conductor 242, and the side surface of the insulator 273 (see FIGS. 11A to 11C).

The oxide film 230C can be formed by a sputtering method, a CVD method, an MBE method, a PLD method, an ALD method, or the like. The oxide film 230C may be formed by a method similar to that of the oxide film 230A or the oxide film 230B in accordance with characteristics required for the oxide 230c. In this embodiment, the oxide film 230C is formed by a sputtering method using a target with an atomic ratio of In:Ga:Zn=1:3:4.

Then, an insulator 250A is formed over the oxide film 230C (see FIGS. 11A to 11C).

The insulator 250A can be formed by a sputtering method, a CVD method, an MBE method, a PLD method, an ALD method, or the like. For the insulator 250A, silicon oxynitride is preferably formed by a CVD method. The film formation temperature of the insulator 250A is preferably higher than or equal to 350° C. and lower than 450° C., particularly preferably approximately 400° C. When the insulator 250A is formed at 400° C., an insulator having few impurities can be formed.

Note that oxygen is excited by microwaves to generate high-density oxygen plasma, and the insulator 250A is exposed to the oxygen plasma, whereby oxygen can be supplied to the insulator 250A.

Furthermore, heat treatment may be performed. For the heat treatment, the conditions for the above heat treatment can be used. The heat treatment can reduce the moisture concentration and the hydrogen concentration in the insulator 250A.

Here, the conductor 242 and the conductor 260 that is formed in a later step might form parasitic capacitance. In other words, the insulating film formed at the side surface of the conductor 242 might function as the dielectric of the parasitic capacitance. Nevertheless, since the insulating film functions as a gate insulator of the transistor 200, it is preferably thin (20 nm or less, further preferably 10 nm or less, still further preferably 5 nm or less in thickness). In order that the insulating film provided at the side surface of the conductor 242 can be thick enough to make the parasitic capacitance negligible, the insulating film preferably has, at least at the side surface of the conductor 242, a stacked-layer structure of two or more layers.

Figure 12A:
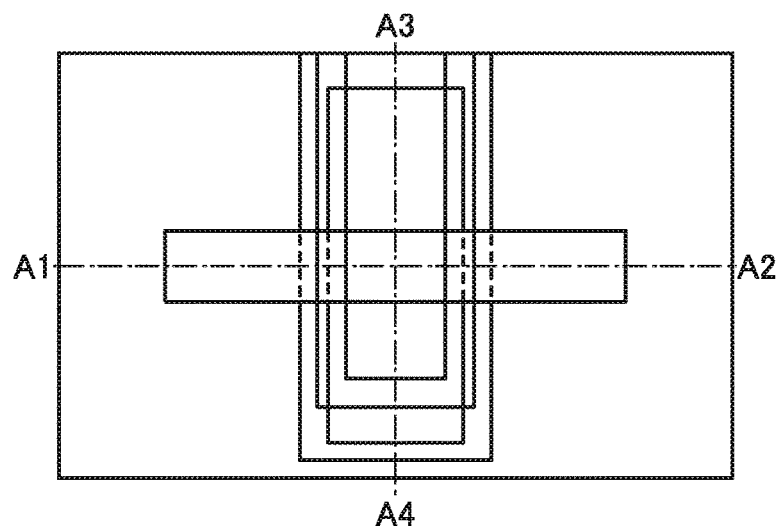
FIGS. 12A to 12C are a top view and cross-sectional views illustrating a method for manufacturing a semiconductor device of one embodiment of the present invention.
Figure 12C:
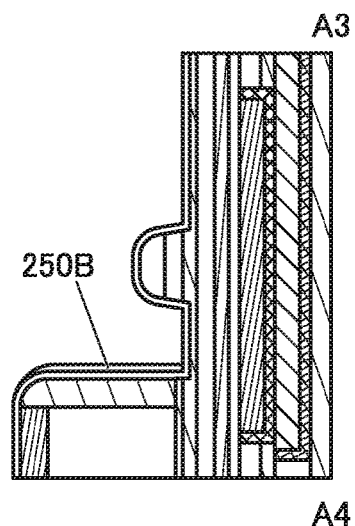
Figure 12B:
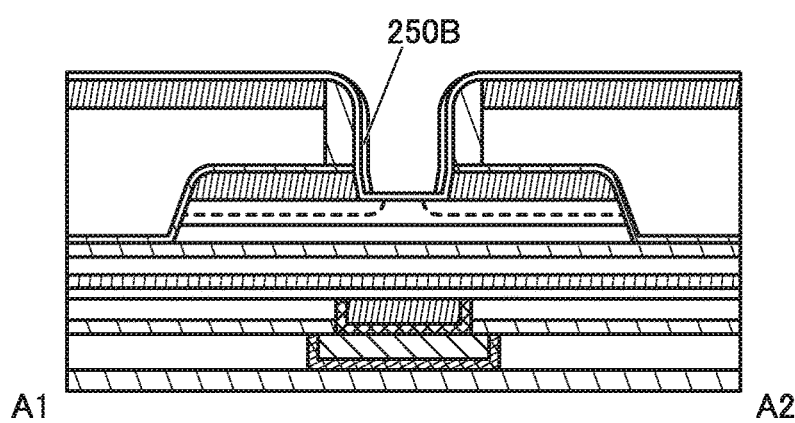

Thus, it is preferable to perform anisotropic etching on the insulator 250A to form an insulator 250B at the side surface of the conductor 242 and the side surface of the insulator 273 with the oxide film 230C positioned between the insulator 250B and the side surfaces (see FIGS. 12A to 12C).

Figure 13A:
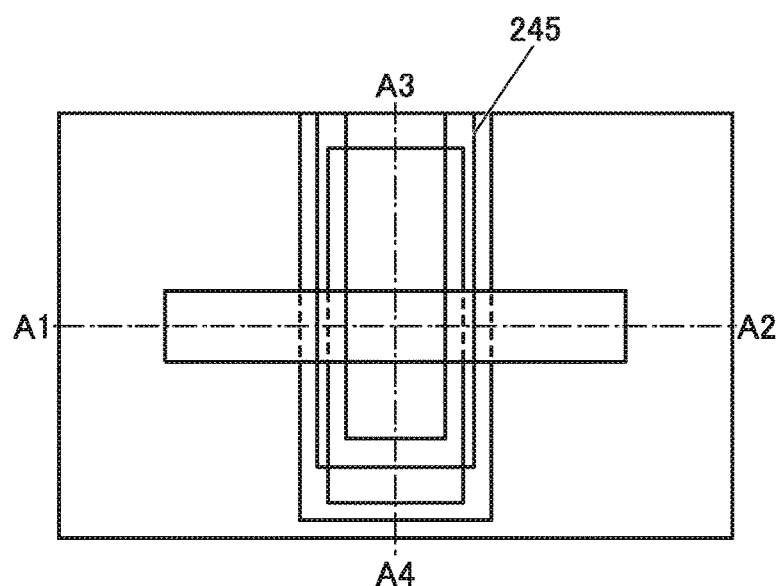
FIGS. 13A to 13C are a top view and cross-sectional views illustrating a method for manufacturing a semiconductor device of one embodiment of the present invention.
Figure 13C:
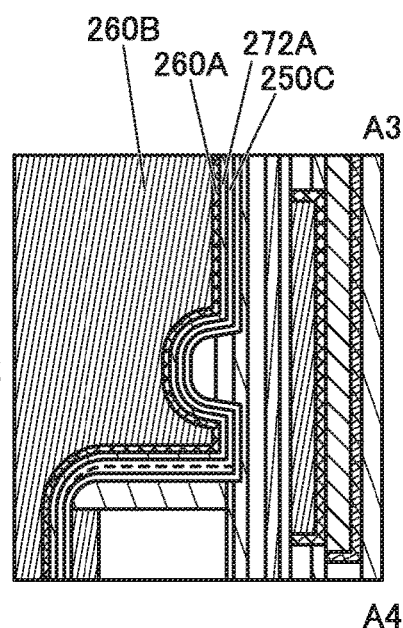
Figure 13B:
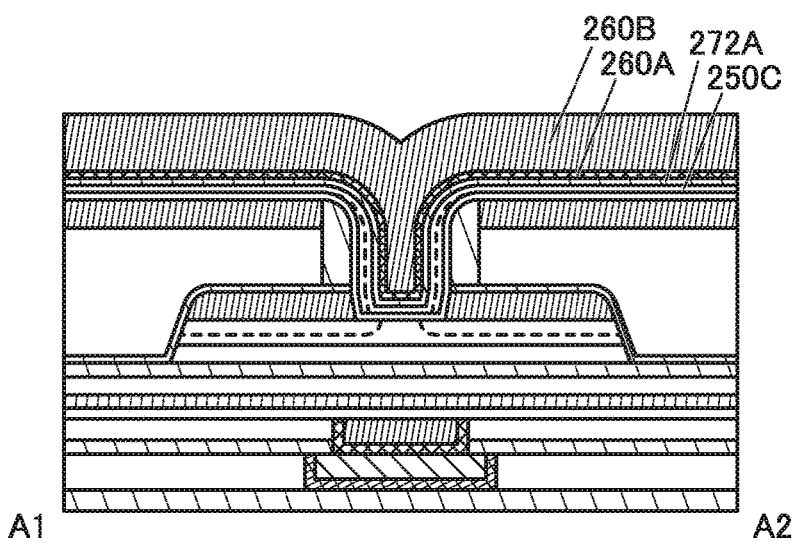

Next, an insulator 250C is formed to cover the oxide film 230C and the insulator 250B (see FIGS. 13A to 13C). The insulator 250C can be formed using an apparatus and a material that are similar to those used for the insulator 250A. Through the above steps, the insulator 250C is provided over the oxide 230b, and the insulator 250B and the insulator 250C can be provided at the side surface of the conductor 242. That is, the insulators at the side surface of the conductor 242 can be thicker than the insulator over the oxide 230b.

Then, the insulator 272A is preferably formed as illustrated in FIGS. 13A to 13C. When an insulating barrier is used for the insulator 272A, oxidation of the conductor 260 to be formed in a later step that functions as the gate electrode can be inhibited. By contrast, the insulator 272A does not always need to be provided in the case where the conductor 260 is formed using an oxidation-resistant material or in the case where a material that does not significantly lose its conductivity even after absorbing oxygen. The insulator 272A can be formed using an apparatus and a material that are similar to those used for the insulator 244A.

When the insulator 272A is formed in an oxygen gas atmosphere with a sputtering apparatus, oxygen can be introduced into the insulators 250B and 250C while the insulator 272A is formed. When an oxide of one or both of aluminum and hafnium that has a barrier property is used for the insulator 272A, excess oxygen introduced into the insulator 250B and the insulator 250C can be effectively sealed therein.

Next, a conductive film 260A and a conductive film 260B are sequentially formed (see FIGS. 13A to 13C). The conductive films 260A and 260B can be formed by a sputtering method, a CVD method, an MBE method, a PLD method, an ALD method, or the like. Titanium nitride may be formed as the conductive film 260A and tungsten may be formed as the conductive film 260B.

As the conductive film 260A, a metal nitride is preferably deposited by a CVD method or a sputtering method. With the use of a metal nitride for the conductive film 260A, the conductivity of the conductive film 260B can be prevented from being lowered because of oxidation of the conductive film 260B due to oxygen of the insulator 250C.

Furthermore, when a low-resistance metal film is stacked as the conductive film 260B, a transistor with a low driving voltage can be provided.

Subsequently, heat treatment can be performed. For the heat treatment, the conditions for the above heat treatment can be used. Note that the heat treatment is unnecessary in some cases. By the heat treatment, excess oxygen is added from the insulator 272A to the insulator 250A, whereby an excess-oxygen region can be easily formed in the insulator 250A. Furthermore, this heat treatment sometimes forms a low-resistance region (the region 243) in the oxide 230b.

Figure 14A:
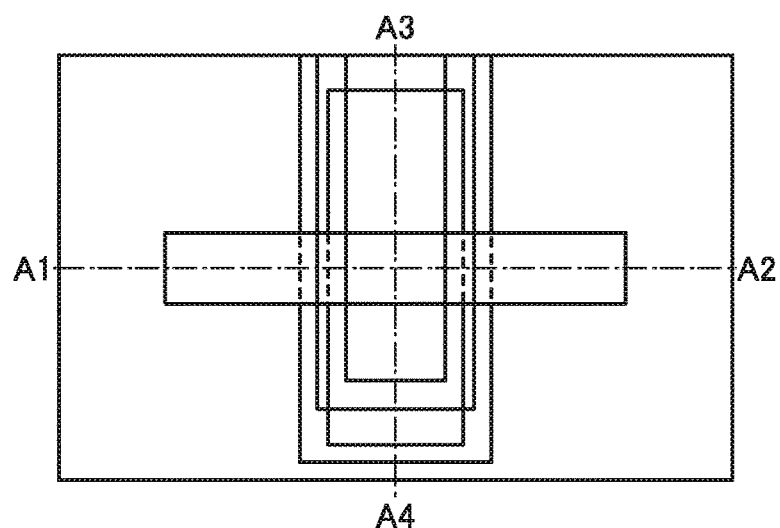
FIGS. 14A to 14C are a top view and cross-sectional views illustrating a method for manufacturing a semiconductor device of one embodiment of the present invention.
Figure 14C:
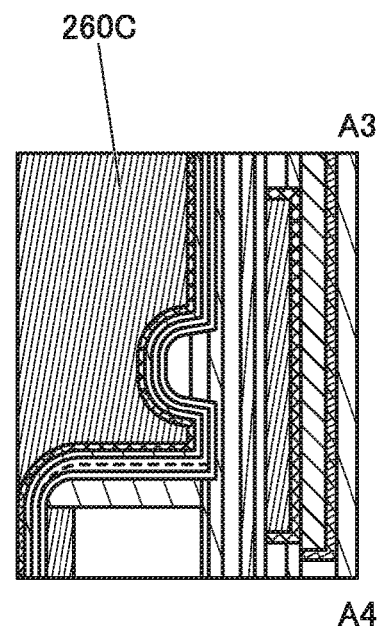
Figure 14B:
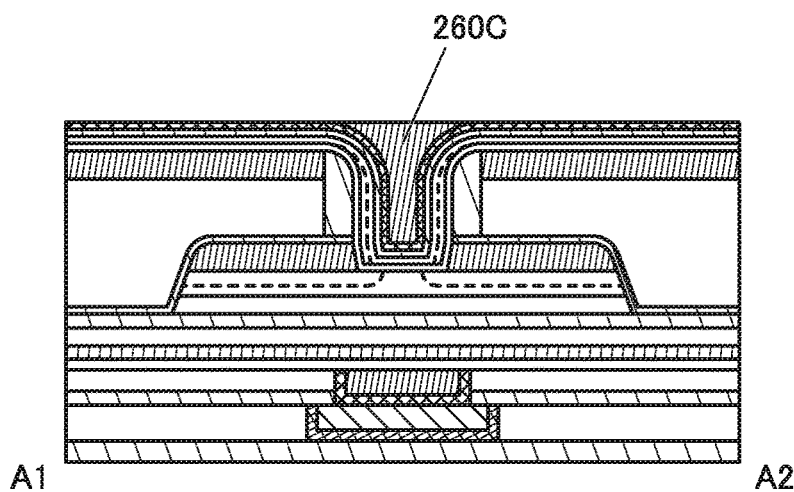

Next, the conductive film 260B is processed and subjected to planarization treatment, so that a conductor 260C is formed (see FIGS. 14A to 14C). In the planarization treatment, the conductive film 260B is polished using a CMP method or an etch-back method is used, for example.

Although FIGS. 14A to 14C illustrate an example where the conductive film 260B is processed until the conductive film 260A is exposed, one embodiment of the present invention is not limited to this example. As long as the surface of the conductive film 260B has planarity, the planarization treatment may be stopped before the conductive film 260A is exposed or the conductive film 260A may be processed until the insulator 272A is exposed.

Figure 15A:
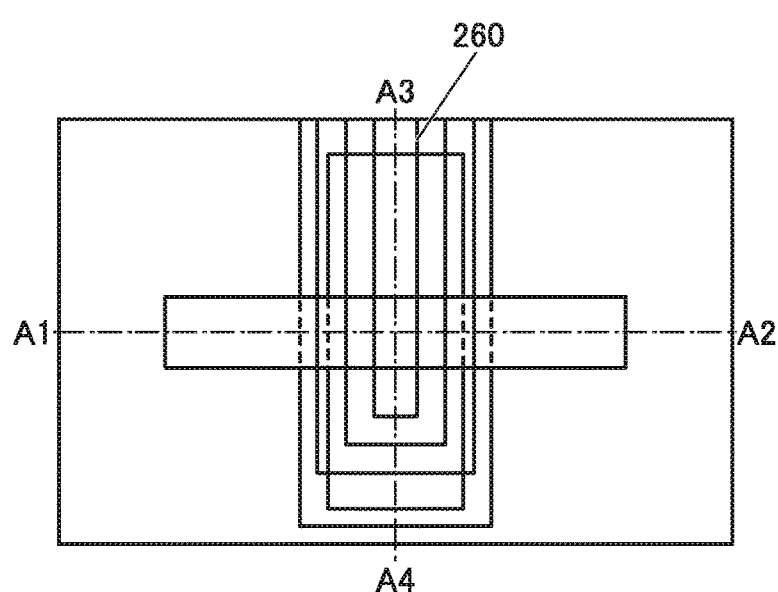
FIGS. 15A to 15C are a top view and cross-sectional views illustrating a method for manufacturing a semiconductor device of one embodiment of the present invention.
Figure 15C:
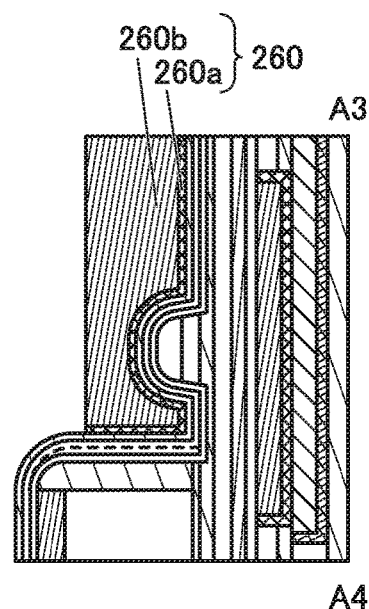
Figure 15B:
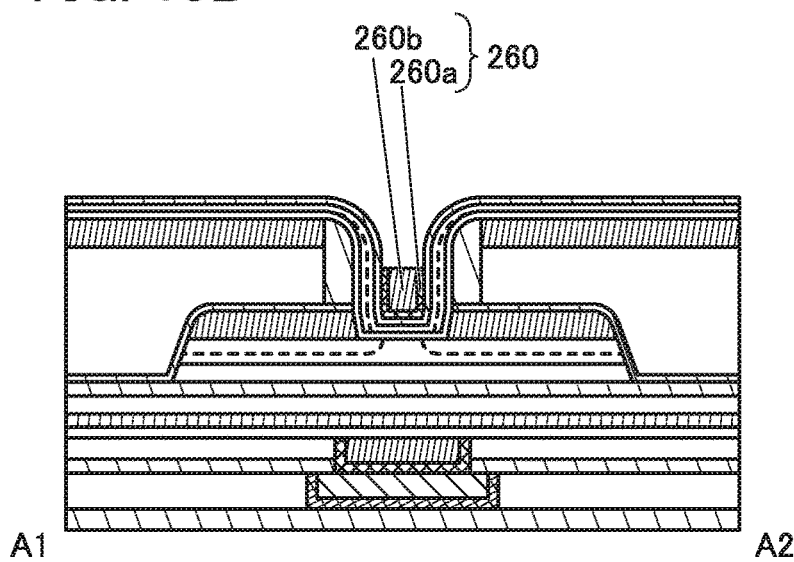

Then, the conductor 260C and the conductive film 260A are processed to form the conductor 260 (the conductor 260a and the conductor 260b) (see FIGS. 15A to 15C). Dry etching or wet etching can be used for the processing of the conductor 260C and the conductive film 260A. The processing is preferably performed so that a top surface of the conductor 260 is below a top surface of the insulator 280.

At this time, the conductor 260 is formed so that at least part thereof overlaps with the conductor 205, the oxide 230a, and the oxide 230b. The width of the conductor 260 in the channel length direction depends on the width of the opening 245 provided in the insulator 280, the width of the insulator 273, the thickness of the oxide film 230C, the thickness of the insulator 250B, the thickness of the insulator 250C, and the thickness of the insulator 272A. The conductor 260 with a desired width can be formed by adjusting the above widths and thicknesses in accordance with the performance required for the transistor 200 or the semiconductor device.

Through the above steps, the conductor 260 is formed to be embedded in the region between parts of the insulator 273 in the opening of the insulator 280, and in the region between the conductor 242a and the conductor 242b. The conductor 260 is formed in a self-aligned manner without using a lithography method; thus, alignment margin for the conductor 260 is unnecessary. Therefore, the footprint of the transistor 200 can be reduced and the miniaturization and high integration of the semiconductor device can be achieved. Furthermore, since the lithography process is not necessary, an improvement in productivity due to simplification of the process is expected.

The gate length needs to be short for miniaturization of the semiconductor device without reducing the conductivity of the conductor 260. When the conductor 260 is made thick to achieve this, the conductor 260 might have a shape with a high aspect ratio. Even when having a shape with a high aspect ratio, the conductor 260 can be formed without collapsing during the process because the conductor 260 is provided to be embedded in the opening of the insulator 280 in this embodiment.

Figure 16A:
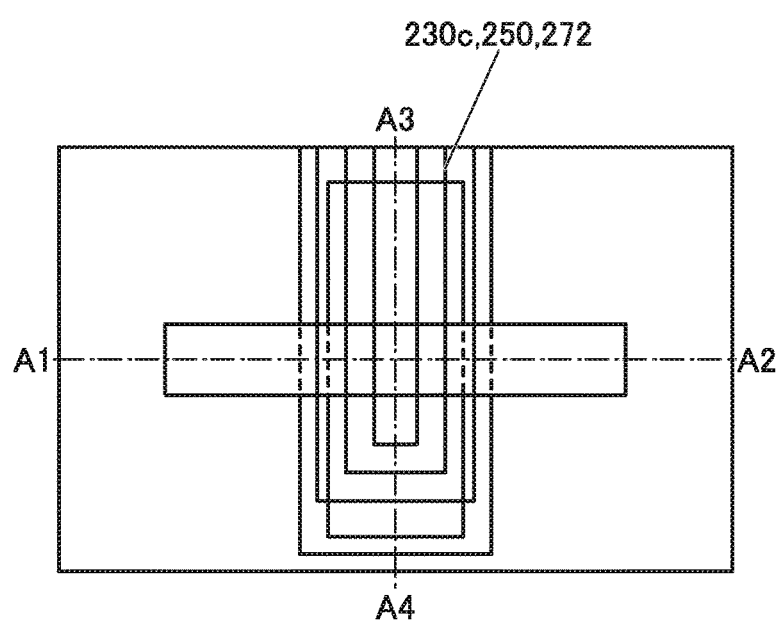
FIGS. 16A to 16C are a top view and cross-sectional views illustrating a method for manufacturing a semiconductor device of one embodiment of the present invention.
Figure 16C:
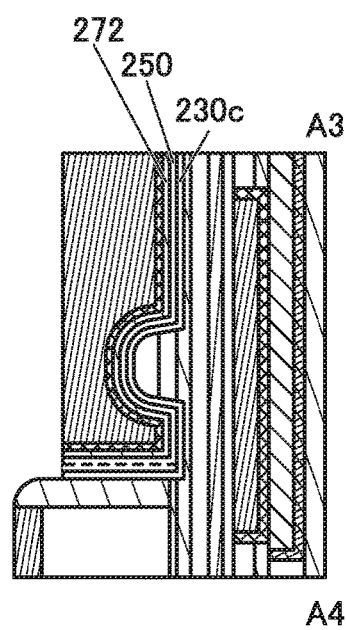
Figure 16B:
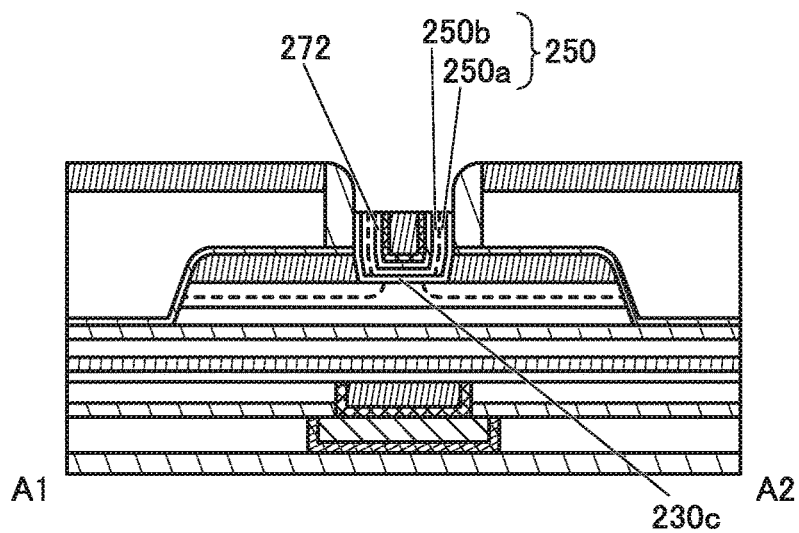

Next, the insulator 272A, the insulator 250C, the insulator 250B, and the oxide film 230C are sequentially processed to form the insulator 272, the insulator 250 (an insulator 250a and an insulator 250b), and the oxide 230c (see FIGS. 16A to 16C). Dry etching or wet etching can be employed for the processing. The top surfaces of the insulator 272, the insulator 250, and the oxide 230c preferably become substantially level with the top surface of the conductor 260 by the processing.

Figure 17A:
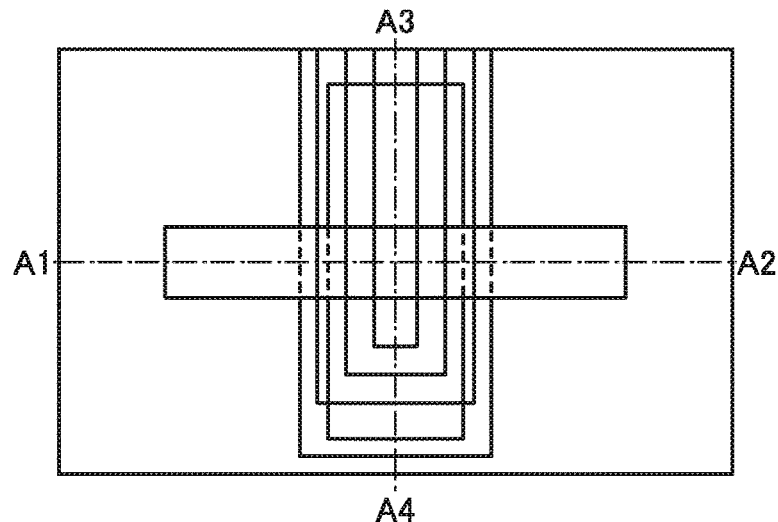
FIGS. 17A to 17C are a top view and cross-sectional views illustrating a method for manufacturing a semiconductor device of one embodiment of the present invention.
Figure 17C:
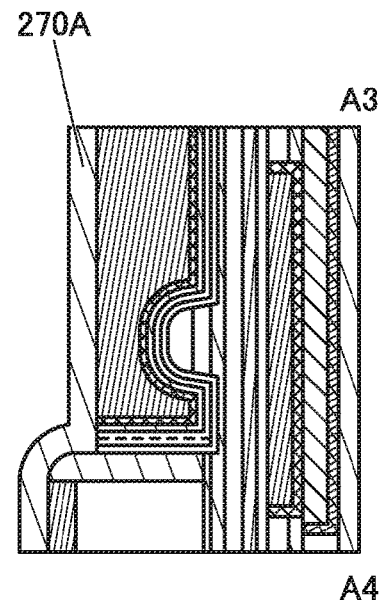
Figure 17B:
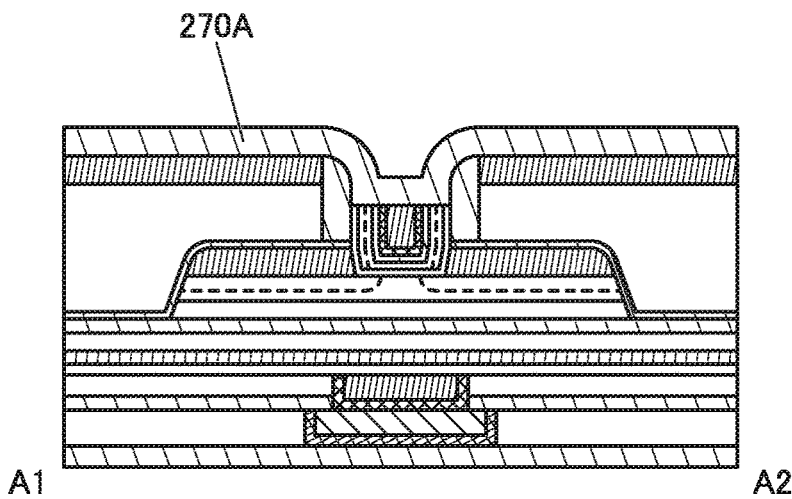

Next, an insulator 270A is formed so as to cover at least the conductor 260, the insulator 272, the insulator 250, and the oxide 230c and to be in contact with the insulator 273 (see FIGS. 17A to 17C). A metal oxide containing one or more of hafnium, aluminum, gallium, yttrium, zirconium, tungsten, titanium, tantalum, nickel, germanium, magnesium, and the like can be used as the insulator 270A. The insulator 270A can be formed by a sputtering method, a CVD method, an MBE method, a PLD method, an ALD method, or the like using a nitride of silicon or a nitride of silicon containing oxygen, i.e., silicon nitride, silicon nitride oxide, or the like.

Figure 18A:
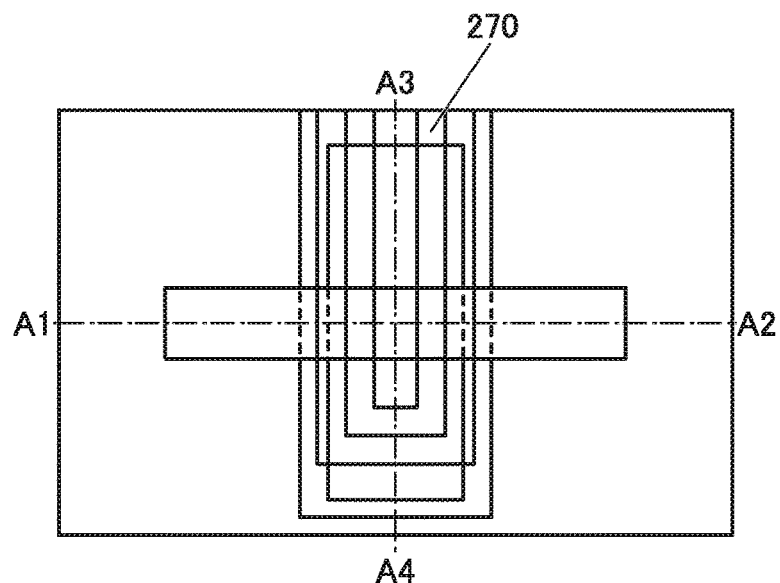
FIGS. 18A to 18C are a top view and cross-sectional views illustrating a method for manufacturing a semiconductor device of one embodiment of the present invention.
Figure 18C:
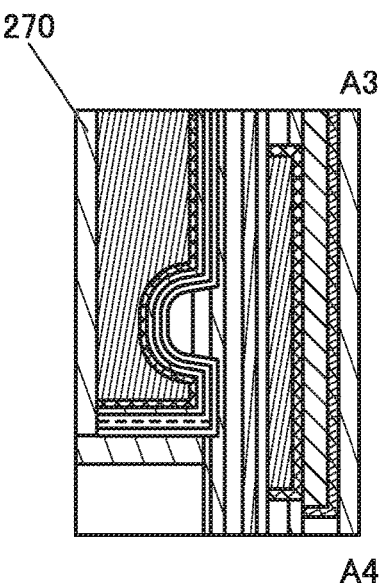
Figure 18B:
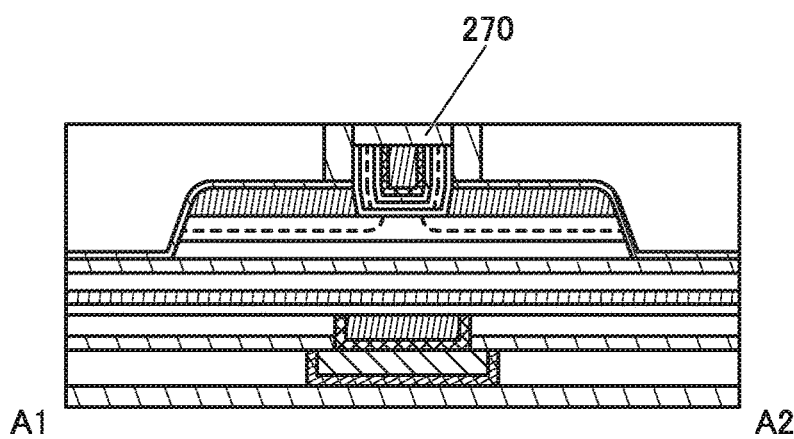

Then, the insulator 270A is polished until the insulator 280 is exposed, whereby the insulator 270 is formed (see FIGS. 18A to 18C). For the polishing, a CMP method can be used. The insulator 270 functions as the etching stopper over the conductor 260. By this step, the top surface and a side surface of the conductor 260 are surrounded by the insulator 273 and the insulator 270.

Here, heat treatment may be performed. For the heat treatment, the conditions for the above heat treatment can be used. By the heat treatment, oxygen contained in an insulator such as the insulator 250 can be supplied to the oxide 230. In addition, damage to the oxide 230b due to formation of the oxide 230c, the insulator 250, the insulator 272, the conductor 260, or the insulator 270 can be recovered. Furthermore, this heat treatment sometimes forms a low-resistance region (the region 243) in the oxide 230b.

By the above-described method, the thickness of the insulator 250 between the conductor 242 and the conductor 260 can be larger than that of the insulator 250 between the oxide 230b and the conductor 260. In this manner, the parasitic capacitance between the conductor 260 and the conductor 242 can be reduced and the transistor 200 can have high frequency characteristics.

Although the insulator 250 is formed using the insulator 250a and the insulator 250b in the method described in this embodiment, the manufacturing method of the semiconductor device described in this embodiment is not limited to this method. For example, in the step of anisotropic etching illustrated in FIGS. 12A to 12C, the region of the insulator 250A at the bottom portion of the opening 245 may be thinned, instead of being completely removed. In that case, the insulator 250 in which the thickness between the oxide 230b and the conductor 260 is smaller than the thickness between the conductor 242 and the conductor 260 can be formed with the use of only the insulator 250A.

Although the insulator 250 has a two-layer structure of the insulator 250a and the insulator 250b in this embodiment, the structure of the transistor 200 is not limited to this structure. The insulator 250 may include three or more layers in the case where the number of layers of the insulator 250 stacked between the conductor 242 and the conductor 260 is larger than the number of layers of the insulator 250 stacked between the oxide 230b and the conductor 260.

Figure 19A:
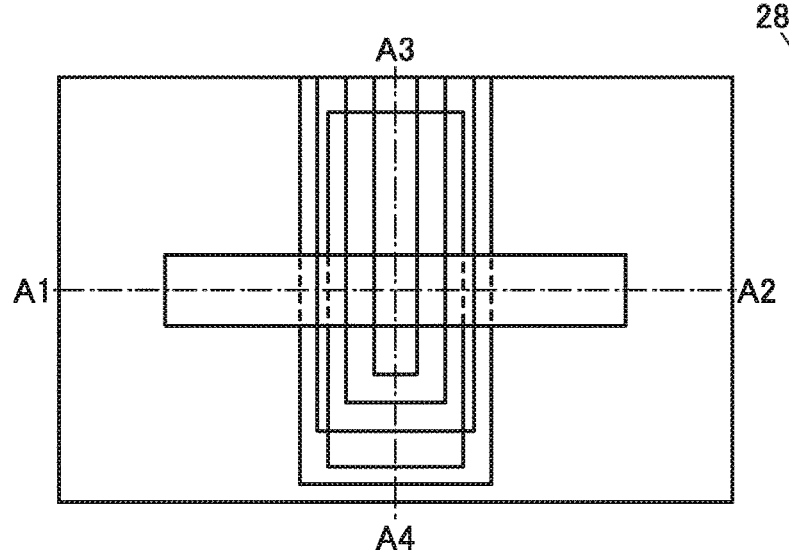
FIGS. 19A to 19C are a top view and cross-sectional views illustrating a method for manufacturing a semiconductor device of one embodiment of the present invention.
Figure 19C:
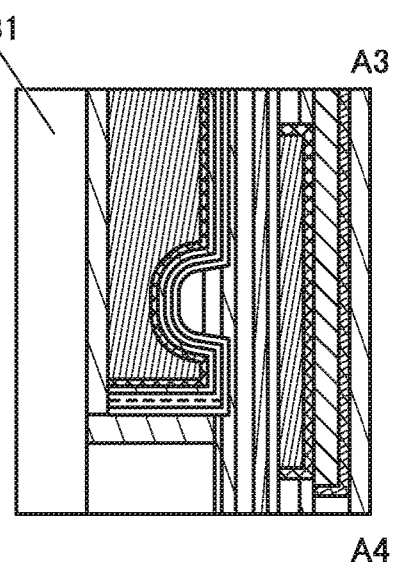
Figure 19B:
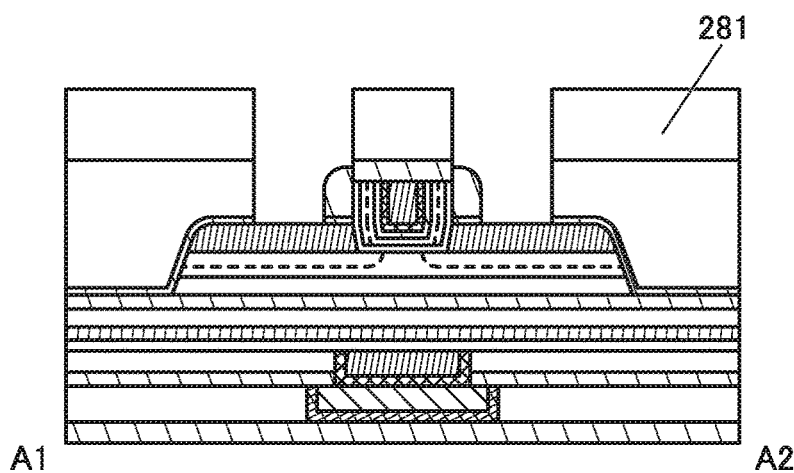

Then, the insulator 281 is formed to cover the insulator 280, the insulator 270, and the insulator 273 (see FIGS. 19A to 19C). The insulator 281 can be formed using an apparatus and a material that are similar to those used for the insulator 280. For example, the insulator 281 containing silicon oxynitride is formed by a CVD method.

Then, an opening reaching the conductor 242 is formed by processing the insulator 281, the insulator 280, and the insulator 244 by a lithography method (see FIGS. 19A to 19C). In the formation of the opening, part of the opening pattern of a mask preferably overlaps with the insulator 273, in which case the distance between the opening portion and the conductor 260 can be small and the degree of integration of the semiconductor device can be improved. Here, the etching rates of the insulator 273 and the insulator 270 are preferably sufficiently lower than the etching rates of the insulator 281 and the insulator 280.

In the formation of the opening, since the etching rates of the insulator 273 and the insulator 270 are sufficiently low, the progress of etching of the insulators 273 and 270 is inhibited even when they are inside the opening pattern, and the opening is formed along the side surface of the insulator 273. The contact as described above, which is formed using the insulator 273 and the insulator 270 respectively as the sidewall and the etching stopper, is referred to as a self-aligned contact (SAC), and the process for forming an SAC is referred to as an SAC process in some cases.

Next, the conductor 240 (the conductor 240a and the conductor 240b) is formed to be embedded in the opening; thus, the transistor 200 illustrated in FIGS. 1A to 1C can be formed.

The opening is formed through an SAC process in this embodiment, whereby the space between the conductor 260 and the conductor 240 is constant.

Through the above process, the semiconductor device including the transistor 200 can be manufactured. By the method for manufacturing a semiconductor device which is described in this embodiment and is illustrated in FIGS. 4A to 4C to FIGS. 19A to 19C, the transistor 200 can be formed.

According to one embodiment of the present invention, a semiconductor device with favorable electrical characteristics can be provided. Alternatively, according to one embodiment of the present invention, a semiconductor device with a low off-state current can be provided. Alternatively, according to one embodiment of the present invention, a semiconductor device with a high on-state current can be provided. Alternatively, according to one embodiment of the present invention, a semiconductor device with high reliability can be provided. Alternatively, according to one embodiment of the present invention, a semiconductor device that can be miniaturized or highly integrated can be provided. Alternatively, according to one embodiment of the present invention, a semiconductor device with low power consumption can be provided. Alternatively, according to one embodiment of the present invention, a semiconductor device with high productivity can be provided.

As described above, the components, methods, and the like described in this embodiment can be combined with any of the components, methods, and the like described in the other embodiments as appropriate.

Modified Example 1 of Semiconductor Device

An example of a semiconductor device including the transistor 200 of one embodiment of the present invention which is different from the semiconductor device described in <Structure example of semiconductor device> will be described below with reference to FIGS. 20A and 20B.

Figure 20A:
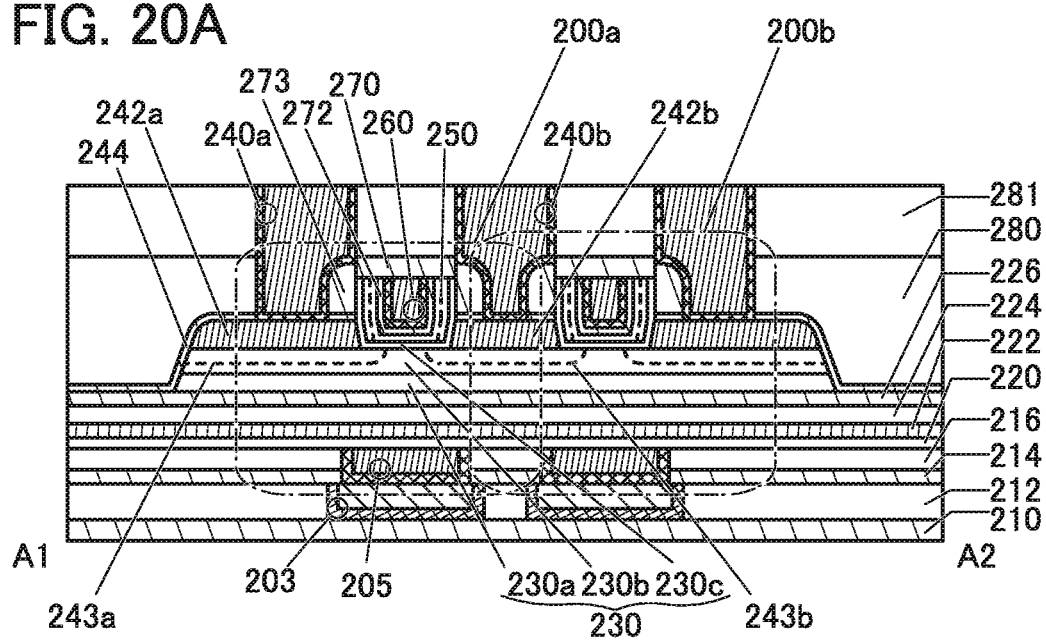
FIGS. 20A and 20B are cross-sectional views of semiconductor devices of embodiments of the present invention.

FIG. 20A is a cross-sectional view of a semiconductor device in which a transistor 200a and a transistor 200b are connected in series. Here, the transistor 200a and the transistor 200b include the oxide 230, and one of a source and a drain of the transistor 200a and one of a source and a drain of the transistor 200b are electrically connected to the conductor 240. In this manner, the transistor 200a and the transistor 200b share a contact portion, which reduces the number of plugs and contact holes. Sharing a wiring which is electrically connected to one of a source and a drain as described above can further reduce the area occupied by a memory cell array.

Figure 20B:
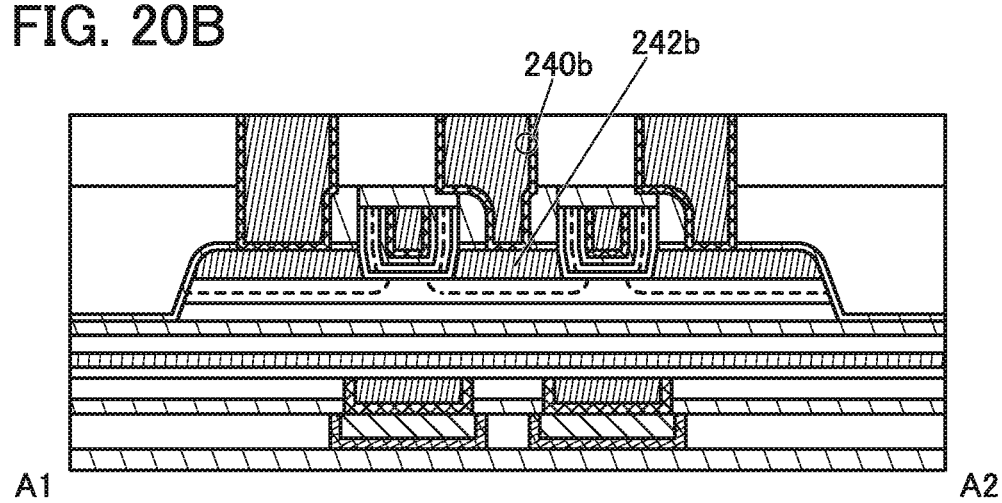

Note that in the semiconductor device illustrated in FIGS. 20A and 20B, components having the same functions as the components in the semiconductor device described in <Structure example of semiconductor device> (see FIGS. 1A to 1C) are denoted by the same reference numerals.

The transistor 200a and the transistor 200b share the conductor 242b, and the conductor 242b is electrically connected to the conductor 240b in a self-aligned manner in the region that overlaps with neither the insulator 273 of the transistor 200a nor the insulator 273 of the transistor 200b.

FIG. 20B illustrates an example of the case where a mask used in the lithography method for forming the openings exposing part of the conductor 242 is misaligned in the A1 direction. Since the contact with the conductor 242b is formed in a self-aligned manner, the contact area between the conductor 242b and the conductor 240b that is the same as the contact area between the conductor 242b and the conductor 240b shown in FIG. 20A can be obtained and the contact resistance does not increase, even when mask misalignment like the case illustrated in FIG. 20B occurs.

Modified Example 2 of Semiconductor Device

An example of a semiconductor device including the transistor 200 of one embodiment of the present invention which is different from the semiconductor device described in <Structure example of semiconductor device> will be described below with reference to FIGS. 21A to 21C.

Figure 21A:
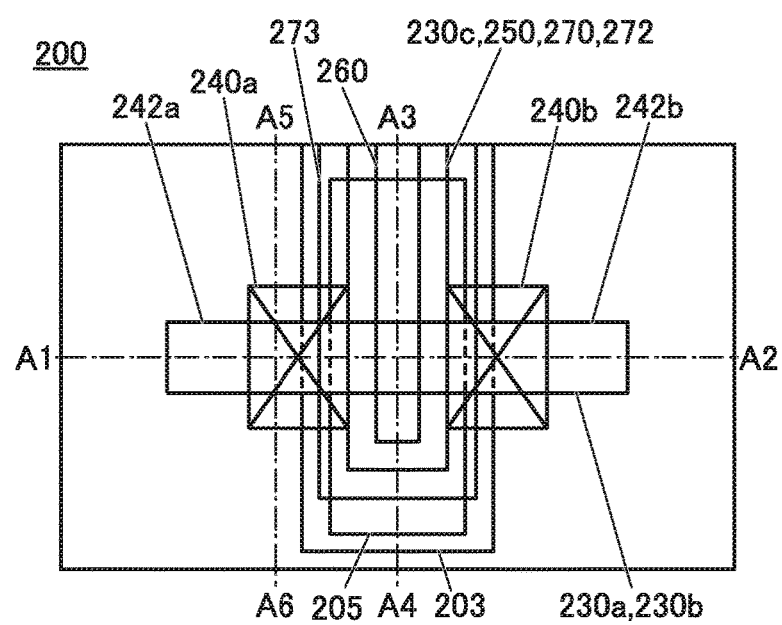
FIGS. 21A to 21C are a top view and cross-sectional views of a semiconductor device of one embodiment of the present invention.

FIG. 21A is a top view of the semiconductor device including the transistor 200. FIGS. 21B and 21C are cross-sectional views of the semiconductor device. FIG. 21B is a cross-sectional view taken along dashed-dotted line A1-A2 in FIG. 21A, which corresponds to a cross-sectional view in the channel length direction of the transistor 200. FIG. 21C is a cross-sectional view taken along dashed-dotted line A3-A4 in FIG. 21A, which corresponds to a cross-sectional view in the channel width direction of the transistor 200. For simplification of the drawing, some components are not illustrated in the top view in FIG. 21A.

Figure 21C:
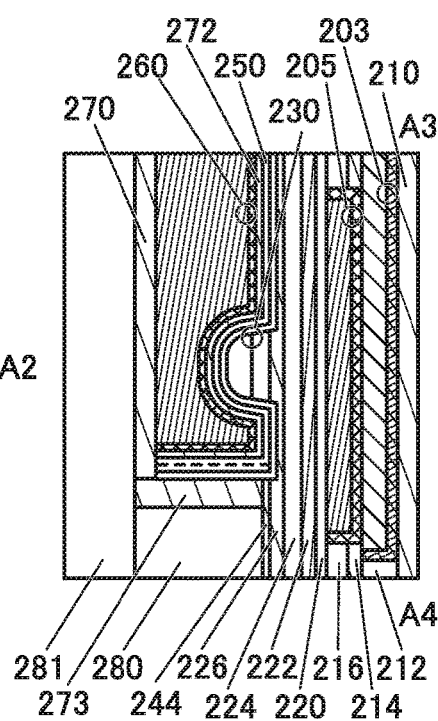
Figure 21B:
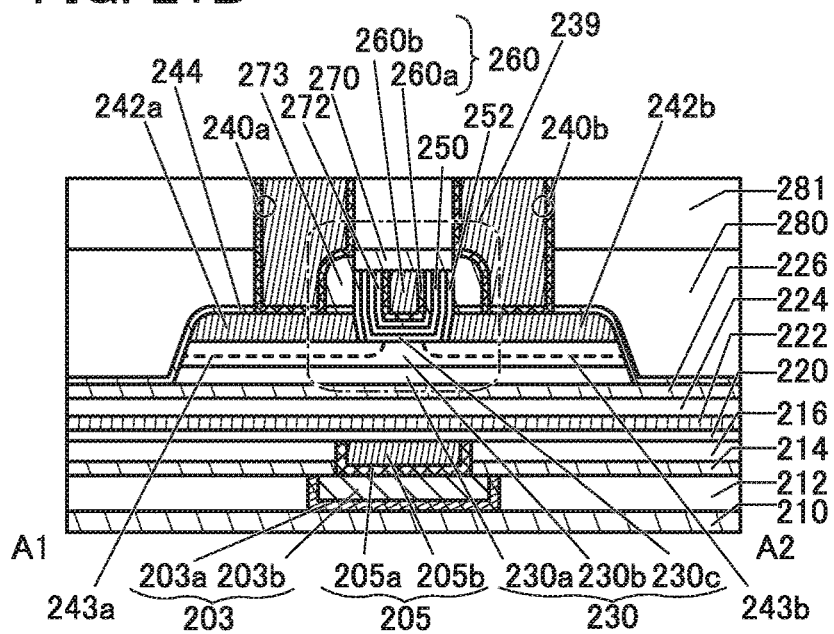

Note that in the semiconductor device illustrated in FIGS. 21A to 21C, components having the same functions as the components in the semiconductor device described in <Structure example of semiconductor device> (see FIGS. 1A to 1C) are denoted by the same reference numerals.

The structure of the transistor 200 is described below with reference to FIGS. 21A to 21C. Note that also in this section, the materials described in detail in <Structure example of semiconductor device> can be used as materials of the transistor 200.

The semiconductor device illustrated in FIGS. 21A to 21C is different from the semiconductor device described in <Structure example of semiconductor device> (see FIGS. 1A to 1C) in that an insulator 252 is provided between the conductor 242 and the oxide 230c. Furthermore, it is preferable that the insulator 252 extend to between the insulator 244 and the oxide 230c and to between the insulator 273 and the oxide 230c and be in contact with the bottom portion of the insulator 270. The insulator 252 can keep the conductor 260 well away from the conductor 242, whereby the parasitic capacitance between the conductors can be reduced. In that case, the thickness of the insulator 250 between the oxide 230b and the conductor 260 and that between the conductor 242 and the conductor 260 may be substantially equal to each other, and the film structure or stacked-layer structure of the insulator 250 between the oxide 230b and the conductor 260 does not need to be different from that between the conductor 242 and the conductor 260.

Note that the insulator 252 can be formed using the same material as the insulator 222, the insulator 226, the insulator 244, the insulator 272, or the insulator 270. It is particularly preferable to use an oxide containing one of aluminum and hafnium. The insulator 252 can prevent oxygen absorption at the side surface of the conductor 242 and a reduction in conductivity of the conductor 242 due to oxidation.

The insulator 252 is formed at the side surfaces of the conductor 242, the insulator 244, and the insulator 273 in the following manner: an insulating film to be the insulator 252 is formed and subjected to anisotropic etching after the formation of the conductor 242a and the conductor 242b in FIGS. 10A to 10C and before the formation of the oxide film 230C.

Modified Example 3 of Semiconductor Device

An example of a semiconductor device including the transistor 200 of one embodiment of the present invention which is different from the semiconductor device described in <Structure example of semiconductor device> will be described below with reference to FIGS. 22A to 22C.

Figure 22A:
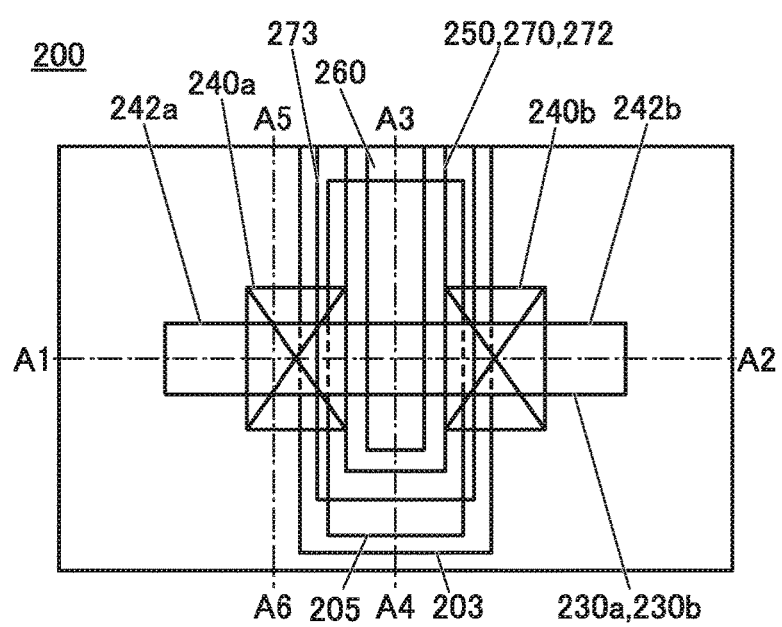
FIGS. 22A to 22C are a top view and cross-sectional views of a semiconductor device of one embodiment of the present invention.

FIG. 22A is a top view of the semiconductor device including the transistor 200. FIGS. 22B and 22C are cross-sectional views of the semiconductor device. FIG. 22B is a cross-sectional view taken along dashed-dotted line A1-A2 in FIG. 22A, which corresponds to a cross-sectional view in the channel length direction of the transistor 200. FIG. 22C is a cross-sectional view taken along dashed-dotted line A3-A4 in FIG. 22A, which corresponds to a cross-sectional view in the channel width direction of the transistor 200. For simplification of the drawing, some components are not illustrated in the top view in FIG. 22A.

Figure 22C:
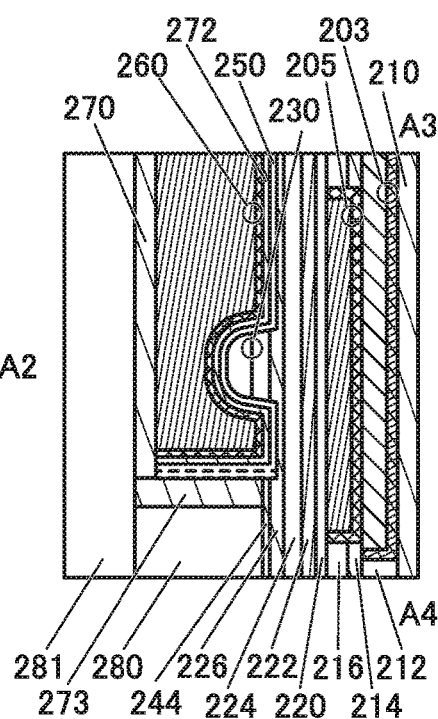
Figure 22B:
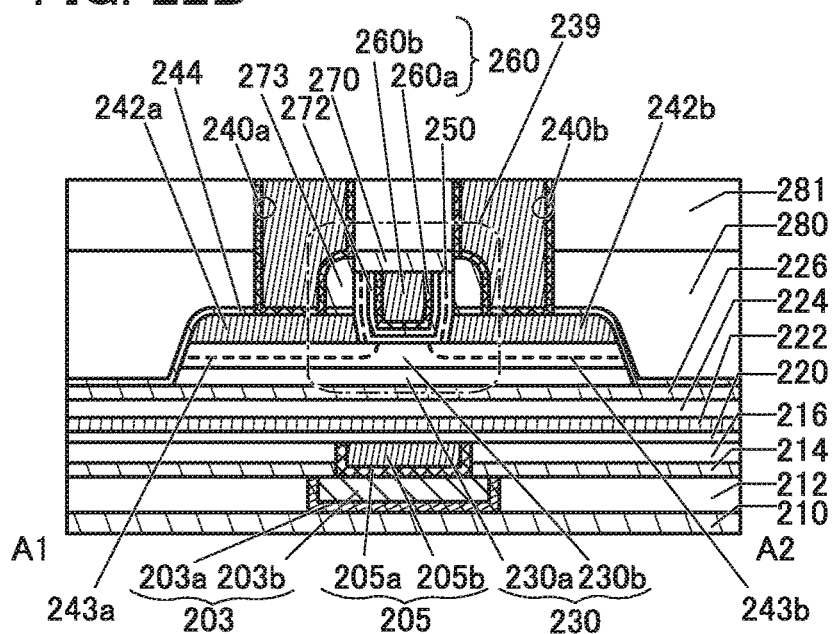

Note that in the semiconductor device illustrated in FIGS. 22A to 22C, components having the same functions as the components in the semiconductor device described in <Structure example of semiconductor device> (see FIGS. 1A to 1C) are denoted by the same reference numerals.

The structure of the transistor 200 is described below with reference to FIGS. 22A to 22C. Note that also in this section, the materials described in detail in <Structure example of semiconductor device> can be used as materials of the transistor 200.

The semiconductor device illustrated in FIGS. 22A to 22C is different from the semiconductor device described in <Structure example of semiconductor device> (see FIGS. 1A to 1C) in that the transistor 200 does not include the oxide 230c. Depending on the characteristics required for the semiconductor device including the transistor 200, the oxide 230c is not necessarily provided.

In that case, the width of the conductor 260 in the A1-A2 direction with respect to the opening 245 formed in the insulator 280 is large. Therefore, the width of the conductor 260 may be adjusted by adjusting the size of the opening 245 or the thickness of the insulator 273A (see FIGS. 7A to 7C and FIGS. 8A to 8C).

Modified Example 4 of Semiconductor Device

An example of a semiconductor device including the transistor 200 of one embodiment of the present invention which is different from the semiconductor device described in <Structure example of semiconductor device> will be described below with reference to FIGS. 23A to 23C.

Figure 23A:
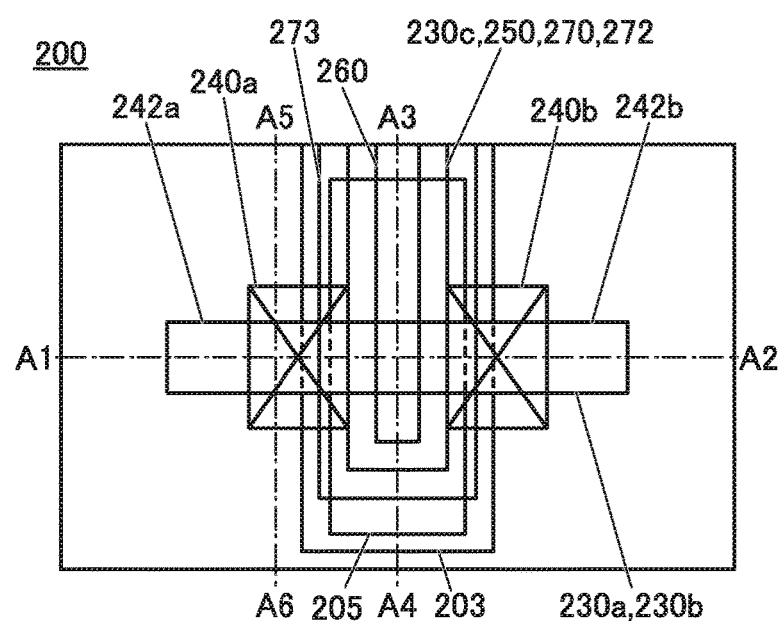
FIGS. 23A to 23C are a top view and cross-sectional views of a semiconductor device of one embodiment of the present invention.

FIG. 23A is a top view of the semiconductor device including the transistor 200. FIGS. 23B and 23C are cross-sectional views of the semiconductor device. FIG. 23B is a cross-sectional view taken along dashed-dotted line A1-A2 in FIG. 23A, which corresponds to a cross-sectional view in the channel length direction of the transistor 200. FIG. 23C is a cross-sectional view taken along dashed-dotted line A3-A4 in FIG. 23A, which corresponds to a cross-sectional view in the channel width direction of the transistor 200. For simplification of the drawing, some components are not illustrated in the top view in FIG. 23A.

Figure 23C:
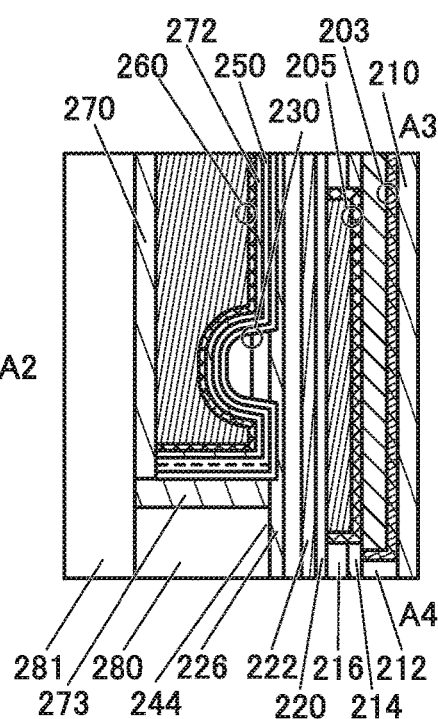
Figure 23B:
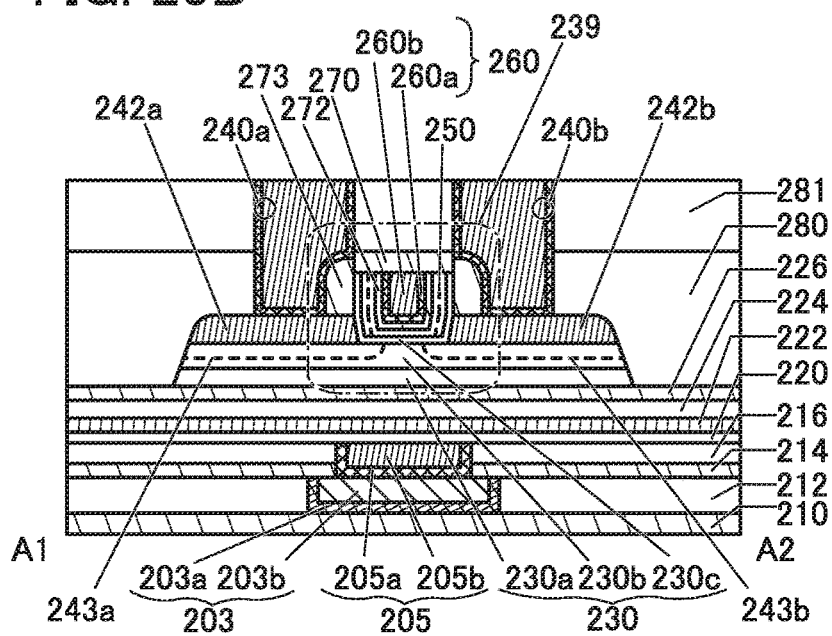

Note that in the semiconductor device illustrated in FIGS. 23A to 23C, components having the same functions as the components in the semiconductor device described in <Structure example of semiconductor device> (see FIGS. 1A to 1C) are denoted by the same reference numerals.

The structure of the transistor 200 is described below with reference to FIGS. 23A to 23C. Note that also in this section, the materials described in detail in <Structure example of semiconductor device> can be used as materials of the transistor 200.

The semiconductor device illustrated in FIGS. 23A to 23C is different from the semiconductor device described in <Structure example of semiconductor device> (see FIGS. 1A to 1C) in that the transistor 200 does not include the insulator 244. The insulator 244 has at least a function of inhibiting passage of oxygen, thereby inhibiting oxidation of the conductor 242. However, the structure without the insulator 244 as illustrated in FIGS. 23A to 23C may be employed in the case where the conductor 242 is formed using a material that does not easily absorb oxygen or a material that does not significantly lose its conductivity even after absorbing oxygen.

In that case, etching of the insulator 244A that is illustrated in FIGS. 10A to 10C and etching of the insulator 244 for forming the openings exposing the conductor 242 that is illustrated in FIGS. 19A to 19C are unnecessary and the process can be simplified.

As the material that does not easily absorb oxygen or the material that does not significantly lose its conductivity even after absorbing oxygen, tantalum nitride, titanium nitride, a nitride containing titanium and aluminum, a nitride containing tantalum and aluminum, ruthenium oxide, ruthenium nitride, an oxide containing strontium and ruthenium, an oxide containing lanthanum and nickel, or the like can be used.

The structures, the methods, and the like described in this embodiment can be combined as appropriate with any of the structures, the methods, and the like described in the other embodiments.

Embodiment 2

In this embodiment, a mode of a semiconductor device that functions as a memory device and is different from one in the above embodiment is described with reference to FIGS. 24A and 24B, FIG. 25, FIG. 26, and FIG. 27.

<Memory Device 1>

Figure 24A:
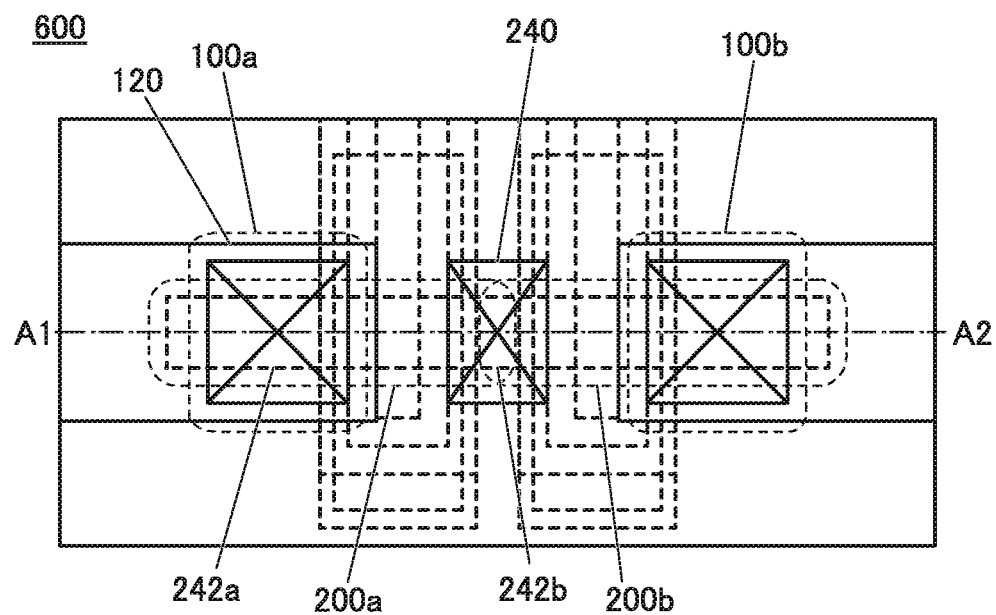
FIGS. 24A and 24B are a top view and a cross-sectional view of a memory device of one embodiment of the present invention.
Figure 24B:
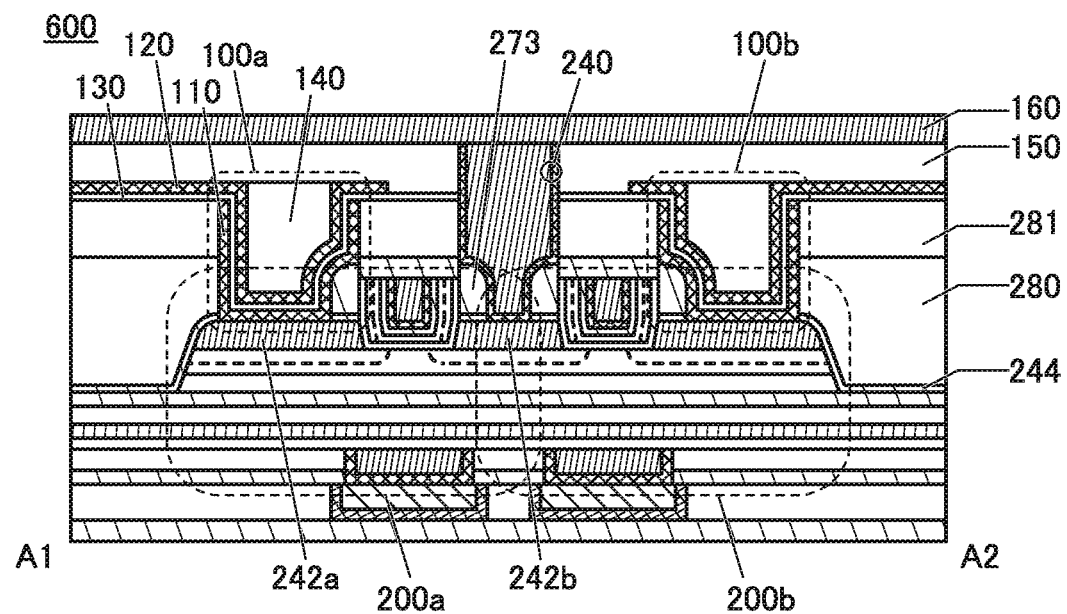

FIGS. 24A and 24B illustrate a cell 600 included in a memory device. The cell 600 includes the transistor 200a, the transistor 200b, a capacitor 100a, and a capacitor 100b. FIG. 24A is a top view of the cell 600. FIG. 24B is a cross-sectional view taken along dashed-dotted line A1-A2 in FIG. 24A. Note that for simplification of the drawing, some components are not illustrated in the top view of FIG. 24A.

The cell 600 includes the transistor 200a, the transistor 200b, the capacitor 100a that overlaps with the transistor 200a, and the capacitor 100b that overlaps with the transistor 200b. In the cell 600, the transistor 200a is axisymmetric to the transistor 200b and the capacitor 100a is axisymmetric to the capacitor 100b in some cases. It is thus preferable that the transistor 200a and the transistor 200b have similar structures and the capacitor 100a and the capacitor 100b have similar structures.

An insulator 130 is provided over the insulator 281 over the transistor 200a and the transistor 200b, and an insulator 150 is provided over the insulator 130. An insulator that can be used as the insulator 281 may be used as the insulator 150.

A conductor 160 is provided over the insulator 150. The conductor 240 is provided to be embedded in the opening formed in the insulator 280, the insulator 281, the insulator 130, and the insulator 150. A bottom surface of the conductor 240 is in contact with the conductor 242b and the top surface of the conductor 240 is in contact with the conductor 160. The conductor 240 is in contact with the top surface and the side surface of the insulator 273 and is electrically connected to the conductor 242b.

The transistor 200 described in the above embodiment can be applied to the transistors 200a and 200b. Therefore, the above description of the transistor 200 can be referred to for the structures of the transistor 200a and the transistor 200b. In FIGS. 24A and 24B, reference numerals for the components of the transistors 200a and 200b are not shown. Note that the transistor 200a and the transistor 200b in FIGS. 24A and 24B are only examples and the transistor 200a and the transistor 200b are not limited to the structures illustrated therein, and an appropriate transistor may be used in accordance with a circuit configuration or a driving method.

The transistor 200a and the transistor 200b include the oxide 230, and one of a source and a drain of the transistor 200a and one of a source and a drain of the transistor 200b are in contact with the conductor 242b. Accordingly, one of the source and the drain of the transistor 200a and one of the source and the drain of the transistor 200b are electrically connected to the conductor 240. In this manner, the transistor 200a and the transistor 200b share a contact portion, which reduces the number of plugs and contact holes. Sharing a wiring which is electrically connected to one of a source and a drain as described above can further reduce the area occupied by a memory cell array.

[Capacitor 100a and Capacitor 100b]

As illustrated in FIGS. 24A and 24B, the capacitor 100a is provided in a region overlapping with the transistor 200a. In a similar manner, the capacitor 100b is provided in a region overlapping with the transistor 200b. Note that components of the capacitor 100b correspond to those of the capacitor 100a. The structure of the capacitor 100a is described in detail below, and unless otherwise specified, the description for the capacitor 100a can be referred to for the capacitor 100b.

The capacitor 100a includes a conductor 110, the insulator 130, and a conductor 120 over the insulator 130. Here, for the conductor 110 and the conductor 120, a conductor that can be used for the conductor 203, the conductor 205, the conductor 260, or the like can be used.

The capacitor 100a is formed in an opening provided in the insulator 244, the insulator 280, and the insulator 281. At a bottom surface and a side surface of the opening, the conductor 110 functioning as a lower electrode and the conductor 120 functioning as an upper electrode face each other with the insulator 130 as a dielectric positioned therebetween. Here, the conductor 110 of the capacitor 100a is formed in contact with the conductor 242a of the transistor 200a.

Here, with the deeper opening in the insulator 280 and the insulator 281, the capacitor 100a can have increased capacitance without an increase in its projected area. Therefore, the capacitor 100a preferably has a cylinder shape (i.e., the side surface area is larger than the bottom surface area).

The above structure allows the capacitance per unit area of the capacitor 100a to be high, which enables further miniaturization and higher integration of the semiconductor device. The capacitance value of the capacitor 100a can be appropriately set by adjusting the thicknesses of the insulator 280 and the insulator 281. Thus, a semiconductor device with high design flexibility can be provided.

The insulator 130 is preferably formed using an insulator having a high dielectric constant. For example, an insulator including an oxide of one of or both aluminum and hafnium can be used. Aluminum oxide, hafnium oxide, an oxide containing aluminum and hafnium (hafnium aluminate), or the like is preferably used for the insulator including an oxide of one of or both aluminum and hafnium.

The insulator 130 may have a stacked-layer structure of, for example, two or more of silicon oxide, silicon oxynitride, silicon nitride oxide, silicon nitride, aluminum oxide, hafnium oxide, an oxide containing aluminum and hafnium (hafnium aluminate), and the like. For example, it is preferable that hafnium oxide, aluminum oxide, and hafnium oxide be formed in this order by an ALD method to form a layered structure. The hafnium oxide and the aluminum oxide each have a thickness of greater than or equal to 0.5 nm and less than or equal to 5 nm. With such a layered structure, the capacitor 100a can have a large capacitance value and a low leakage current.

The conductor 110 or 120 may have a layered structure. For example, the conductor 110 or 120 may have a layered structure of a conductive material containing titanium, titanium nitride, tantalum, or tantalum nitride as its main component and a conductive material containing tungsten, copper, or aluminum as its main component. The conductor 110 or 120 may have a single-layer structure or a layered structure of three or more layers.

Furthermore, in the opening where the capacitor 100a is formed, an insulator 140 is preferably formed inward from the conductor 120. Here, an insulator that can be used as the insulator 281 may be used as the insulator 140. In addition, a top surface of the insulator 140 is preferably substantially level with a top surface of the conductor 120. However, one embodiment of the present invention is not limited to this example; for example, the conductor 120 with a large thickness may fill the opening, or the insulator 150 may be formed in a state where an opening is provided inward from the conductor 120 so as to fill the opening.

[Configuration of Cell Array]

Next, an example of a cell array in which the above-described cell is arranged in a matrix is described with reference to FIG. 25, FIG. 26, and FIG. 27.

Figure 25:
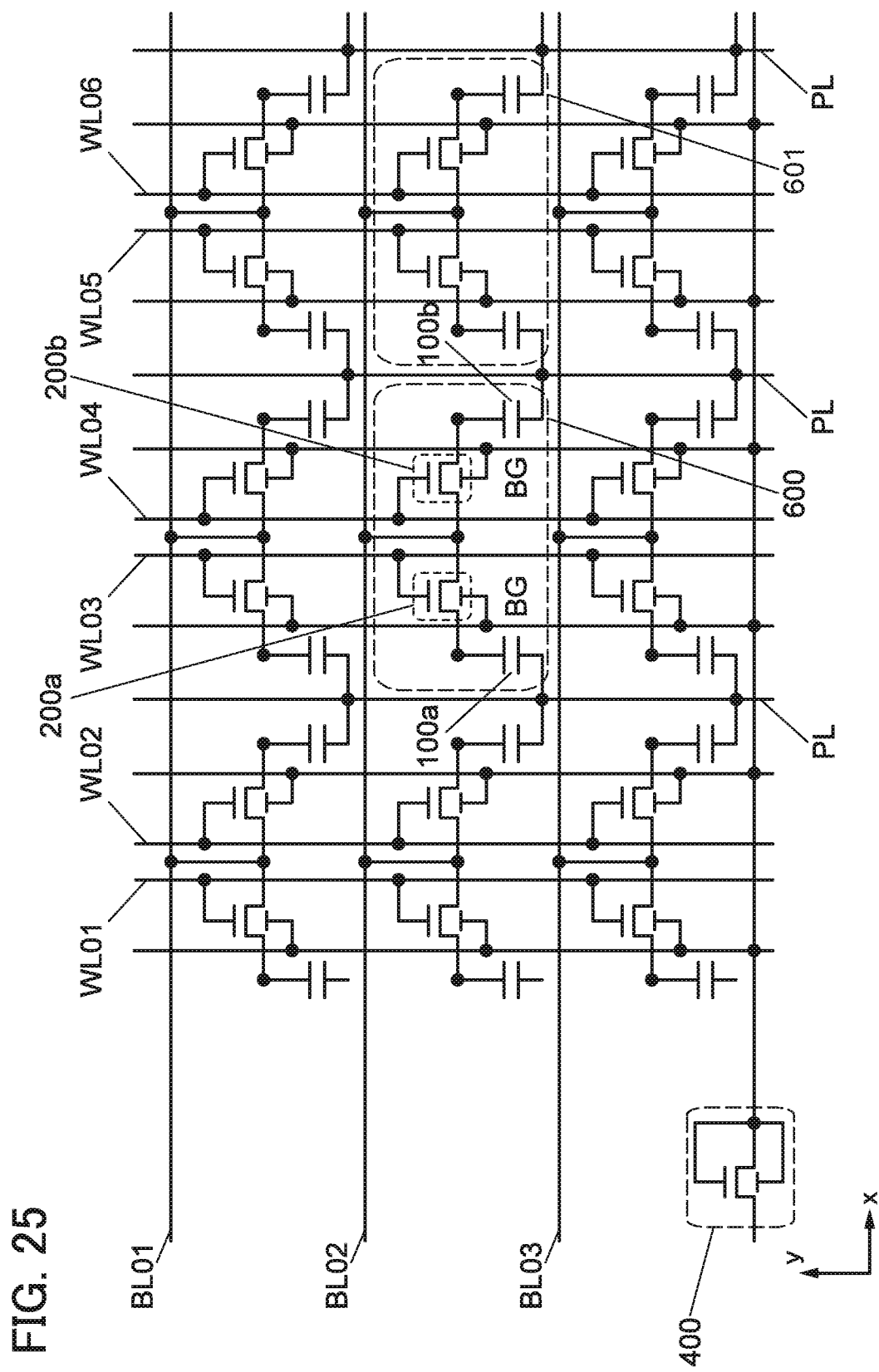
FIG. 25 is a circuit diagram of a memory device of one embodiment of the present invention.

FIG. 25 is a circuit diagram showing one mode in which the cell in FIGS. 24A and 24B is arranged in a matrix. FIG. 26 is a schematic view illustrating a cross-sectional structure of the cell 600 in the circuit diagram of FIG. 25, a cell 601 adjacent to the cell 600, and their vicinities. FIG. 27 is a schematic view illustrating a layout of a wiring WL and a wiring BL in the circuit diagram of FIG. 25 and the oxide 230. In FIG. 25, FIG. 26, and FIG. 27, the extending direction of the wiring BL is the x-direction, the extending direction of the wiring WL is the y-direction, and the direction perpendicular to the x-y plane is the z-direction. Although FIG. 25 and FIG. 27 illustrate the example in which the cells are arranged in a 3×3 matrix, this embodiment is not limited to this example; the number and position of the memory cells, wirings, or the like included in the cell array are appropriately set. For simplification of the drawing, some components illustrated in FIG. 25 are not illustrated in the top view in FIG. 27.

As illustrated in FIG. 25, one of the source and the drain of each of the transistor 200a and the transistor 200b which are included in the cell is electrically connected to the common wiring BL (BL01, BL02, and BL03). Furthermore, the wirings BL are also electrically connected to one of the source and the drain of each of the transistors 200a and 200b included in the cells 600 arranged in the x-direction. By contrast, the first gates of the transistor 200a and the transistor 200b included in the cells 600 are electrically connected to different wirings WLs (WL01 to WL06). Furthermore, these wirings WL are electrically connected to the first gates of the transistors 200a and the first gates of the transistors 200b which are included in the cells 600 arranged in the y-direction.

Furthermore, one electrode of the capacitor 100a and one electrode of the capacitor 100b in the cell 600 are electrically connected to wirings PL. For example, the wirings PL are formed to extend in the y-direction.

In addition, the transistors 200a and 200b included in the cells 600 may each be provided with a second gate BG. The threshold voltage of the transistor can be controlled by a potential applied to the second gate BG. The second gate BG is connected to a transistor 400 and the potential applied to the second gate BG can be controlled by the transistor 400.

Figure 26:
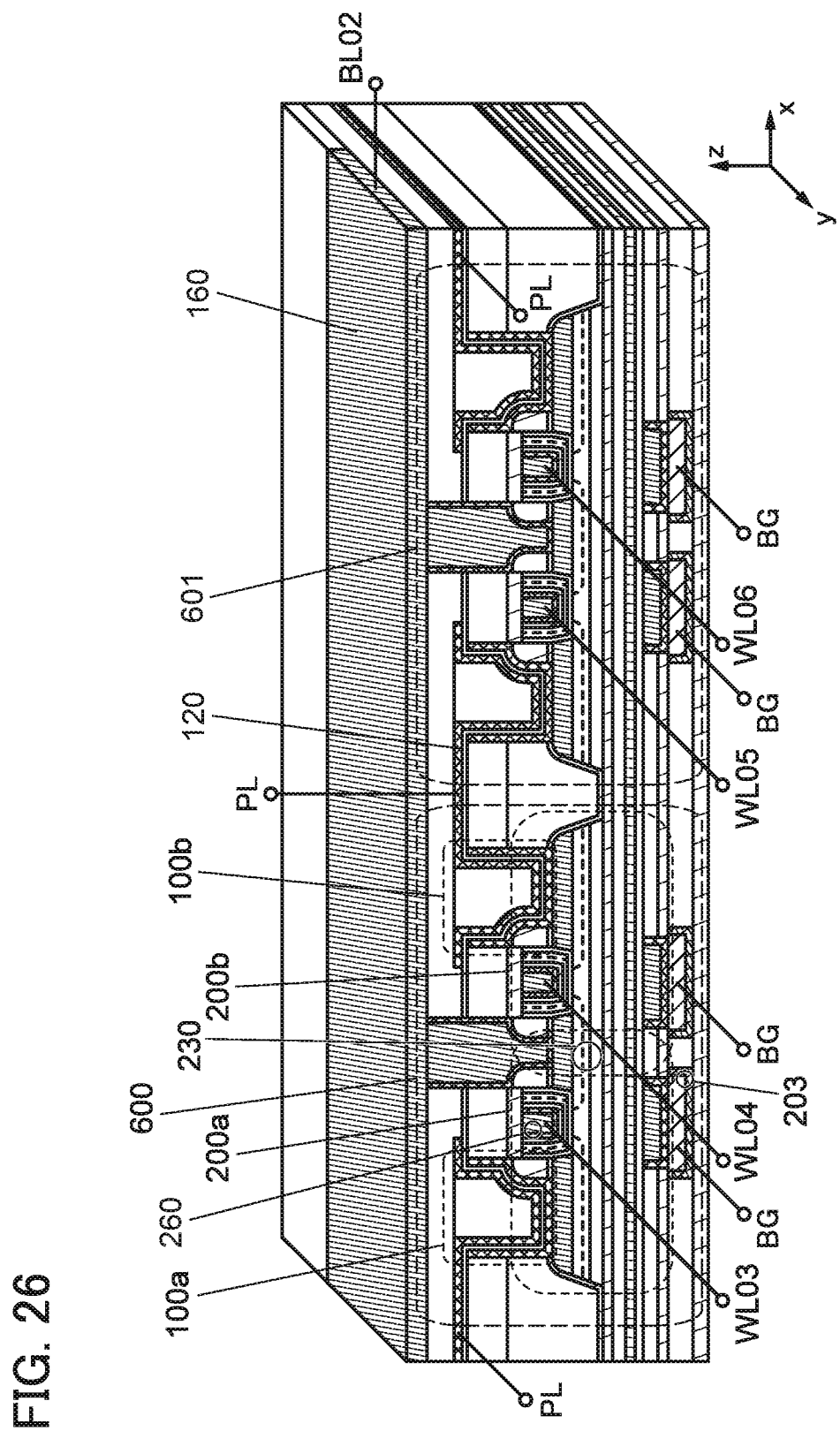
FIG. 26 is a schematic view of a memory device of one embodiment of the present invention.

For example, as illustrated in FIG. 26, the conductor 160 extends in the x-direction to function as the wiring BL, the conductor 260 extends in the y-direction to function as the wiring WL, and the conductor 120 extends in the y-direction to function as the wiring PL. In addition, the conductor 203 may extend in the y-direction to function as a wiring connected to the second gate BG.

It is preferable that as illustrated in FIG. 26, the conductor 120 functioning as one electrode of the capacitor 100b which is included in the cell 600 also function as one electrode of the capacitor 100a which is included in the cell 601. Furthermore, the conductor 120 that functions as one electrode of the capacitor 100a included in the cell 600 also functions as one electrode of a capacitor included in the adjacent cell on the left side of the cell 600, although not shown. The same applies to the cell on the right side of the cell 601. Thus, the cell array can be formed. With this structure of the cell array, the space between the adjacent cells can be reduced; thus, the projected area of the cell array can be reduced and high integration can be achieved.

Figure 27:
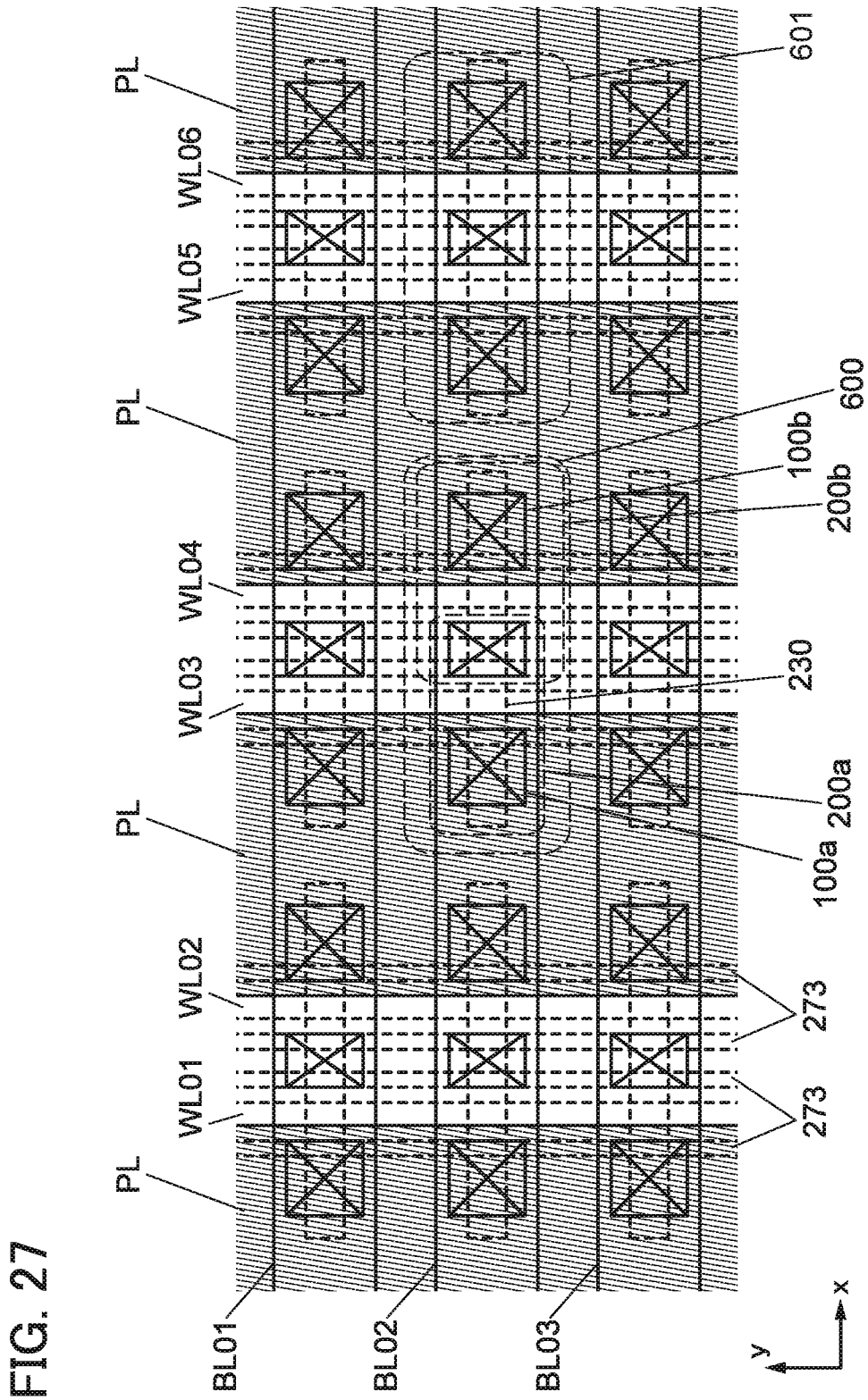
FIG. 27 is a schematic view of a memory device of one embodiment of the present invention.

As illustrated in FIG. 27, the oxides 230 and the wirings WL are arranged in a matrix; thus, the semiconductor device of the circuit diagram shown in FIG. 25 can be formed. Here, the wirings BL are preferably provided in a layer different from the wirings WL and the oxides 230. Specifically, the capacitor 100a and the capacitor 100b are provided below the wirings BL, in which case the long side direction of the oxide 230 and the wiring BL can be substantially parallel to each other in the layout. Accordingly, the layout of the cell can be simplified, the design flexibility is increased, and the process cost can be reduced.

Furthermore, the oxides 230 and the wirings WL are provided so that the long sides of the oxides 230 are substantially orthogonal to the extending direction of the wirings WL in FIG. 27; however, the present invention is not limited thereto. For example, it is also possible to employ a structure where the long sides of the oxide 230 are not orthogonal to the extending direction of the wirings WL and the long sides of the oxide 230 are inclined to the extending direction of the wirings WL. The oxides 230 and the wirings WL are preferably provided so that an angle between the long side of the oxide 230 and the wiring WL is more than or equal to 20° and less than or equal to 70°, further preferably more than or equal to 30° and less than or equal to 60°.

Furthermore, stacked cell arrays may be used instead of the single-layer cell array. By stacking a plurality of cell arrays, the cells can be integrated without an increase in the area occupied by the cell arrays. In other words, a 3D cell array can be formed.

As described above, according to one embodiment of the present invention, a semiconductor device that can be miniaturized or highly integrated can be provided. Alternatively, according to one embodiment of the present invention, a semiconductor device having favorable electrical characteristics can be provided. Alternatively, according to one embodiment of the present invention, a semiconductor device with a low off-state current can be provided. Alternatively, according to one embodiment of the present invention, a semiconductor device with a high on-state current can be provided. Alternatively, according to one embodiment of the present invention, a highly reliable semiconductor device can be provided. Alternatively, according to one embodiment of the present invention, a semiconductor device with low power consumption can be provided. Alternatively, according to one embodiment of the present invention, a semiconductor device that can be manufactured with high productivity can be provided.

As described above, the components, methods, and the like described in this embodiment can be combined with any of the components, methods, and the like described in the other embodiments as appropriate.

Embodiment 3

Figure 28:
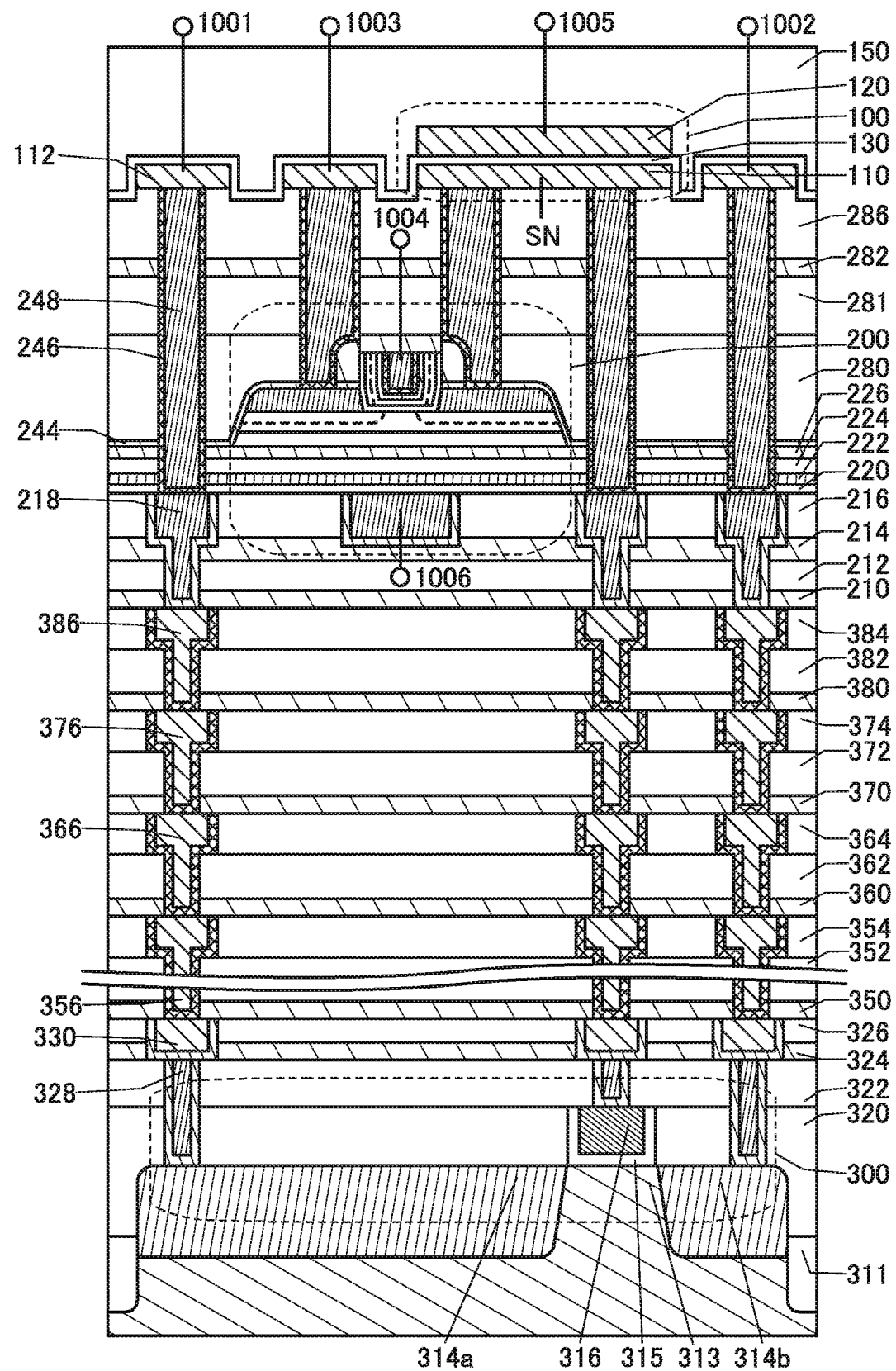
FIG. 28 is a cross-sectional view illustrating a structure of a memory device of one embodiment of the present invention.
Figure 29:
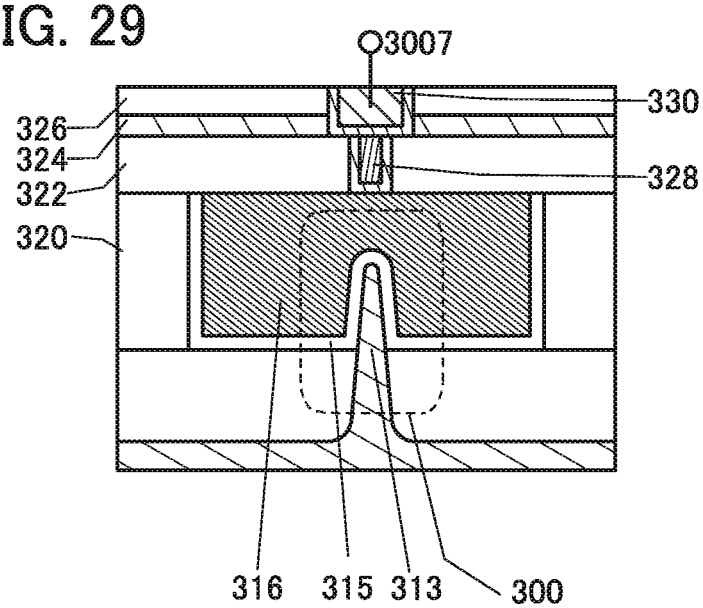
FIG. 29 is a cross-sectional view illustrating a structure of a memory device of one embodiment of the present invention.

In this embodiment, a mode of a semiconductor device that functions as a memory device and is different from one in the above embodiment is described with reference to FIG. 28 and FIG. 29.
<Memory Device 2>
A memory device illustrated in FIG. 28 includes a transistor 300, the transistor 200, and the capacitor 100. FIG. 28 is a cross-sectional view in the channel length direction of the transistors 200 and 300. FIG. 29 is a cross-sectional view in the channel width direction of the transistor 300 and its periphery.

The transistor 200 is a transistor whose channel is formed in a semiconductor layer containing an oxide semiconductor. Since the off-state current of the transistor 200 is low, a memory device including the transistor 200 can retain stored data for a long time. In other words, such a memory device does not require refresh operation or has an extremely low frequency of the refresh operation, which leads to a sufficient reduction in power consumption of the memory device.

In the memory device illustrated in FIG. 28, a wiring 1001 is electrically connected to a source of the transistor 300. A wiring 1002 is electrically connected to a drain of the transistor 300. A wiring 1003 is electrically connected to one of the source and the drain of the transistor 200. A wiring 1004 is electrically connected to the top gate of the transistor 200. A wiring 1006 is electrically connected to the bottom gate of the transistor 200. A gate of the transistor 300 and the other of the source and the drain of the transistor 200 are electrically connected to one electrode of the capacitor 100. A wiring 1005 is electrically connected to the other electrode of the capacitor 100.

The memory device illustrated in FIG. 28 has a feature that the potential of the gate of the transistor 300 can be retained and thus enables writing, retaining, and reading of data as follows.

Writing and retaining of data are described. First, the potential of the wiring 1004 is set to a potential at which the transistor 200 is turned on, so that the transistor 200 is turned on. Accordingly, the potential of the wiring 1003 is supplied to a node SN where the gate of the transistor 300 and one electrode of the capacitor 100 are electrically connected to each other. That is, a predetermined charge is supplied to the gate of the transistor 300 (writing). Here, one of two kinds of charges providing different potential levels (hereinafter referred to as a low-level charge and a high-level charge) is supplied. After that, the potential of the wiring 1004 is set to a potential at which the transistor 200 is turned off, so that the transistor 200 is turned off. Thus, the charge is retained in the node SN (retaining).

In the case where the off-state current of the transistor 200 is low, the charge of the node SN is retained for a long time.

Next, reading of data is described. An appropriate potential (reading potential) is supplied to the wiring 1005 while a predetermined potential (constant potential) is supplied to the wiring 1001, whereby the potential of the wiring 1002 varies depending on the amount of charge retained in the node SN. This is because in the case of using an n-channel transistor as the transistor 300, an apparent threshold voltage $V_{th\_H}$ at the time when a high-level charge is given to the gate of the transistor 300 is lower than an apparent threshold voltage $V_{th\_L}$ at the time when a low-level charge is given to the gate of the transistor 300. Here, an apparent threshold voltage refers to the potential of the wiring 1005 which is needed to turn on the transistor 300. Thus, the potential of the wiring 1005 is set to a potential $V_0$ which is between $V_{th\_H}$ and $V_{th\_L}$, whereby the charge supplied to the node SN can be determined. For example, in the case where a high-level charge is supplied to the node SN in writing and the potential of the wiring 1005 is $V_0 (>V_{th\_H})$, the transistor 300 is turned on. Meanwhile, in the case where a low-level charge is supplied to the node SN in writing, the transistor 300 remains off even when the potential of the wiring 1005 is $V_0 (<V_{th\_L})$. Thus, the data retained in the node SN can be read by determining the potential of the wiring 1002.

In the case where memory cells are arrayed, it is necessary that data of a desired memory cell be read in reading. For example, in the case of a NOR-type memory cell array, only data of a desired memory cell can be read by turning off the transistors 300 of memory cells from which data is not read. In this case, a potential at which the transistor 300 is turned off regardless of the charge supplied to the node SN, that is, a potential lower than $V_{th\_H}$, is supplied to the wiring 1005 connected to the memory cells from which data is not read. Alternatively, in the case of a NAND-type memory cell array, for example, only data of a desired memory cell can be read by turning on the transistors 300 of memory cells from which data is not read. In this case, a potential at which the transistor 300 is turned on regardless of the charge supplied to the node SN, that is, a potential higher than $V_{th\_L}$ is supplied to the wiring 1005 connected to the memory cells from which data is not read.
<Structure of Memory Device 2>
The memory device of one embodiment of the present invention includes the transistor 300, the transistor 200, and the capacitor 100 as illustrated in FIG. 28. The transistor 200 is provided above the transistor 300, and the capacitor 100 is provided above the transistor 300 and the transistor 200.

The transistor 300 is provided in and on a substrate 311 and includes a conductor 316, an insulator 315, a semiconductor region 313 that is a part of the substrate 311, and a low-resistance region 314a and a low-resistance region 314b functioning as a source region and a drain region.

As illustrated in FIG. 29, the top surface and the side surface in the channel width direction of the semiconductor region 313 of the transistor 300 is covered with the conductor 316 with the insulator 315 positioned therebetween. In this way, the effective channel width is increased in the Fin-type transistor 300, whereby the on-state characteristics of the transistor 300 can be improved. In addition, since contribution of the electric field of the gate electrode can be increased, the off-state characteristics of the transistor 300 can be improved.

The transistor 300 is either a p-channel transistor or an n-channel transistor.

It is preferable that a region of the semiconductor region 313 where a channel is formed, a region in the vicinity thereof, the low-resistance regions 314a and 314b functioning as the source and drain regions, and the like contain a semiconductor such as a silicon-based semiconductor, further preferably single crystal silicon. Alternatively, a material containing germanium (Ge), silicon germanium (SiGe), gallium arsenide (GaAs), gallium aluminum arsenide (GaAlAs), or the like may be contained. Silicon whose effective mass is adjusted by applying stress to the crystal lattice and thereby changing the lattice spacing may be contained. Alternatively, the transistor 300 may be a high-electron-mobility transistor (HEMT) with GaAs and GaAlAs, or the like.

The low-resistance regions 314a and 314b contain an element which imparts n-type conductivity, such as arsenic or phosphorus, or an element which imparts p-type conductivity, such as boron, in addition to the semiconductor material used for the semiconductor region 313.

The conductor 316 functioning as a gate electrode can be formed using a semiconductor material such as silicon containing the element which imparts n-type conductivity, such as arsenic or phosphorus, or the element which imparts p-type conductivity, such as boron, or using a conductive material such as a metal material, an alloy material, or a metal oxide material.

Note that since the work function of a conductor depends on a material of the conductor, the $V_{th}$ of a transistor can be adjusted by changing the material of the conductor. Specifically, it is preferable to use titanium nitride, tantalum nitride, or the like for the conductor. Furthermore, in order to ensure the conductivity and embeddability, it is preferable to use a stacked layer of metal materials such as tungsten and aluminum for the conductor. It is particularly preferable to use tungsten in terms of heat resistance.

Note that the transistor 300 illustrated in FIG. 28 is only an example and the structure of the transistor 300 is not limited to that illustrated in FIG. 28; a transistor appropriate for a circuit configuration or a driving method can be used.

An insulator 320, an insulator 322, an insulator 324, and an insulator 326 are stacked sequentially to cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, or aluminum nitride.

The insulator 322 may function as a planarization film for eliminating a level difference caused by the transistor 300 or the like underlying the insulator 322. For example, the top surface of the insulator 322 may be planarized by planarization treatment using a chemical mechanical polishing (CMP) method or the like to increase the level of planarity.

The insulator 324 is preferably formed using a film having a barrier property that prevents hydrogen or impurities from the substrate 311, the transistor 300, or the like from diffusing to a region where the transistor 200 is provided.

For the film having a barrier property against hydrogen, silicon nitride formed by a CVD method can be used, for example. The diffusion of hydrogen to a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. The film that prevents hydrogen diffusion is specifically a film from which a small amount of hydrogen is released.

The amount of released hydrogen can be measured by TDS analysis, for example. The amount of hydrogen released from the insulator 324 that is converted into hydrogen atoms per unit area of the insulator 324 is less than or equal to $10 \times 10^{15}$ atoms/cm$^2$, preferably less than or equal to $5 \times 10^{15}$ atoms/cm$^2$, in the TDS analysis at a film surface temperature of the insulator 324 of higher than or equal to 50° C. and lower than or equal to 500° C., for example.

Note that the dielectric constant of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 or less times that of the insulator 324, further preferably 0.6 or less times that of the insulator 324. In the case where a material with a low dielectric constant is used for an interlayer film, the parasitic capacitance between wirings can be reduced.

A conductor 328, a conductor 330, and the like that are electrically connected to the capacitor 100 or the transistor 200 are provided in the insulator 320, the insulator 322, the insulator 324, and the insulator 326. Note that the conductor 328 and the conductor 330 each function as a plug or a wiring. A plurality of conductors functioning as plugs or wirings are collectively denoted by the same reference numeral in some cases. Furthermore, in this specification and the like, a wiring and a plug electrically connected to the wiring may be a single component. That is, there are cases where part of a conductor functions as a wiring and another part of the conductor functions as a plug.

As a material for each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 28, an insulator 350, an insulator 352, and an insulator 354 are stacked sequentially. Furthermore, a conductor 356 is formed in the insulator 350, the insulator 352, and the insulator 354. The conductor 356 functions as a plug or a wiring. Note that the conductor 356 can be formed using a material similar to those for the conductor 328 and the conductor 330.

Note that for example, the insulator 350 is preferably formed using an insulator having a barrier property against hydrogen, like the insulator 324. Furthermore, the conductor 356 preferably contains a conductor having a barrier property against hydrogen. In particular, the conductor having a barrier property against hydrogen is formed in an opening portion of the insulator 350 having a barrier property against hydrogen. In such a structure, the transistor 300 and the transistor 200 can be separated by a barrier layer, so that the diffusion of hydrogen from the transistor 300 to the transistor 200 can be prevented.

Note that as the conductor having a barrier property against hydrogen, tantalum nitride is preferably used, for example. The use of a stack including tantalum nitride and tungsten having high conductivity can inhibit the diffusion of hydrogen from the transistor 300 while the conductivity of a wiring is ensured. In that case, the tantalum nitride layer having a barrier property against hydrogen is preferably in contact with the insulator 350 having a barrier property against hydrogen.

A wiring layer may be provided over the insulator 354 and the conductor 356. For example, in FIG. 28, an insulator 360, an insulator 362, and an insulator 364 are stacked sequentially. Furthermore, a conductor 366 is formed in the insulator 360, the insulator 362, and the insulator 364. The conductor 366 functions as a plug or a wiring. Note that the conductor 366 can be formed using a material similar to those used for forming the conductor 328 and the conductor 330.

Note that for example, the insulator 360 is preferably formed using an insulator having a barrier property against hydrogen, like the insulator 324. Furthermore, the conductor 366 preferably contains a conductor having a barrier property against hydrogen. In particular, the conductor having a barrier property against hydrogen is formed in an opening portion of the insulator 360 having a barrier property against hydrogen. In such a structure, the transistor 300 and the transistor 200 can be separated by a barrier layer, so that the diffusion of hydrogen from the transistor 300 to the transistor 200 can be prevented.

A wiring layer may be provided over the insulator 364 and the conductor 366. For example, in FIG. 28, an insulator 370, an insulator 372, and an insulator 374 are stacked sequentially. Furthermore, a conductor 376 is formed in the insulator 370, the insulator 372, and the insulator 374. The conductor 376 functions as a plug or a wiring. Note that the conductor 376 can be formed using a material similar to those for the conductor 328 and the conductor 330.

Note that for example, the insulator 370 is preferably formed using an insulator having a barrier property against hydrogen, like the insulator 324. Furthermore, the conductor 376 preferably contains a conductor having a barrier property against hydrogen. In particular, the conductor having a barrier property against hydrogen is formed in an opening portion of the insulator 370 having a barrier property against hydrogen. In such a structure, the transistor 300 and the transistor 200 can be separated by a barrier layer, so that the diffusion of hydrogen from the transistor 300 to the transistor 200 can be prevented.

A wiring layer may be provided over the insulator 374 and the conductor 376. For example, in FIG. 28, an insulator 380, an insulator 382, and an insulator 384 are stacked sequentially. Furthermore, a conductor 386 is formed in the insulator 380, the insulator 382, and the insulator 384. The conductor 386 functions as a plug or a wiring. Note that the conductor 386 can be formed using a material similar to those used for forming the conductor 328 and the conductor 330.

Note that for example, the insulator 380 is preferably formed using an insulator having a barrier property against hydrogen, like the insulator 324. Furthermore, the conductor 386 preferably contains a conductor having a barrier property against hydrogen. In particular, the conductor having a barrier property against hydrogen is formed in an opening portion of the insulator 380 having a barrier property against hydrogen. In such a structure, the transistor 300 and the transistor 200 can be separated by a barrier layer, so that the diffusion of hydrogen from the transistor 300 to the transistor 200 can be prevented.

Although the wiring layer including the conductor 356, the wiring layer including the conductor 366, the wiring layer including the conductor 376, and the wiring layer including the conductor 386 are described above, the memory device of this embodiment is not limited thereto. The number of wiring layers similar to the wiring layer including the conductor 356 may be three or less or five or more.

The insulator 210, the insulator 212, the insulator 214, and the insulator 216 are stacked sequentially over the insulator 384. A material having a barrier property against oxygen or hydrogen is preferably used for one of the insulators 210, 212, 214, and 216.

For example, each of the insulator 210 and the insulator 214 is preferably formed using a film having a barrier property that prevents hydrogen or impurities from the substrate 311, a region where the transistor 300 is provided, or the like from diffusing to a region where the transistor 200 is provided. Therefore, each of the insulator 210 and the insulator 214 can be formed using a material similar to that for the insulator 324.

For the film having a barrier property against hydrogen, silicon nitride formed by a CVD method can be used, for example. The diffusion of hydrogen to a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. The film that prevents hydrogen diffusion is specifically a film from which a small amount of hydrogen is released.

As the film having a barrier property against hydrogen, for example, as each of the insulator 210 and the insulator 214, a metal oxide such as aluminum oxide, hafnium oxide, or tantalum oxide is preferably used.

In particular, aluminum oxide has an excellent blocking effect that prevents permeation of oxygen and impurities such as hydrogen and moisture which cause a change in electrical characteristics of the transistor. Accordingly, the use of aluminum oxide can prevent the entry of impurities such as hydrogen and moisture into the transistor 200 during and after a manufacturing process of the transistor. In addition, release of oxygen from the oxide contained in the transistor 200 can be prevented. Therefore, aluminum oxide is suitably used for a protective film of the transistor 200.

The insulator 212 and the insulator 216 can be formed using a material similar to that for the insulator 320, for example. In the case where a material with a relatively low dielectric constant is used for an interlayer film, the parasitic capacitance between wirings can be reduced. A silicon oxide film or a silicon oxynitride film can be used for the insulators 212 and 216, for example.

A conductor 218, a conductor (the conductor 205) included in the transistor 200, and the like are provided in the insulators 210, 212, 214, and 216. Note that the conductor 218 functions as a plug or a wiring that is electrically connected to the capacitor 100 or the transistor 300. The conductor 218 can be formed using a material similar to those used for forming the conductors 328 and 330.

In particular, part of the conductor 218 that is in contact with the insulators 210 and 214 is preferably a conductor having a barrier property against oxygen, hydrogen, and water. In such a structure, the transistors 300 and 200 can be separated by a layer having a barrier property against oxygen, hydrogen, and water. As a result, the diffusion of hydrogen from the transistor 300 to the transistor 200 can be prevented.

The transistor 200 is provided over the insulator 216. Note that the structure of the transistor of the semiconductor device described in the above embodiment can be used as the structure of the transistor 200. Note that the transistor 200 in FIG. 28 is only an example and the structure of the transistor 200 is not limited to that illustrated in FIG. 28; a transistor appropriate for a circuit configuration or a driving method can be used.

The insulator 281 is provided over the transistor 200.

An insulator 282 is provided over the insulator 281. A substance having a barrier property against oxygen or hydrogen is preferably used for the insulator 282. Thus, the insulator 282 can be formed using a material similar to that used for forming the insulator 214. For the insulator 282, a metal oxide such as aluminum oxide, hafnium oxide, or tantalum oxide is preferably used, for example.

In particular, aluminum oxide has an excellent blocking effect that prevents permeation of oxygen and impurities such as hydrogen and moisture which cause a change in electrical characteristics of the transistor. Accordingly, the use of aluminum oxide can prevent the entry of impurities such as hydrogen and moisture into the transistor 200 during and after a manufacturing process of the transistor. In addition, release of oxygen from the oxide contained in the transistor 200 can be prevented. Therefore, aluminum oxide is suitably used for a protective film of the transistor 200.

An insulator 286 is provided over the insulator 282. The insulator 286 can be formed using a material similar to that used for forming the insulator 320. In the case where a material with a relatively low dielectric constant is used for an interlayer film, the parasitic capacitance between wirings can be reduced. For example, a silicon oxide film, a silicon oxynitride film, or the like can be used for the insulator 286.

A conductor 246, a conductor 248, and the like are provided in the insulators 220, 222, 224, 280, 281 282, and 286.

The conductors 246 and 248 function as plugs or wirings that are electrically connected to the capacitor 100, the transistor 200, or the transistor 300. The conductors 246 and 248 can be formed using a material similar to those used for forming the conductors 328 and 330.

The capacitor 100 is provided above the transistor 200. The capacitor 100 includes the conductor 110, the conductor 120, and the insulator 130.

A conductor 112 may be provided over the conductors 246 and 248. The conductor 112 functions as a plug or a wiring that is electrically connected to the capacitor 100, the transistor 200, or the transistor 300. The conductor 110 functions as the electrode of the capacitor 100. The conductor 112 and the conductor 110 can be formed at the same time.

The conductor 112 and the conductor 110 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 112 and the conductor 110 each have a single-layer structure in FIG. 28; however, one embodiment of the present invention is not limited thereto, and a stacked-layer structure of two or more layers may be used. For example, between a conductor having a barrier property and a conductor having high conductivity, a conductor which is highly adhesive to the conductor having a barrier property and the conductor having high conductivity may be formed.

The conductor 120 is provided so as to overlap with the conductor 110 with the insulator 130 positioned therebetween. Note that the conductor 120 can be formed using a conductive material such as a metal material, an alloy material, or a metal oxide material. It is preferable to use a high-melting-point material which has both heat resistance and conductivity, such as tungsten or molybdenum, and it is particularly preferable to use tungsten. In the case where the conductor 120 is formed concurrently with another component such as a conductor, copper (Cu), aluminum (A1), or the like which is a low-resistance metal material can be used.

The insulator 150 is provided over the conductor 120 and the insulator 130. The insulator 150 can be formed using a material similar to that used for forming the insulator 320. The insulator 150 may function as a planarization film that covers a roughness thereunder.

With the use of the structure, a change in electrical characteristics can be prevented and reliability can be improved in a semiconductor device including a transistor including an oxide semiconductor. A semiconductor device including an oxide semiconductor with a high on-state current can be provided. A semiconductor device including an oxide semiconductor with a low off-state current can be provided. A semiconductor device with low power consumption can be provided. A semiconductor device including a transistor including an oxide semiconductor can be miniaturized or highly integrated.

As described above, the components, structures, methods, and the like described in this embodiment can be combined with any of the components, structures, methods, and the like described in the other embodiments as appropriate.

Embodiment 4

In this embodiment, a NOSRAM will be described as an example of a memory device including a transistor in which oxide is used for a semiconductor (hereinafter referred to as an OS transistor) and a capacitor, which is one embodiment of the present invention, with reference to FIG. 30, FIGS. 31A to 31E, and FIG. 32. A NOSRAM (registered trademark) is an abbreviation of "nonvolatile oxide semiconductor RAM", which indicates a RAM including a gain cell (2T or 3T) memory cell. Hereinafter, a memory device including an OS transistor, such as a NOSRAM, is referred to as an OS memory in some cases.

A memory device in which OS transistors are used in memory cells (hereinafter referred to as an OS memory) is used in a NOSRAM. The OS memory is a memory including at least a capacitor and an OS transistor that controls charge and discharge of the capacitor. The OS memory has excellent retention characteristics because the OS transistor has an extremely low off-state current and thus can function as a nonvolatile memory.

<<NOSRAM 1600>>

Figure 30:
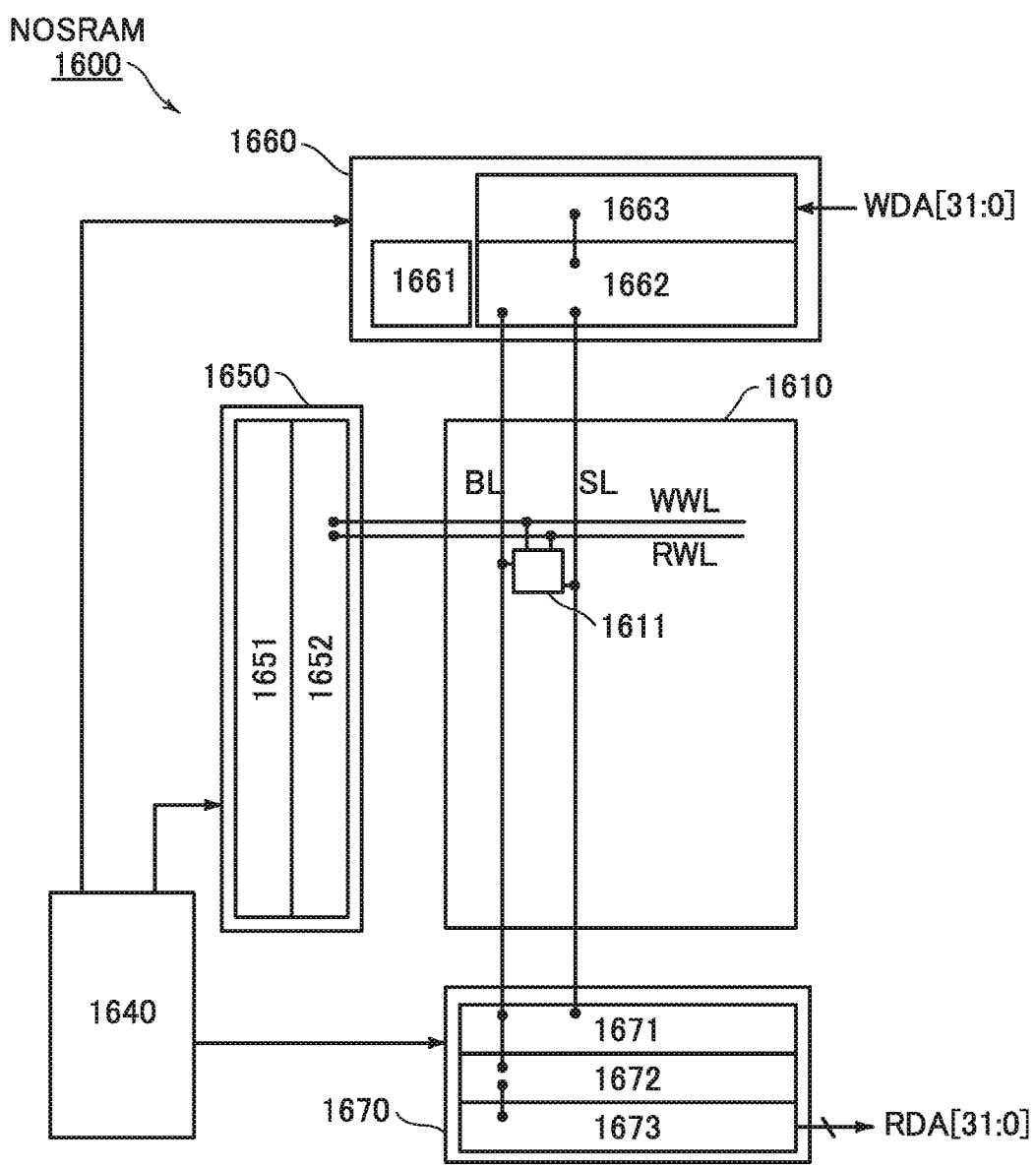
FIG. 30 is a block diagram illustrating a configuration example of a memory device of one embodiment of the present invention.

FIG. 30 shows a configuration example of a NOSRAM. A NOSRAM 1600 in FIG. 30 includes a memory cell array 1610, a controller 1640, a row driver 1650, a column driver 1660, and an output driver 1670. Note that the NOSRAM 1600 is a multilevel NOSRAM in which one memory cell stores multilevel data.

The memory cell array 1610 includes a plurality of memory cells 1611, a plurality of word lines WWL, a plurality of word lines RWL, a plurality of bit lines BL, and a plurality of source lines SL. The word lines WWL are write word lines and the word lines RWL are read word lines. In the NOSRAM 1600, one memory cell 1611 stores 3-bit (8-level) data.

The controller 1640 controls the NOSRAM 1600 as a whole and writes data WDA[31:0] and reads out data RDA[31:0]. The controller 1640 processes command signals input from the outside (e.g., a chip enable signal and a write enable signal) to generate control signals of the row driver 1650, the column driver 1660, and the output driver 1670.

The row driver 1650 has a function of selecting a row to be accessed. The row driver 1650 includes a row decoder 1651 and a word line driver 1652.

The column driver 1660 drives a source line SL and a bit line BL. The column driver 1660 includes a column decoder 1661, a write driver 1662, and a digital-analog converter circuit (DAC) 1663.

The DAC 1663 converts 3-bit digital data into an analog voltage. The DAC 1663 converts 32-bit data WDA[31:0] into an analog voltage per 3 bits.

The write driver 1662 has a function of precharging the source line SL, a function of bringing the source line SL into an electrically floating state, a function of selecting the source line SL, a function of inputting a writing voltage generated from the DAC 1663 to the selected source line SL, a function of precharging the bit line BL, a function of bringing the bit line BL into an electrically floating state, and the like.

The output driver 1670 includes a selector 1671, an analog-digital converter circuit (ADC) 1672, and an output buffer 1673. The selector 1671 selects a source line SL to be accessed and transmits the potential of the selected source line SL to the ADC 1672. The ADC 1672 has a function of converting an analog voltage into 3-bit digital data. The potential of the source line SL is converted into 3-bit data in the ADC 1672, and the output buffer 1673 stores the data output from the ADC 1672.

The configuration of the row driver 1650, the column driver 1660, and the output driver 1670 described in this embodiment is not limited to the above configuration. The arrangement of those drivers and wirings connected to the drivers may be changed or the functions of the drivers and the wirings connected to the drivers may be changed or added, depending on the configuration, driving method, or the like of the memory cell array 1610. For example, the bit line BL may have part of a function of the source line SL.

Although the amount of data held in each of the memory cells 1611 is 3 bits in the above description, the structure of the memory device of this embodiment is not limited thereto. The amount of data held in each of the memory cells 1611 may be 2 bits or less or 4 bits or more. In the case where the amount of data held in each of the memory cells 1611 is one bit, for example, the DAC 1663 and the ADC 1672 may be unnecessary.

<Memory Cells 1611 to 1614>

Figure 31A:
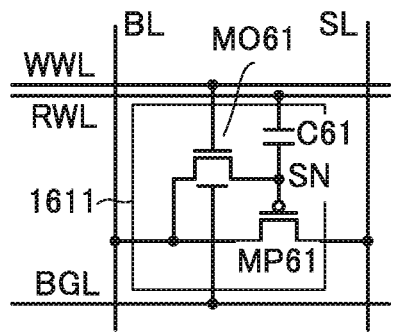
FIGS. 31A to 31E are circuit diagrams each illustrating a configuration example of a memory device of one embodiment of the present invention.

FIG. 31A is a circuit diagram showing a configuration example of the memory cell 1611. The memory cell 1611 is a 2T gain cell and is electrically connected to the word lines WWL and RWL, the bit line BL, the source line SL, and the wiring BGL. The memory cell 1611 includes a node SN, an OS transistor MO61, a transistor MP61, and a capacitor C61. The OS transistor MO61 is a write transistor. The transistor MP61 is a read transistor and is formed using a p-channel Si transistor, for example. The capacitor C61 is a storage capacitor for holding the potential of the node SN. The node SN is a data holding node and corresponds to a gate of the transistor MP61 here.

The write transistor of the memory cell 1611 is formed using the OS transistor MO61; thus, the NOSRAM 1600 can hold data for a long time.

Figure 31B:
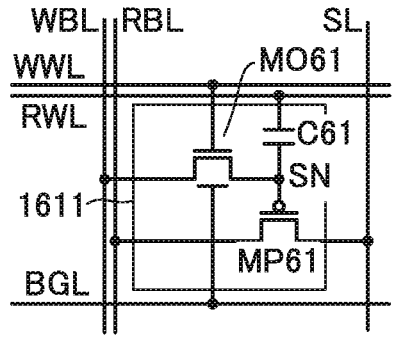

In the example of FIG. 31A, a write bit line and a read bit line are a common bit line; however, as shown in FIG. 31B, a bit line WBL functioning as a write bit line and a bit line RBL functioning as a read bit line may be provided.

Figure 31C:
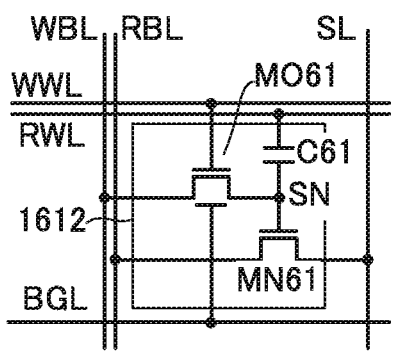
Figure 31D:
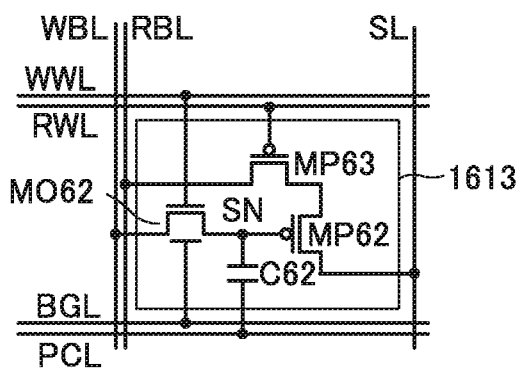
Figure 31E:
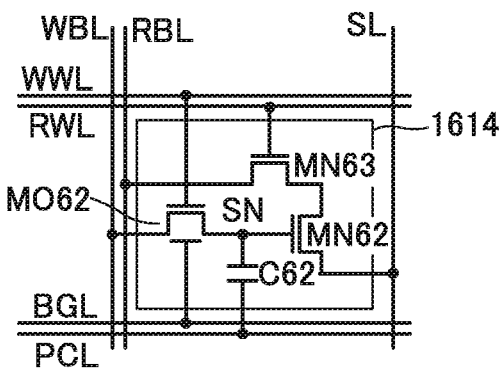

FIGS. 31C to 31E show other configuration examples of the memory cell. FIGS. 31C to 31E show examples where the write bit line WBL and the read bit line RBL are provided; however, as shown in FIG. 31A, the write bit line and the read bit line may be a common bit line.

The memory cell 1612 shown in FIG. 31C is a modified example of the memory cell 1611 where the read transistor is changed into an n-channel transistor (MN61). The transistor MN61 may be an OS transistor or a Si transistor.

In the memory cells 1611 and 1612, the OS transistor MO61 may be an OS transistor with no bottom gate.

The memory cell 1613 shown in FIG. 31D is a 3T gain cell and is electrically connected to the word lines WWL and RWL, the bit lines WBL and RBL, the source line SL, the wiring BGL, and a wiring PCL. The memory cell 1613 includes the node SN, an OS transistor MO62, a transistor MP62, a transistor MP63, and a capacitor C62. The OS transistor MO62 is a write transistor. The transistor MP62 is a read transistor and the transistor MP63 is a selection transistor.

The memory cell 1614 shown in FIG. 31E is a modified example of the memory cell 1613 where the read transistor and the selection transistor are changed into n-channel transistors (transistors MN62 and MN63). Each of the transistors MN62 and MN63 may be an OS transistor or a Si transistor.

The OS transistors provided in the memory cells 1611 to 1614 may each be a transistor with no bottom gate or a transistor with a bottom gate.

The so-called NOR memory device in which the memory cells 1611 or the like are connected in parallel is described above, but the memory device of this embodiment is not limited thereto. For example, a so-called NAND memory device in which memory cells 1615 described below are connected in series may be provided.

Figure 32:
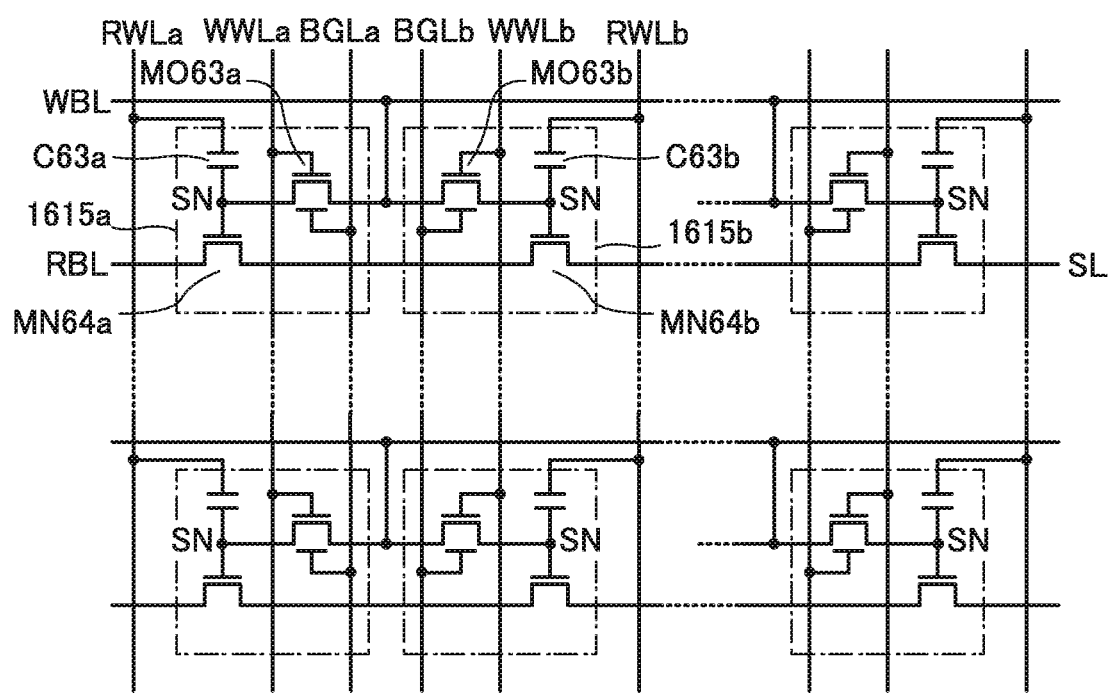
FIG. 32 is a circuit diagram illustrating a configuration example of a memory device of one embodiment of the present invention.

FIG. 32 is a circuit diagram showing a configuration example of the memory cell array 1610, which is a NAND memory cell array. The memory cell array 1610 shown in FIG. 32 includes the source line SL, the bit line RBL, the bit line WBL, the word line WWL, the word line RWL, the wiring BGL, and the memory cell 1615. The memory cell 1615 includes the node SN, an OS transistor MO63, a transistor MN64, and a capacitor C63. Here, the transistor MN64 is an n-channel Si transistor, for example; the transistor MN64 is not limited thereto and may be a p-channel Si transistor or an OS transistor.

Memory cells 1615a and 1615b shown in FIG. 32 are described below as examples. The letter "a" or "b" is added to the reference numerals of the wirings and circuit elements connected to the memory cell 1615a or the memory cell 1615b.

In the memory cell 1615a, a gate of a transistor MN64a, one of a source and a drain of an OS transistor MO63a, and one electrode of a capacitor C63a are electrically connected to one another. The bit line WBL and the other of the source and the drain of the OS transistor MO63a are electrically connected to each other. A word line WWLa and a gate of the OS transistor MO63a are electrically connected to each other. A wiring BGLa and a bottom gate of the OS transistor MO63a are electrically connected to each other. A word line RWLa and the other electrode of the capacitor C63a are electrically connected to each other.

The memory cell 1615b can be provided so as to be symmetric to the memory cell 1615a with respect to a contact portion of the bit line WBL, the memory cell 1615a, and the memory cell 1615b. Therefore, circuit elements of the memory cell 1615b are connected to wirings in a manner similar to the memory cell 1615a.

A source of the transistor MN64a of the memory cell 1615a is electrically connected to a drain of a transistor MN64b of the memory cell 1615b. A drain of the transistor MN64a of the memory cell 1615a is electrically connected to the bit line RBL. A source of the transistor MN64b of the memory cell 1615b is electrically connected to the source line SL through the transistors MN64 of the plurality of memory cells 1615. As described here, the plurality of transistors MN64 are connected in series between the bit line RBL and the source line SL in the NAND memory cell array 1610.

In a memory device including the memory cell array 1610 illustrated in FIG. 32, writing operation and reading operation are performed for each group of memory cells (hereinafter referred to as a memory cell column) connected to the same word line WWL (or the word line RWL). For example, the writing operation can be performed as follows. A potential at which the OS transistor MO63 is turned on is supplied to the word line WWL connected to a memory cell column to which data is written so that the OS transistors MO63 in the memory cell column are turned on. Accordingly, the potential of the bit line WBL is supplied to the gates of the transistors MN64 and one electrode of the capacitors C63 in the selected memory cell column, whereby a predetermined charge is supplied to the gate. After that, turning off the OS transistors MO63 in the memory cell column allows the predetermined charge retained in the gate. Thus, data can be written to the memory cell 1615 in the selected memory cell column.

For example, the reading operation can be performed as follows. First, a potential at which the transistor MN64 is turned on is supplied to the word line RWL not connected to a memory cell column from which data is read regardless of a charge supplied to the gate of the transistor MN64, so that the transistors MN64 in memory cell columns from which data is not read are turned on. Then, a potential (reading potential) at which an on state or an off state of the transistor MN64 is determined is supplied to the word line RWL connected to the memory cell column from which data is read in accordance with a charge of the gate of the transistor MN64. After that, a fixed potential is supplied to the source line SL and a reading circuit connected to the bit line RBL is operated. Here, the plurality of transistors MN64 between the source line SL and the bit line RBL are turned on except the transistors MN64 in the memory cell column from which data is read; therefore, the conductance between the source line SL and the bit line RBL depends on the state (an on state or an off state) of the transistor MN64 in the memory cell column from which data is read. Since the conductance of the transistor varies depending on the charge of the gate of the transistor MN64 in the memory cell column from which data is read, the potential of the bit line RBL varies accordingly. By reading the potential of the bit line RBL with the reading circuit, data can be read from the memory cells 1615 in the selected memory cell column.

There is theoretically no limitation on the number of rewriting operations of the NOSRAM 1600 because data is rewritten by charging and discharging of the capacitor C61, C62, or C63; and data can be written to and read from the NOSRAM with low energy. Furthermore, since data can be held for a long time, the refresh rate can be reduced.

In the case where the semiconductor device described in any of the above embodiments is used for the memory cells 1611, 1612, 1613, 1614, and 1615, the transistor 200 can be used as the OS transistors MO61, MO62, and MO63, the capacitor 100 can be used as the capacitors C61, C62, and C63, and the transistor 300 can be used as the transistors MP61, MP62, MP63, MN61, MN62, MN63, and MN64. Thus, the area occupied by each set consisting of one transistor and one capacitor in the top view can be reduced, so that the memory device of this embodiment can be further highly integrated. As a result, storage capacity per unit area of the memory device of this embodiment can be increased.

The structure described in this embodiment can be used in appropriate combination with the structure described in any of the other embodiments.

Embodiment 5

In this embodiment, a DOSRAM will be described as another example of the memory device of one embodiment of the present invention that includes an OS transistor and a capacitor, with reference to FIG. 33 and FIGS. 34A and 34B. A DOSRAM (registered trademark) stands for "dynamic oxide semiconductor RAM," which is a RAM including a 1T1C (one-transistor/one-capacitor) memory cell. As in the NOSRAM, an OS memory is used in the DOSRAM.

<<DOSRAM 1400>>

Figure 33:
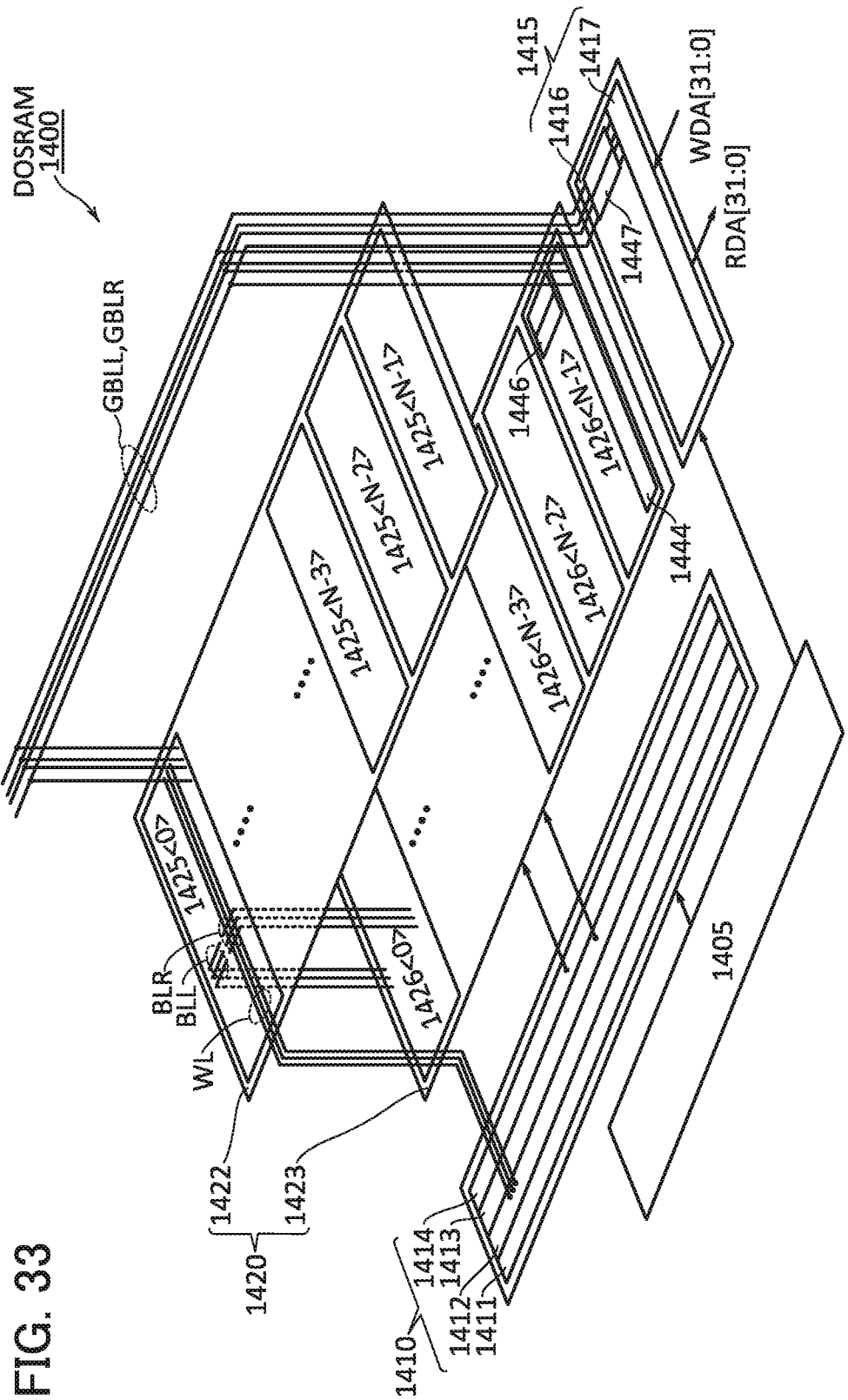
FIG. 33 is a block diagram illustrating a configuration example of a memory device of one embodiment of the present invention.
Figure 34A:
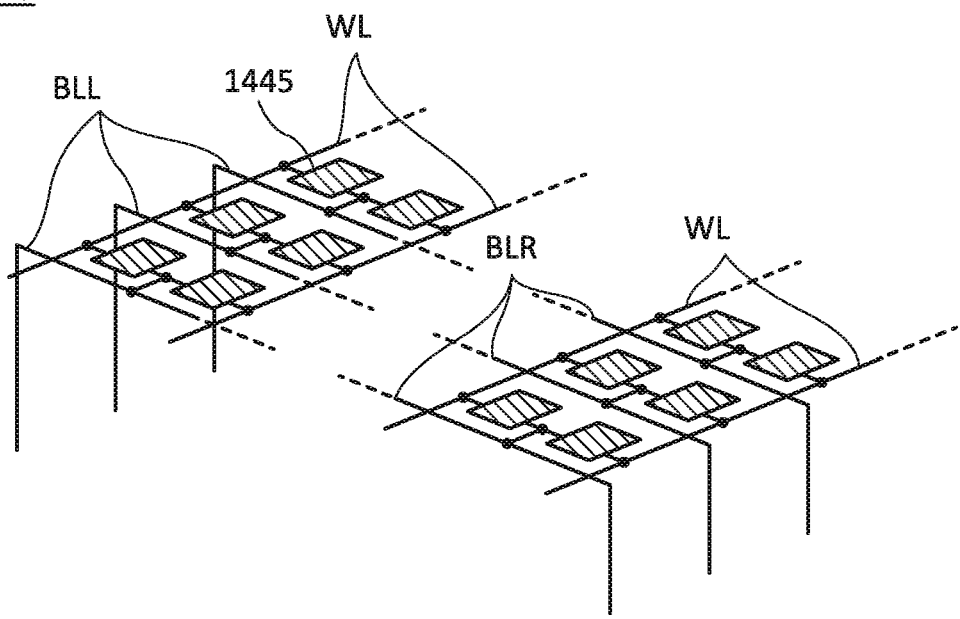
FIGS. 34A and 34B are a block diagram and a circuit diagram showing a configuration example of a memory device of one embodiment of the present invention.

FIG. 33 illustrates a configuration example of the DOSRAM. As illustrated in FIG. 33, a DOSRAM 1400 includes a controller 1405, a row circuit 1410, a column circuit 1415, and a memory cell and sense amplifier array 1420 (hereinafter referred to as MC-SA array 1420).

The row circuit 1410 includes a decoder 1411, a word line driver circuit 1412, a column selector 1413, and a sense amplifier driver circuit 1414. The column circuit 1415 includes a global sense amplifier array 1416 and an input/output circuit 1417. The global sense amplifier array 1416 includes a plurality of global sense amplifiers 1447. The MC-SA array 1420 includes a memory cell array 1422, a sense amplifier array 1423, and global bit lines GBLL and GBLR.

(MC-SA Array 1420)

The MC-SA array 1420 has a stacked-layer structure where the memory cell array 1422 is stacked over the sense amplifier array 1423. The global bit lines GBLL and GBLR are stacked over the memory cell array 1422. The DOSRAM

1400 adopts a hierarchical bit line structure, where the bit lines are layered into local and global bit lines.

The memory cell array 1422 includes N local memory cell arrays 1425<0> to 1425<N−1>, where N is an integer greater than or equal to 2. FIG. 34A illustrates a configuration example of the local memory cell array 1425. The local memory cell array 1425 includes a plurality of memory cells 1445, a plurality of word lines WL, a plurality of bit lines BLL, and a plurality of bit lines BLR. In the example in FIG. 34A, the local memory cell array 1425 has an open bit-line architecture but may have a folded bit-line architecture.

Figure 34B:
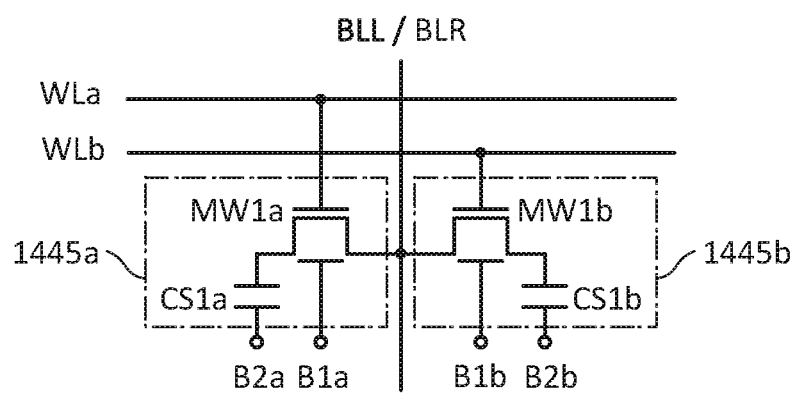

FIG. 34B illustrates a circuit configuration example of a pair of memory cells 1445a and 1445b connected to the same bit line BLL (bit line BLR). The memory cell 1445a includes a transistor MW1a, a capacitor CS1a, and terminals B1a and B2a. The memory cell 1445a is connected to a word line WLa and the bit line BLL (bit line BLR). The memory cell 1445b includes a transistor MW1b, a capacitor CS1b, and terminals B1b and B2b. The memory cell 1445b is connected to a word line WLb and the bit line BLL (bit line BLR). Hereinafter, in the case where the description applies to both the memory cell 1445a and the memory cell 1445b, the memory cell 1445 and its components are described without using the letter "a" or "b", in some cases.

The transistor MW1a has a function of controlling the charging and discharging of the capacitor CS1a, and the transistor MW1b has a function of controlling the charging and discharging of the capacitor CS1b. A gate of the transistor MW1a is electrically connected to the word line WLa, a first terminal of the transistor MW1a is electrically connected to the bit line BLL (bit line BLR), and a second terminal of the transistor MW1a is electrically connected to a first terminal of the capacitor CS1a. A gate of the transistor MW1b is electrically connected to the word line WLb, a first terminal of the transistor MW1b is electrically connected to the bit line BLL (bit line BLR), and a second terminal of the transistor MW1b is electrically connected to a first terminal of the capacitor CS1b. In this way, the bit line BLL (bit line BLR) is electrically connected to both the first terminal of the transistor MW1a and the first terminal of the transistor MW1b.

The transistor MW1 has a function of controlling the charging and discharging of the capacitor CS1. A second terminal of the capacitor CS1 is electrically connected to the terminal B2. A constant potential (e.g., low power supply potential) is applied to the terminal B2.

In the case where the semiconductor device described in any of the above embodiments is used in each of the memory cells 1445a and 1445b, the transistors 200a and 200b can be used as the transistors MW1a and MW1b, respectively, and the capacitors 100a and 100b can be used as the capacitors CS1a and CS1b, respectively. In this case, the area occupied by each set consisting of one transistor and one capacitor in the top view can be reduced; accordingly, the memory device of this embodiment can be highly integrated. As a result, storage capacity per unit area of the memory device of this embodiment can be increased.

The transistor MW1 includes a bottom gate, and the bottom gate is electrically connected to the terminal B1. This makes it possible to change the $V_{th}$ of the transistor MW1 with the potential applied to the terminal B1. For example, a fixed potential (e.g., negative constant potential) may be applied to the terminal B1; alternatively, the potential applied to the terminal B1 may be changed in response to the operation of the DOSRAM 1400.

The bottom gate of the transistor MW1 may be electrically connected to the gate, the source, or the drain of the transistor MW1. The transistor MW1 does not necessarily include the bottom gate.

The sense amplifier array 1423 includes N local sense amplifier arrays 1426<0> to 1426<N−1>. The local sense amplifier arrays 1426 each include one switch array 1444 and a plurality of sense amplifiers 1446. Each of the sense amplifiers 1446 is electrically connected to a bit line pair. The sense amplifiers 1446 each have a function of precharging the corresponding bit line pair, a function of amplifying a potential difference of the bit line pair, and a function of retaining the potential difference. The switch array 1444 has a function of selecting a bit line pair and electrically connecting the selected bit line pair and a global bit line pair to each other.

Here, two bit lines that are compared simultaneously by the sense amplifier are collectively referred to as the bit line pair, and two global bit lines that are compared simultaneously by the global sense amplifier are collectively referred to as the global bit line pair. The bit line pair can be referred to as a pair of bit lines, and the global bit line pair can be referred to as a pair of global bit lines. Here, the bit line BLL and the bit line BLR form one bit line pair, and the global bit line GBLL and the global bit line GBLR form one global bit line pair. In the following description, the expressions "bit line pair (BLL, BLR)" and "global bit line pair (GBLL, GBLR)" are also used.

(Controller 1405)

The controller 1405 has a function of controlling the overall operation of the DOSRAM 1400. The controller 1405 has a function of performing logic operation on a command signal that is input from the outside and determining an operation mode, a function of generating control signals for the row circuit 1410 and the column circuit 1415 so that the determined operation mode is executed, a function of retaining an address signal that is input from the outside, and a function of generating an internal address signal.

(Row Circuit 1410)

The row circuit 1410 has a function of driving the MC-SA array 1420. The decoder 1411 has a function of decoding an address signal. The word line driver circuit 1412 generates a selection signal for selecting the word line WL of a row that is to be accessed.

The column selector 1413 and the sense amplifier driver circuit 1414 are circuits for driving the sense amplifier array 1423. The column selector 1413 has a function of generating a selection signal for selecting the bit line of a column that is to be accessed. With the selection signal from the column selector 1413, the switch array 1444 of each local sense amplifier array 1426 is controlled. With the control signal from the sense amplifier driver circuit 1414, each of the plurality of local sense amplifier arrays 1426 is driven independently.

(Column Circuit 1415)

The column circuit 1415 has a function of controlling the input of data signals WDA[31:0], and a function of controlling the output of data signals RDA[31:0]. The data signals WDA[31:0] are write data signals, and the data signals RDA[31:0] are read data signals.

Each of the global sense amplifiers 1447 is electrically connected to the global bit line pair (GBLL, GBLR). The global sense amplifiers 1447 each have a function of amplifying a potential difference of the global bit line pair (GBLL, GBLR), and a function of retaining the potential difference.

Data is written to and read from the global bit line pair (GBLL, GBLR) by the input/output circuit 1417.

The writing operation of the DOSRAM 1400 is briefly described. Data is written to the global bit line pair by the input/output circuit 1417. The data of the global bit line pair is retained by the global sense amplifier array 1416. By the switch array 1444 of the local sense amplifier array 1426 specified by an address signal, the data of the global bit line pair is written to the bit line pair of a column where data is to be written. The local sense amplifier array 1426 amplifies the written data, and then retains the amplified data. In the specified local memory cell array 1425, the word line WL of the row where data is to be written is selected by the row circuit 1410, and the data retained at the local sense amplifier array 1426 is written to the memory cell 1445 of the selected row.

The reading operation of the DOSRAM 1400 is briefly described. One row of the local memory cell array 1425 is specified with an address signal. In the specified local memory cell array 1425, the word line WL of a row where data is to be read is selected, and data of the memory cell 1445 is written to the bit line. The local sense amplifier array 1426 detects a potential difference of the bit line pair of each column as data, and retains the data. The switch array 1444 writes the data of a column specified by the address signal to the global bit line pair; the data is chosen from the data retained at the local sense amplifier array 1426. The global sense amplifier array 1416 determines and retains the data of the global bit line pair. The data retained at the global sense amplifier array 1416 is output to the input/output circuit 1417. Thus, the reading operation is completed.

There is theoretically no limitation on the number of rewriting operations of the DOSRAM 1400 because data is rewritten by charging and discharging of the capacitor CS1; and data can be written to and read from the DOSRAM with low energy. A simple circuit configuration of the memory cell 1445 allows a high memory capacity.

The transistor MW1 is an OS transistor. The extremely low off-state current of the OS transistor can inhibit charge leakage from the capacitor CS1. Therefore, the retention time of the DOSRAM 1400 is considerably longer than that of a DRAM. This allows less frequent refresh, which can reduce power needed for refresh operations. Thus, the DOSRAM 1400 is suitably used for a memory device that can rewrite a large volume of data with a high frequency, for example, a frame memory used for image processing.

Since the MC-SA array 1420 has a stacked-layer structure, the bit line can be shortened to a length that is close to the length of the local sense amplifier array 1426. A shorter bit line results in smaller bit line capacitance, which allows the storage capacitance of the memory cell 1445 to be reduced. In addition, providing the switch array 1444 in the local sense amplifier array 1426 allows the number of long bit lines to be reduced. For the reasons described above, a load to be driven during access to the DOSRAM 1400 is reduced, enabling a reduction in power consumption.

The structure described in this embodiment can be used in appropriate combination with the structure described in any of the other embodiments.

Embodiment 6

In this embodiment, an AI system in which the semiconductor device of any of the above-described embodiments is used will be described with reference to FIG. 35.

Figure 35:
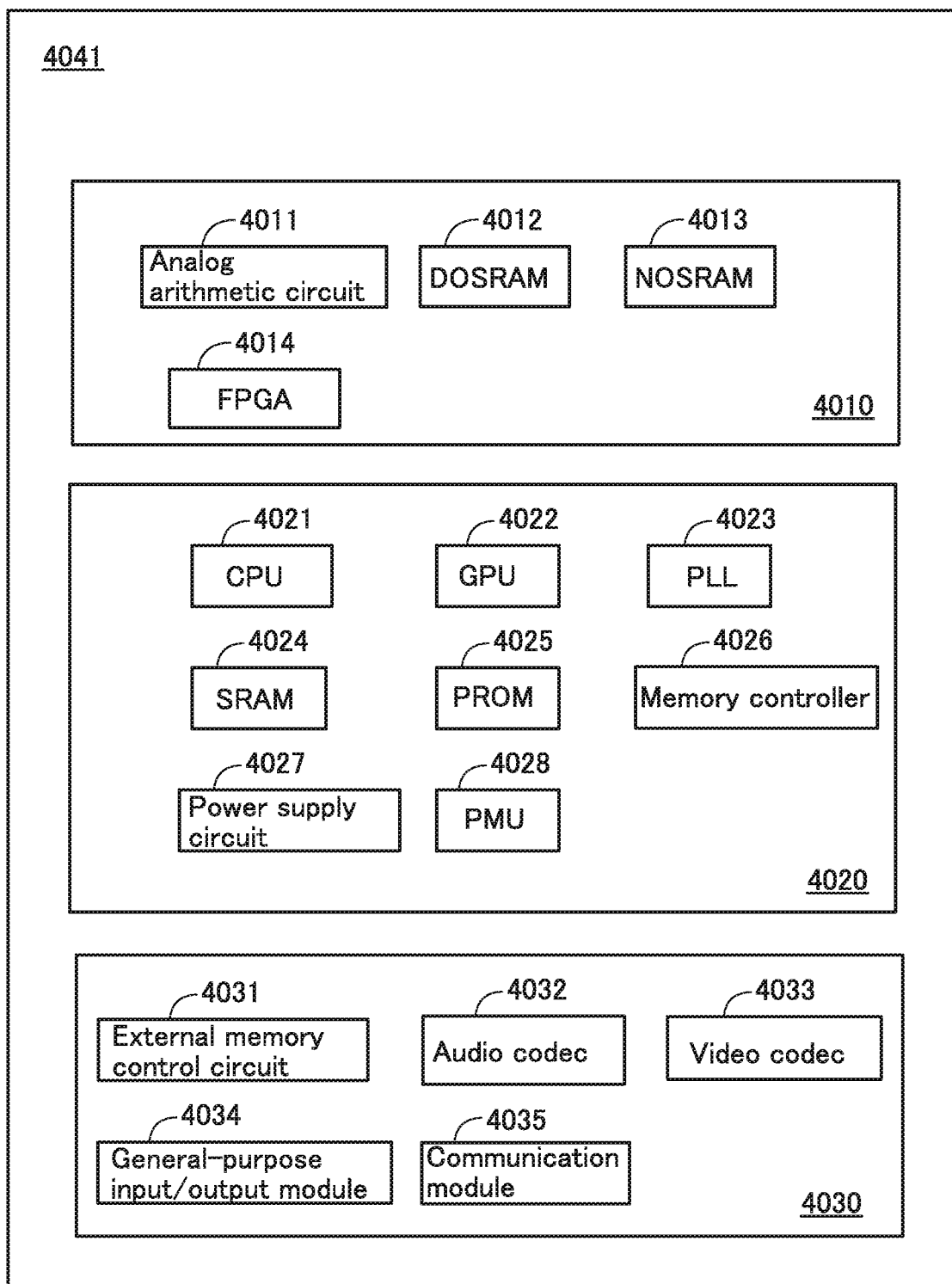
FIG. 35 is a block diagram illustrating a structure example of an AI system of one embodiment of the present invention.

FIG. 35 is a block diagram illustrating a structure example of an AI system 4041. The AI system 4041 includes an arithmetic portion 4010, a control portion 4020, and an input/output portion 4030.

The arithmetic portion 4010 includes an analog arithmetic circuit 4011, a DOSRAM 4012, a NOSRAM 4013, and a field programmable gate array (FPGA) 4014. The DOSRAM 1400 and the NOSRAM 1600 described in the above embodiments can be used as the DOSRAM 4012 and the NOSRAM 4013, respectively. In the FPGA 4014, an OS memory is used for a configuration memory and a register. Here, such an FPGA is referred to as an "OS-FPGA".

The control portion 4020 includes a central processing unit (CPU) 4021, a graphics processing unit (GPU) 4022, a phase locked loop (PLL) 4023, a static random access memory (SRAM) 4024, a programmable read only memory (PROM) 4025, a memory controller 4026, a power supply circuit 4027, and a power management unit (PMU) 4028.

The input/output portion 4030 includes an external memory control circuit 4031, an audio codec 4032, a video codec 4033, a general-purpose input/output module 4034, and a communication module 4035.

The arithmetic portion 4010 can perform neural network learning or neural network inference.

The analog arithmetic circuit 4011 includes an analog/digital (A/D) converter circuit, a digital/analog (D/A) converter circuit, and a product-sum operation circuit.

The analog arithmetic circuit 4011 is preferably formed using an OS transistor. The analog arithmetic circuit 4011 formed using an OS transistor includes an analog memory and can execute a product-sum operation necessary for the learning and the inference with low power consumption.

The DOSRAM 4012 is a DRAM including an OS transistor which temporarily stores digital data sent from the CPU 4021. The DOSRAM 4012 includes a memory cell including an OS transistor and a read circuit portion including a Si transistor. Because the memory cell and the read circuit portion can be provided in different layers that are stacked, the entire circuit area of the DOSRAM 4012 can be small.

In the calculation with the neural network, the number of input data exceeds 1000 in some cases. In the case where the input data are stored in an SRAM, the input data has to be stored piece by piece because of the circuit area limitation and small storage capacity of the SRAM. The DOSRAM 4012 has a larger storage capacity than an SRAM because memory cells of the DOSRAM can be highly integrated even in a limited circuit area. Therefore, the DOSRAM 4012 can efficiently store the input data.

The NOSRAM 4013 is a nonvolatile memory including an OS transistor. The NOSRAM 4013 consumes less power in writing data than the other nonvolatile memories such as a flash memory, a resistive random access memory (ReRAM), and a magnetoresistive random access memory (MRAM). Furthermore, unlike a flash memory and a ReRAM which deteriorate by data writing, the NOSRAM does not have a limit on the number of times of data writing.

Furthermore, the NOSRAM 4013 can store multilevel data of two or more bits as well as one-bit binary data. The multilevel data storage in the NOSRAM 4013 leads to a reduction of the memory cell area per bit.

Because the NOSRAM 4013 can store analog data as well as digital data, the analog arithmetic circuit 4011 can use the NOSRAM 4013 as an analog memory. The NOSRAM 4013 can store analog data as it is, and thus a D/A converter circuit and an A/D converter circuit are unnecessary. Therefore, the area of a peripheral circuit for the NOSRAM 4013 can be reduced. In this specification, analog data refers to data having a resolution of three bits (eight levels) or more. The above-described multilevel data might be included in the analog data.

Data and parameters used in the neural network calculation can be once stored in the NOSRAM 4013. The data and parameters may be stored in a memory provided outside the AI system 4041 via the CPU 4021. However, the NOSRAM 4013 provided inside the AI system 4041 can store the data and parameters more quickly with lower power consumption. Furthermore, the NOSRAM 4013 enables a longer bit line than the DOSRAM 4012 and thus can have an increased storage capacity.

The FPGA 4014 is an FPGA including an OS transistor. By including the FPGA 4014, the AI system 4041 can establish a connection of a neural network such as a deep neural network (DNN), a convolutional neural network (CNN), a recurrent neural network (RNN), an autoencoder, a deep Boltzmann machine (DBM), a deep belief network (DBN), or the like described later, with a hardware. The connection of the neural network with a hardware enables higher speed performance.

The FPGA 4014 is an FPGA including an OS transistor. An OS-FPGA can have a smaller memory area than an FPGA formed using an SRAM. Thus, adding a context switching function only causes a small increase in area. Moreover, an OS-FPGA can transmit data and parameters at high speed by utilizing the boosting.

In the AI system 4041, the analog arithmetic circuit 4011, the DOSRAM 4012, the NOSRAM 4013, and the FPGA 4014 can be provided on one die (chip). Thus, the AI system 4041 can execute neural network calculation at high speed with low power consumption. The analog arithmetic circuit 4011, the DOSRAM 4012, the NOSRAM 4013, and the FPGA 4014 can be manufactured through the same manufacturing process. This enables the AI system 4041 to be manufactured at low cost.

Note that the arithmetic portion 4010 need not necessarily include all of the following: the DOSRAM 4012, the NOSRAM 4013, and the FPGA 4014. One or more memories are selected from the DOSRAM 4012, the NOSRAM 4013, and the FPGA 4014 in accordance with a problem that is desired to be solved in the AI system 4041.

The AI system 4041 can implement a method such as a deep neural network (DNN), a convolutional neural network (CNN), a recurrent neural network (RNN), an autoencoder, a deep Boltzmann machine (DBM), or a deep belief network (DBN) in accordance with the problem that is desired to be solved. The PROM 4025 can store a program for implementing at least one of the methods. Part or the whole of the program may be stored in the NOSRAM 4013.

Most of the existing programs used as libraries are designed on the premise that the programs are processed by a GPU. Therefore, the AI system 4041 preferably includes the GPU 4022. The AI system 4041 can execute the bottleneck product-sum operation among all the product-sum operations used for learning and inference in the arithmetic portion 4010, and execute the other product-sum operations in the GPU 4022. In this manner, the learning and inference can be performed at high speed.

The power supply circuit 4027 generates not only a low power supply potential for a logic circuit but also a potential for an analog operation. The power supply circuit 4027 may include an OS memory. In this case, storing a reference potential in the OS memory can reduce the power consumption of the power supply circuit 4027.

The PMU 4028 is configured to temporarily stop the power supply to the AI system 4041.

As a register in each of the CPU 4021 and the GPU 4022, an OS memory is preferably included. By including the OS memory, each of the CPU 4021 and the GPU 4022 can retain data (logic value) in the OS memory even when power supply is stopped. As a result, the AI system 4041 can save the power.

The PLL 4023 is configured to generate a clock. The AI system 4041 performs an operation on the basis of the clock generated by the PLL 4023. The PLL 4023 preferably includes an OS memory. When an OS memory is included in the PLL 4023, an analog potential with which the clock oscillation frequency is controlled can be held.

The AI system 4041 may store data in an external memory such as a DRAM. For this reason, the AI system 4041 preferably includes the memory controller 4026 functioning as an interface with the external DRAM. Furthermore, the memory controller 4026 is preferably provided near the CPU 4021 or the GPU 4022. Thus, quick data transmission can be achieved.

Some or all of the circuits illustrated in the control portion 4020 can be formed on the same die as the arithmetic portion 4010. Thus, the AI system 4041 can execute neural network calculation at high speed with low power consumption.

Data used for neural network calculation is stored in an external memory device such as a hard disk drive (HDD) or a solid state drive (SSD) in many cases. Therefore, the AI system 4041 preferably includes the external memory control circuit 4031 functioning as an interface with the external memory device.

Because audio and video are often subjects of the learning and inference using the neural network, the AI system 4041 includes the audio codec 4032 and the video codec 4033. The audio codec 4032 encodes and decodes audio data, and the video codec 4033 encodes and decodes video data.

The AI system 4041 can perform learning or make an inference using data obtained from an external sensor. For this reason, the AI system 4041 includes the general-purpose input/output module 4034. The general-purpose input/output module 4034 includes a universal serial bus (USB), an inter-integrated circuit (I2C), or the like, for example.

The AI system 4041 can perform learning or make an inference using data obtained via the Internet. For this reason, the AI system 4041 preferably includes the communication module 4035.

The analog arithmetic circuit 4011 may include a multilevel flash memory as an analog memory. However, the flash memory has a limit on the number of rewriting times. In addition, the multi-level flash memory is extremely difficult to embed; in other words, the arithmetic circuit and the memory are difficult to form on the same die.

Alternatively, the analog arithmetic circuit 4011 may include a ReRAM as an analog memory. However, the ReRAM has a limit on the number of rewriting times and also has a problem in storage accuracy. Moreover, because the ReRAM is a two-terminal element, the complicated circuit design is necessary for separating data writing and data reading.

Further alternatively, the analog arithmetic circuit 4011 may include an MRAM as an analog memory. However, the MRAM has a problem in storage accuracy because of its low magnetoresistive ratio.

In consideration of the above, an OS memory is preferably used as an analog memory in the analog arithmetic circuit 4011.

The structure described in this embodiment can be used in appropriate combination with the structure described in any of the other embodiments.

Embodiment 7

<Application Example of AI System>

In this embodiment, application examples of the AI system described in the above embodiment will be described with reference to FIGS. 36A and 36B.

Figure 36A:
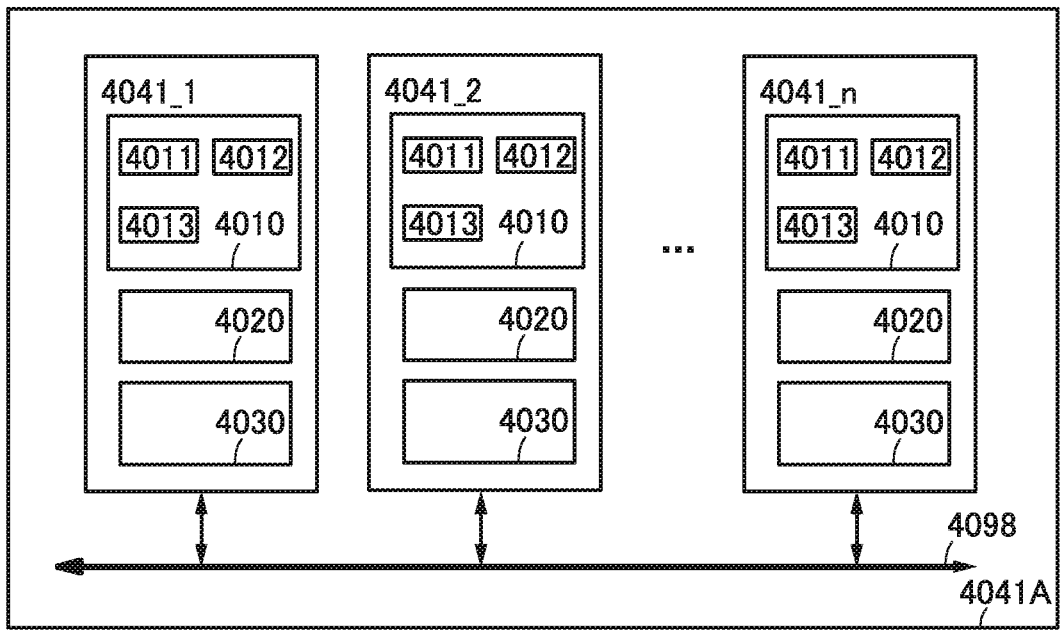
FIGS. 36A and 36B are block diagrams each illustrating an application example of an AI system of one embodiment of the present invention.

FIG. 36A illustrates an AI system 4041A in which the AI systems 4041 described with reference to FIG. 35 are arranged in parallel and a signal can be transmitted between the systems via a bus line.

The AI system 4041A illustrated in FIG. 36A includes AI systems 4041_1 to 4041_n (n is a natural number). The AI systems 4041_1 to 4041_n are connected to each other via a bus line 4098.

Figure 36B:
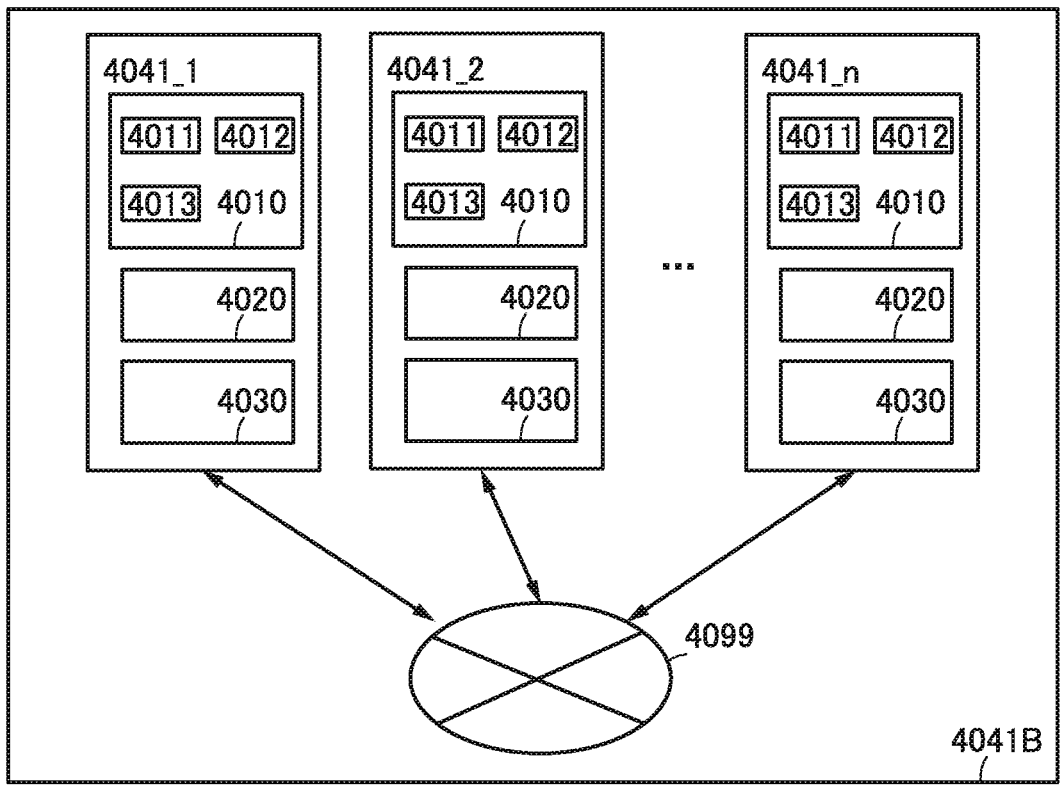

FIG. 36B illustrates an AI system 4041B in which the AI systems 4041 described with FIG. 35 are arranged in parallel as in FIG. 36A and a signal can be transmitted between the systems via a network.

The AI system 4041B illustrated in FIG. 36B includes the AI systems 4041_1 to 4041_n. The AI systems 4041_1 to 4041_n are connected to each other via a network 4099.

A communication module is provided in each of the AI systems 4041_1 to 4041_n; such a configuration enables wireless or wired communication via the network 4099. A communication module can communicate via an antenna. Communication can be performed when an electronic device is connected to a computer network such as the Internet (infrastructure of the World Wide Web, WWW), an intranet, an extranet, a personal area network (PAN), a local area network (LAN), a campus area network (CAN), a metropolitan area network (MAN), a wide area network (WAN), or a global area network (GAN), for example. In the case of performing wireless communication, it is possible to use, as a communication protocol or a communication technology, a communications standard such as Long-Term Evolution (LTE), Global System for Mobile Communication (GSM: registered trademark), Enhanced Data Rates for GSM Evolution (EDGE), Code Division Multiple Access 2000 (CDMA2000), or W-CDMA (registered trademark), or a communications standard developed by IEEE such as Wi-Fi (registered trademark), Bluetooth (registered trademark), or ZigBee (registered trademark).

With the configuration illustrated in FIG. 36A or FIG. 36B, analog signals obtained with external sensors or the like can be processed by different AI systems. For example, analog signals containing biological information such as brain waves, a pulse, blood pressure, and body temperature obtained with a variety of sensors such as a brain wave sensor, a pulse wave sensor, a blood pressure sensor, and a temperature sensor can be processed by different AI systems. Since each of the AI systems performs signal processing or learning, the amount of information processed by each AI system can be reduced. Accordingly, the signal processing or learning requires a smaller amount of arithmetic processing. As a result, recognition accuracy can be increased. With the use of data obtained with each AI system, biological information that irregularly changes should be able to be collectively grasped instantly.

The structure described in this embodiment can be used in appropriate combination with the structure described in any of the other embodiments.

Embodiment 8

This embodiment shows an example of an IC incorporating the AI system described in the above embodiment.

In the AI system described in the above embodiment, a digital processing circuit (e.g., a CPU) that includes a Si transistor, an analog arithmetic circuit that includes an OS transistor, an OS-FPGA, and an OS memory (e.g., a DOSRAM or a NOSRAM) can be integrated into one die.

Figure 37:
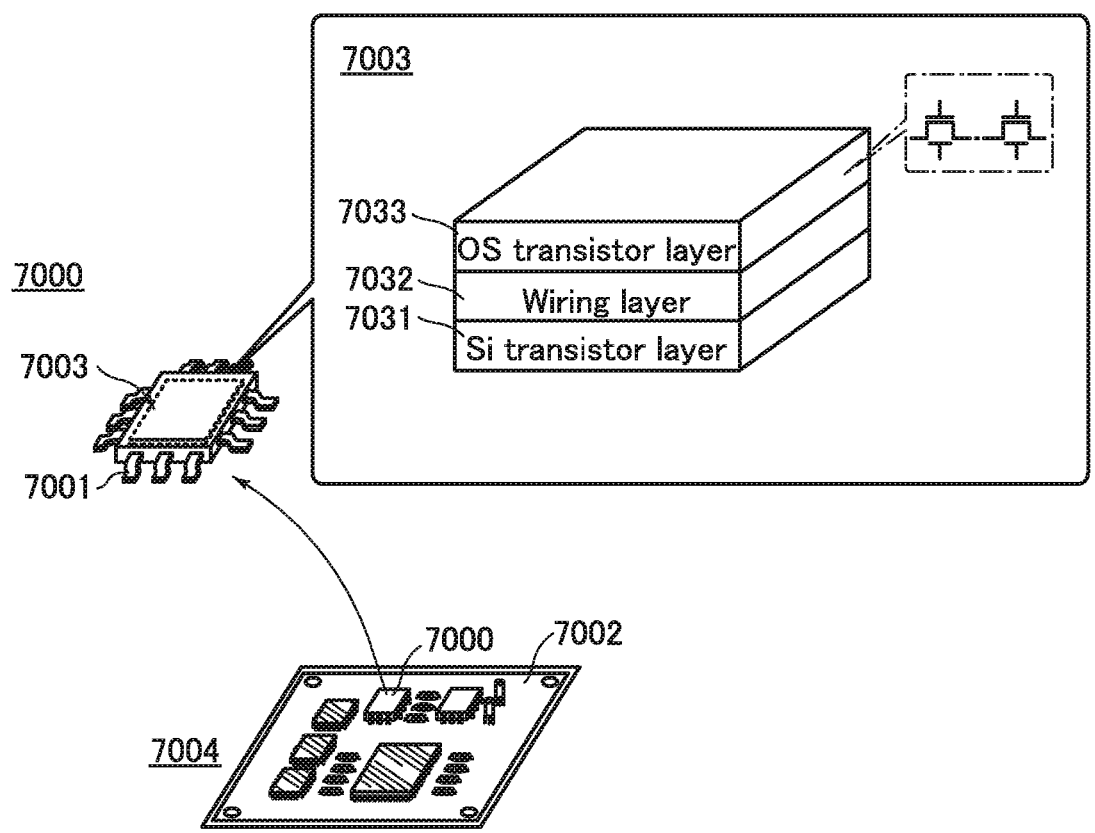
FIG. 37 is a schematic perspective view illustrating a structure example of an IC incorporating an AI system of one embodiment of the present invention.

FIG. 37 illustrates the example of the IC incorporating the AI system. An AI system IC 7000 illustrated in FIG. 37 includes a lead 7001 and a circuit portion 7003. The AI system IC 7000 is mounted on a printed circuit board 7002, for example. A plurality of such IC chips are combined and electrically connected to each other on the printed circuit board 7002; thus, a circuit board on which electronic components are mounted (a circuit board 7004) is formed. In the circuit portion 7003, the circuits described in the above embodiment are provided on one die. The circuit portion 7003 has a stacked-layer structure as described in the above embodiment, which is broadly divided into a Si transistor layer 7031, a wiring layer 7032, and an OS transistor layer 7033. Since the OS transistor layer 7033 can be stacked over the Si transistor layer 7031, the size of the AI system IC 7000 can be easily reduced.

Although a Quad Flat Package (QFP) is used as a package of the AI system IC 7000 in FIG. 37, the package is not limited thereto.

The digital processing circuit (e.g., a CPU), the analog arithmetic circuit that includes an OS transistor, the OS-FPGA, and the OS memory (e.g., a DOSRAM or a NOSRAM) can all be formed in the Si transistor layer 7031, the wiring layer 7032, and the OS transistor layer 7033. In other words, elements included in the AI system can be formed through the same manufacturing process. Thus, the number of steps in the manufacturing process of the IC described in this embodiment does not need to be increased even when the number of elements is increased, and accordingly the AI system can be incorporated into the IC at low cost.

The structure described in this embodiment can be used in appropriate combination with the structure described in any of the other embodiments.

Embodiment 9

<Electronic Device>

The semiconductor device of one embodiment of the present invention can be used for a variety of electronic devices. FIGS. 38A and 38B and FIGS. 39A to 39F illustrate specific examples of the electronic devices each including the semiconductor device of one embodiment of the present invention.

Figure 38A:
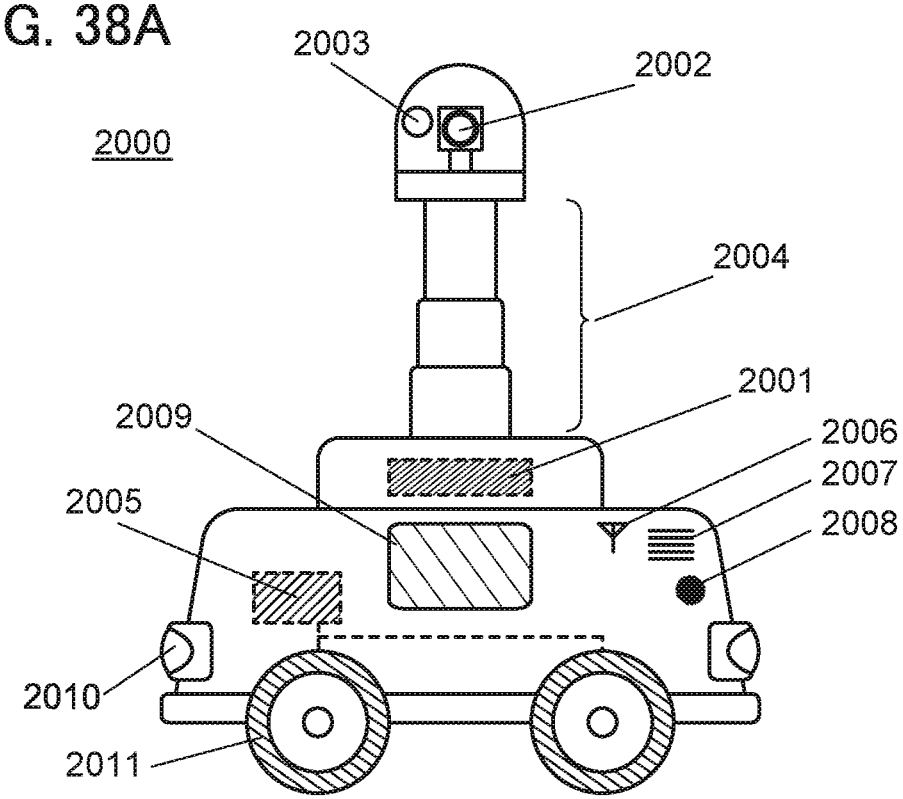
FIGS. 38A and 38B illustrate an electronic device of one embodiment of the present invention.

A robot 2000 illustrated in FIG. 38A includes an arithmetic device 2001, a sensor 2002, a light 2003, a lift 2004, a driver portion 2005, and a moving mechanism 2011, and can take a still image and a moving image while being moved. Such a robot can be used for a security system or a monitoring system.

The robot 2000 may further include a communication means 2006, a speaker 2007, a microphone 2008, a display portion 2009, a light-emitting portion 2010, and the like.

For the arithmetic device 2001, the semiconductor device of one embodiment of the present invention can be used. In the arithmetic device 2001, an IC in which the AI system of one embodiment of the present invention is incorporated can be used. The sensor 2002 functions as a camera which takes images of surroundings of the robot 2000. The light 2003 can be used when the images of the surroundings of the robot 2000 are taken by the sensor 2002. When a still image is taken by the sensor 2002, the light 2003 preferably functions as a flashlight. The sensor 2002 is connected to a main body of the robot via the lift 2004. The height of the sensor 2002 can be adjusted by the lift 2004. The lift 2004 is preferably telescopic. Alternatively, the lift 2004 may be a foldable lift composed of a plurality of booms. The robot 2000 including the driver portion 2005 and the moving mechanism 2011 connected to the driver portion 2005 is preferably used, in which case an imaging range of the sensor 2002, that is, a monitoring range, is expanded.

The communication means 2006 can send data taken by the sensor 2002 to a manager or the server owned by the manager. In addition, when the occurrence of an emergency such as a crime, an accident, or a fire is judged after the arithmetic device 2001 analyzes the image taken by the sensor 2002, the communication means 2006 can report to the security company, the police, the fire station, the medical institution, or the owner of the land or the building. The speaker 2007 can transmit information such as an alert to a criminal, a call to an injured person or an emergency patient, and evacuation guidance, to the surroundings of the robot. The microphone 2008 can be used to obtain sounds around the robot 2000. The use of the communication means 2006 and the speaker 2007 enables the robot 2000 to function as a telephone. A person around the robot 2000 can have a conversation with the manager or a specific person. The display portion 2009 can display specific data. In emergency, the disaster information and the evacuation route can be displayed. The use of the communication means 2006, the speaker 2007, and the microphone 2008 enables the robot 2000 to function as the videophone. A person around the robot 2000 can have a conversation with the manager or a given person while seeing the display portion 2009.

The light-emitting portion 2010 emits light or displays characters to show the direction of movement and the stopped state of the robot 2000. In addition, emergency may also be shown.

Figure 38B:
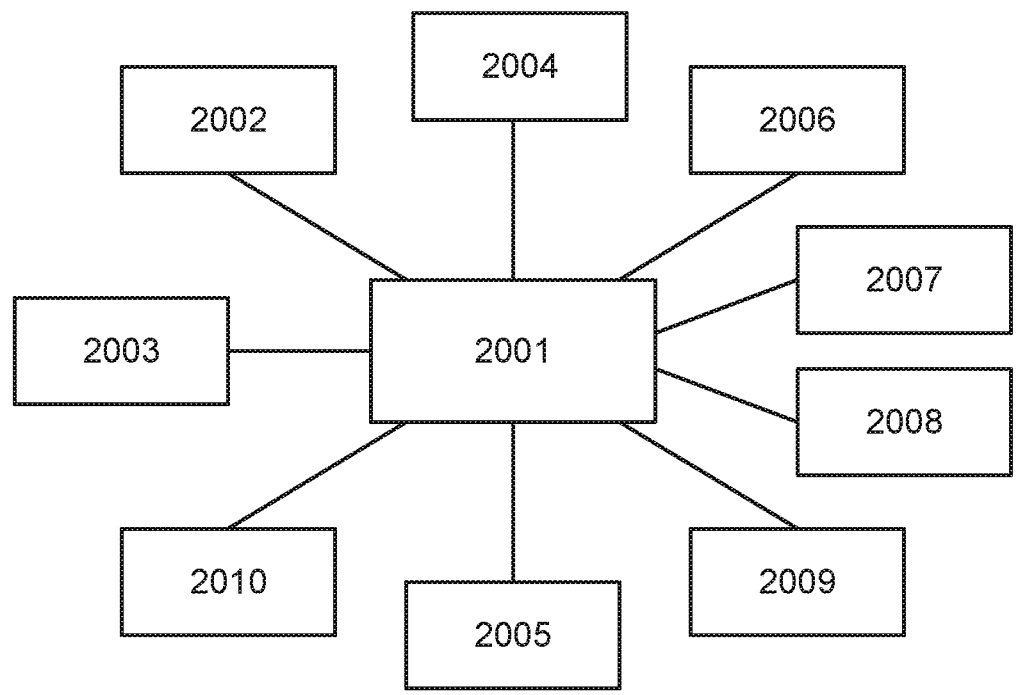

FIG. 38B is a block diagram illustrating a configuration of the robot 2000. The arithmetic device 2001 adjusts turning on or off and the brightness of the light 2003 from data such as an image obtained by the sensor 2002. In addition, the height of the lift 2004 is adjusted or the driver portion 2005 is controlled to align the positions of the robot 2000 and the sensor 2002. The operating condition of the driver portion 2005 can be shown by using the light-emitting portion 2010. With the communication means 2006, information around the robot 2000 obtained from the sensor 2002 and the microphone 2008 can be transmitted to the manager or the server owned by the manager. Depending on the judgement of the arithmetic device 2001 or the manager, information can be sent to the surroundings of the robot 2000 with the speaker 2007 and the display portion 2009.

In the case where a sensor that can take an image even in dark surroundings is used as the sensor 2002, the light 2003 is not necessarily provided. As such a sensor, an image sensor containing selenium (Se) in the light receiving portion can be used.

The robot 2000 can be used in commercial facilities and for security of the office. Data obtained from the sensor 2002 and the microphone 2008 is stored in the arithmetic device 2001 or the server. The stored data is analyzed by an AI system to check whether there is an unusual situation such as loss or damage of an object, entry of suspicious individual, or disaster such as a fire. For the data analysis, deep learning may be used. When there is an unusual situation, the robot 2000 performs report to the manager and transmits information to the surroundings, and records the conditions of the surroundings.

The robot 2000 may be used for monitoring the growing conditions of the crops. The robot 2000 placed in a rice field or a field monitors the shapes, the sizes, or the colors of leaves or fruit by the sensor 2002 to check whether the crops are damaged or not or whether the crops are harmed by pests or not. Since the moving mechanism 2011 is provided for the robot 2000, the growing conditions of the crops can be monitored in a wide range. In addition, since the robot 2000 is provided with the lift 2004, the leaves and fruit at a certain height can be monitored regardless of the kind of crops and the growing conditions. The monitoring results are transmitted to a grower using the communication means 2006, and the grower can determine the kind, the amount, and the spraying timing of fertilizer and agricultural chemicals necessary for the crops. Alternatively, the monitoring results may be analyzed with an AI system using the arithmetic device 2001, and the kind, the amount, and the spraying timing of fertilizer and agricultural chemicals necessary for the crops may be determined and reported to the grower. Deep learning may be used for analysis of the monitoring results.

Figure 39A:
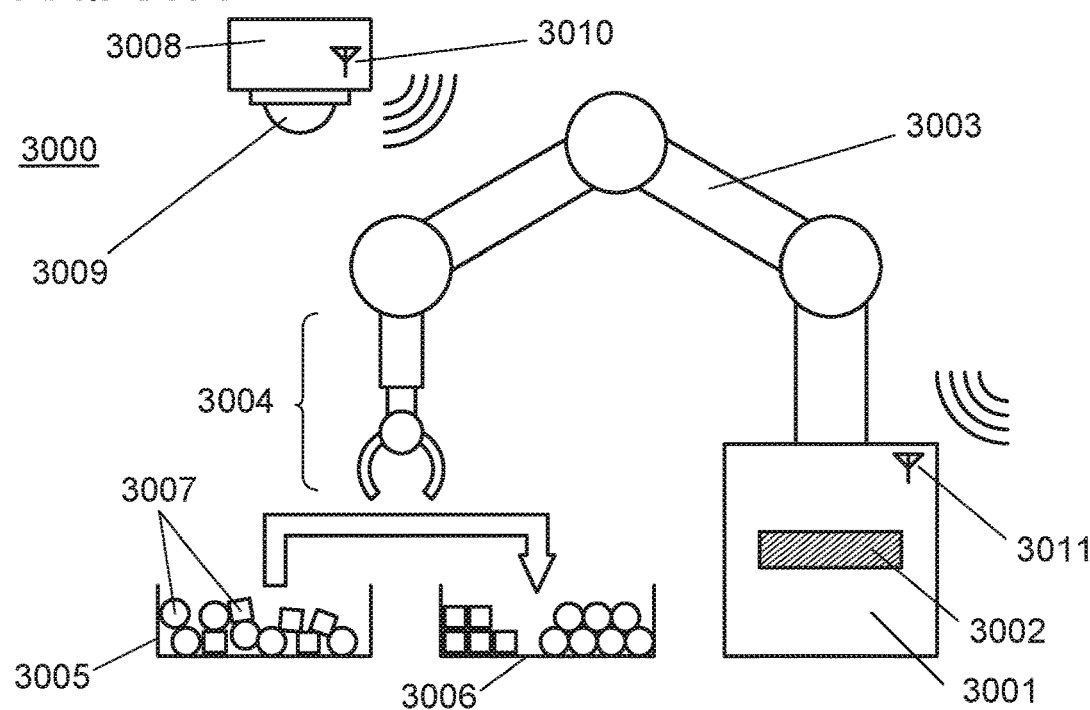
FIGS. 39A to 39F illustrate an electronic device of one embodiment of the present invention.

FIG. 39A illustrates a sorting system 3000 using a robot 3001. The robot 3001 includes an arithmetic device 3002, a boom 3003, and an arm 3004. The robot 3001 may further include a wired or wireless communication means 3011. In addition, the sorting system 3000 includes a housing 3008 including a sensor 3009. The housing 3008 includes a communication means 3010. The housing 3008 is provided for a ceiling, a wall, or a beam (not illustrated) of the sorting system 3000 or a sorting operation area. The housing 3008 may be provided in the robot 3001. For example, the housing 3008 may be provided for the boom 3003 or the arm 3004. In the case where the housing 3008 is provided in the robot 3001, data obtained by the sensor 3009 may be transmitted to the arithmetic device 3002 without passing through the communication means 3010 or the communication means 3011, and processed.

The boom 3003 is movable, whereby the arm 3004 can be placed at a desired position. The arm 3004 may be telescopic. The arm 3004 placed over a desired object 3007 may be stretched to grab the desired object 3007, shortened, and then moved by the boom 3003.

The sorting system 3000 can transfer the object 3007 in a container 3005 to a container 3006. The container 3005 and the container 3006 may have the same shape or different shapes. Furthermore, a plurality of objects 3007 put in one container 3005 may be moved separately to a plurality of containers 3006.

As the container 3005 and the container 3006, a container, a cardboard box, a box for packing a product, a case, a film, a bag, a tray for storing foods, a lunch box, or the like is used. Furthermore, at least one of the container 3005 and the container 3006 may be cooking utensils such as a pot or a frying pan.

For the arithmetic device 3002, the semiconductor device of one embodiment of the present invention can be used. In the arithmetic device 3002, an IC in which the AI system of one embodiment of the present invention is incorporated can be used.

The sensor 3009 receives the positions or the number of containers 3005, the positions or the number of containers 3006, the state of the inside of the container 3005, and the state of the object 3007 in the container 3005 and transmits the data to the arithmetic device 3002 using the communication means 3010. Transmission of data is performed with or without a wire. Alternatively, the data may be transmitted through a wire without the communication means 3010. The arithmetic device 3002 analyzes the transmitted data. Here, the state of the object 3007 indicates the shape or the number of the objects 3007, the overlap between the objects 3007, or the like. The arithmetic device 3002 performs analyzation on the basis of information from the sensor 3009 and obtains detailed information of the object 3007. The three-dimensional shape and hardness (or softness) of the object 3007 are obtained by comparison with the data stored in the arithmetic device 3002 or the server that can be communicated with the robot 3001. Depending on the three-dimensional shape and hardness (or softness) of the object 3007, the shape of the arm 3004 can be changed. Furthermore, depending on the shape or the size of the object 3007, the position in the container 3006 may be changed or a plurality of containers 3006 may be provided to sort the objects 3007.

To obtain the detailed data of the object 3007, analysis using an AI system can be utilized. Deep learning may be used to analyze the data.

Figure 39B:
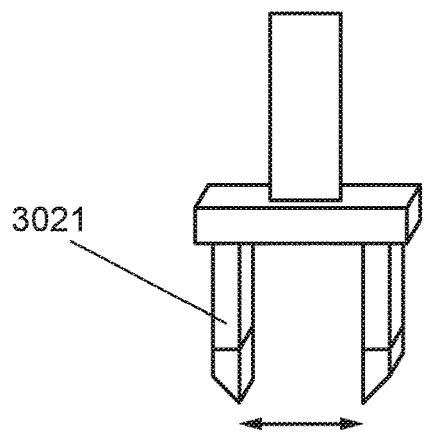
Figure 39C:
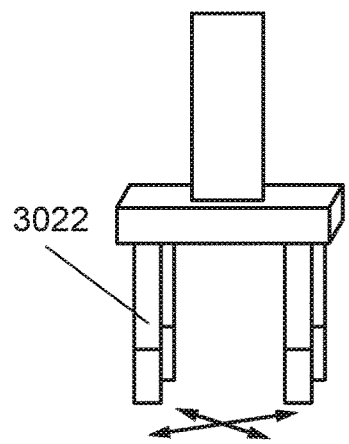
Figure 39D:
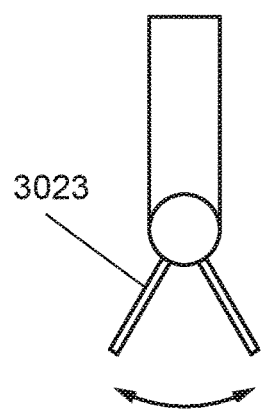
Figure 39E:
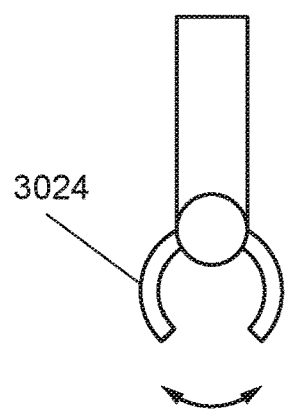
Figure 39F:
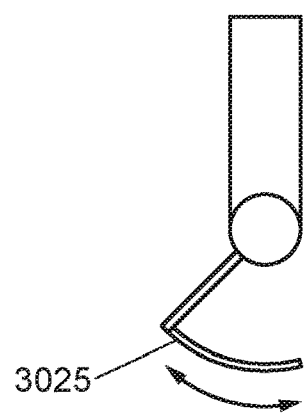

FIG. 39B illustrates an arm in which a pair of plates 3021 can move in the horizontal direction to pick up the object 3007. The pair of plates 3021 moves toward the center horizontally, whereby the object 3007 can be picked up. Such an arm can hold a surface of the object 3007, and is suitable for picking up the object 3007 with a columnar shape, such as a cube or a rectangular solid. FIG. 39C illustrates an arm in which a plurality of bars 3022 can move in the horizontal direction to pick up the object 3007. The plurality of bars 3022 move toward the center horizontally, whereby the object 3007 can be picked up. Such an arm can pinch a point of the object 3007, and is suitable for picking up the object 3007 in a spherical shape or in a non-fixed shape, that is, the object 3007 in an irregular shape. Note that although the number of the bars 3022 is four in FIG. 39C, this embodiment is not limited to this structure. The number of the bars 3022 may be three or five or more. FIG. 39D illustrates an arm in which a pair of plates 3023 rotates around the common axis to be closer to each other to pick up the object 3007. Such an arm can hold a surface of the object 3007, and is suitable for picking up the object 3007 with a thin-film shape, such as paper or films. FIG. 39E illustrates an arm in which a pair of crook-shaped plates 3024 rotates around the common axis such that the ends of them are closer to each other to pick up the object 3007. Such an arm can pinch a point or a side of the object 3007, and is suitable for picking up the object 3007 with a thin-film shape, such as paper or films or the object 3007 with a smaller particulate shape. As illustrated in FIG. 39F, a spatula 3025 may be attached to the tip of the arm, and the object 3007 with a smaller particulate shape may be scooped.

The arms illustrated in FIGS. 39A to 39F are just examples and one embodiment of the present invention is not limited to these shapes. In addition, the application of the arms is just an example and one embodiment of the present invention is not limited thereto.

The robot 3001 moves the boom 3003 to move the arm 3004 to a position over the desired object 3007 in the container 3005 on the basis of signals from the arithmetic device 3002. In the case of using the telescopic arm 3004, the arm 3004 is stretched, and the tip of the arm 3004 is brought down to a position on the same level as the object 3007. The tip of the arm is moved to catch the desired object 3007. The arm is shortened while catching the object 3007. The boom 3003 is moved again to transfer the arm 3004 to the desired position in the container 3006. At this time, the arm 3004 may be rotated to adjust the angle of the object 3007 to the container 3006. The arm 3004 is stretched to place the object 3007 in the container 3006, and the arm 3004 releases the object 3007. The above operation is repeated, so that the robot 3001 can move the objects 3007 from the container 3005 to the container 3006.

Since the positional information on the containers 3005 and 3006 and the state of the object 3007 are analyzed using the AI system, the object 3007 can be moved surely regardless of the shape or hardness of the object 3007. Examples of the object 3007 include not only an object packed in a box with a shape of a cube or a rectangular solid or a box or a case with a given shape but also shaped processed foods such as an egg, a hamburger steak, and a croquette, foods such as vegetables with an irregular shape such as a potato and a tomato, machine parts such as a screw and a nut, a thin film of a paper or a film, and the like. Since in the sorting system 3000 in this embodiment, the shape of the arm can be changed in consideration of the shape and the hardness of the object 3007, the objects 3007 given above as examples can be transferred from the container 3005 to the container 3006 regardless of the shape and the hardness.

A memory device including the semiconductor device of one embodiment of the present invention can hold control data, a control program, or the like of the above electronic device for a long time. With the use of the semiconductor device of one embodiment of the present invention, a highly reliable electronic device can be provided.

An IC in which the above AI system is incorporated can be used for the arithmetic device or the like of the above-described electronic device, for example. Accordingly, the electronic device of this embodiment can perform optimal operations depending on circumstances with low power consumption by utilizing the AI system.

This embodiment can be implemented in an appropriate combination with any of the structures described in the other embodiments, examples, and the like.

Embodiment 10

In this embodiment, application examples of the memory device using the semiconductor device described in the above embodiment will be described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desk-top computers, but also to large computers such as server systems. Alternatively, the semiconductor device described in the above embodiment is applied to removable memory devices such as memory cards (e.g., SD cards), USB memories, and solid state drives (SSD). FIGS. 40A to 40E schematically illustrate some structural examples of removable memory devices. A packaged memory chip including the semiconductor device described in the above embodiment is used in a variety of storage devices and removable memories, for example.

Figure 40A:
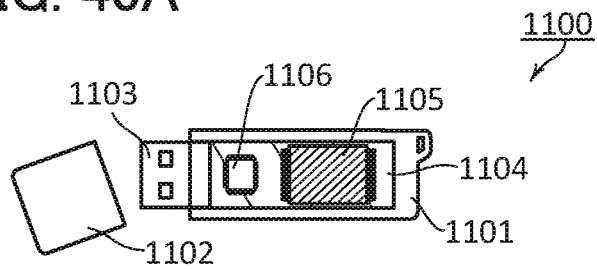
FIGS. 40A to 40E illustrate electronic devices of embodiments of the present invention.

FIG. 40A is a schematic diagram of a USB memory. A USB memory 1100 includes a housing 1101, a cap 1102, a USB connector 1103, and a substrate 1104. The substrate 1104 is held in the housing 1101. For example, a memory chip 1105 and a controller chip 1106 are attached to the substrate 1104. The semiconductor device described in the above embodiment can be incorporated in the memory chip 1105 or the like on the substrate 1104.

Figure 40B:
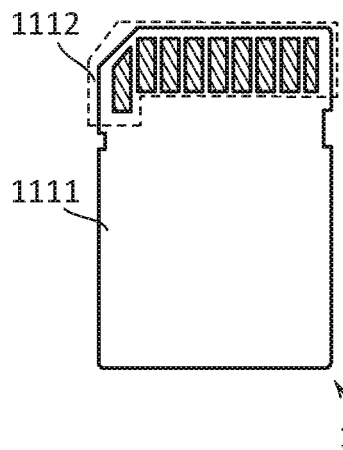
Figure 40C:
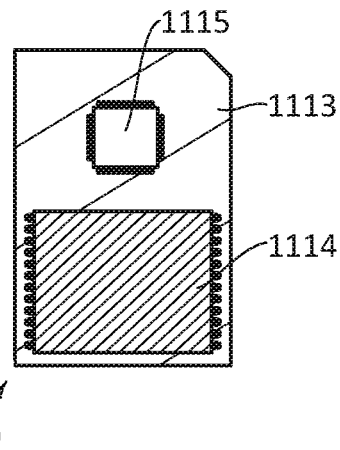

FIG. 40B is a schematic external diagram of an SD card, and FIG. 40C is a schematic diagram illustrating the internal structure of the SD card. An SD card 1110 includes a housing 1111, a connector 1112, and a substrate 1113. The substrate 1113 is held in the housing 1111. For example, a memory chip 1114 and a controller chip 1115 are attached to the substrate 1113. When the memory chip 1114 is also provided on the back side of the substrate 1113, the capacity of the SD card 1110 can be increased. In addition, a wireless chip with a radio communication function may be provided on the substrate 1113. With such a wireless chip, the memory chip 1114 can read and write data by radio communication between the host device and the SD card 1110. The semiconductor device described in the above embodiment can be incorporated in the memory chip 1114 or the like on the substrate 1113.

Figure 40D:
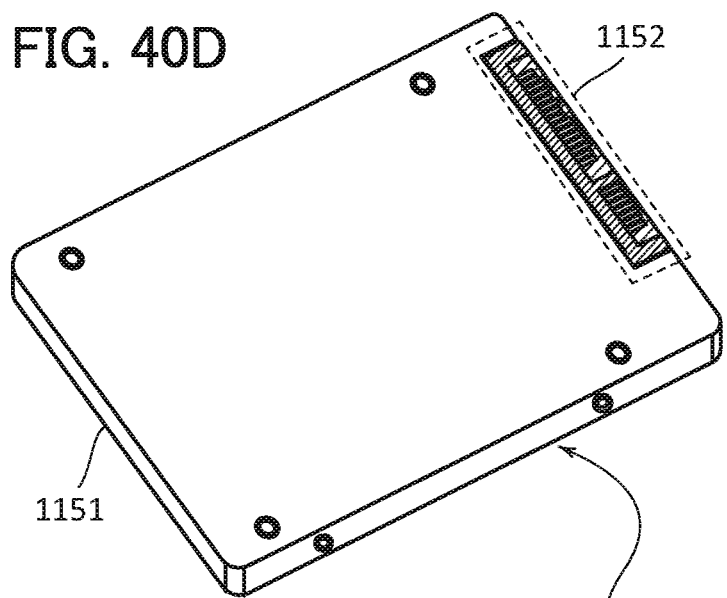
Figure 40E:
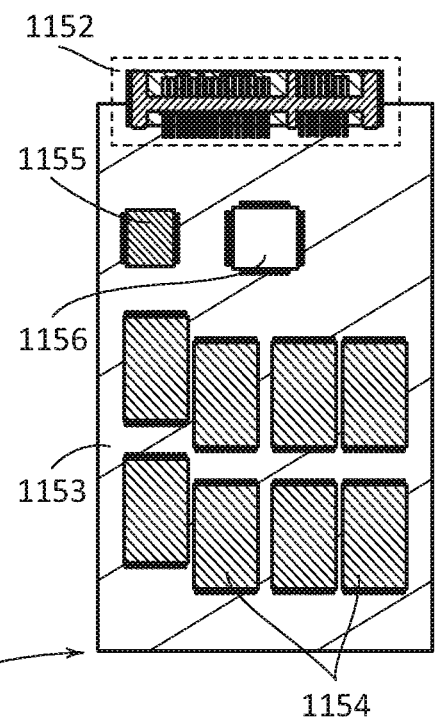

FIG. 40D is a schematic external diagram of an SSD, and FIG. 40E is a schematic diagram illustrating the internal structure of the SSD. An SSD 1150 includes a housing 1151, a connector 1152, and a substrate 1153. The substrate 1153 is held in the housing 1151. For example, a memory chip 1154, a memory chip 1155, and a controller chip 1156 are attached to the substrate 1153. The memory chip 1155 is a work memory of the controller chip 1156, and a DRAM chip may be used, for example. When the memory chip 1154 is also provided on the back side of the substrate 1153, the capacity of the SSD 1150 can be increased. The semiconductor device described in the above embodiment can be incorporated in the memory chip 1154 or the like on the substrate 1153.

The structure described in this embodiment can be used in appropriate combination with the structure described in any of the other embodiments.

REFERENCE NUMERALS

100: capacitor, 100a: capacitor, 100b: capacitor, 110: conductor, 112: conductor, 120: conductor, 130: insulator, 140: insulator, 150: insulator, 160: conductor, 200: transistor, 200a: transistor, 200b: transistor, 203: conductor, 203a: conductor, 203b: conductor, 205: conductor, 205a: conductor, 205b: conductor, 210: insulator, 212: insulator, 214: insulator, 216: insulator, 218: conductor, 220: insulator, 222: insulator, 224: insulator, 226: insulator, 230: oxide, 230a: oxide, 230A: oxide film, 230b: oxide, 230B: oxide film, 230c: oxide, 230C: oxide film, 231: region, 231a: region, 231b: region, 232: region, 232a: region, 232b: region, 234: region, 239: region, 240: conductor, 240a: conductor, 240A: conductive film, 240b: conductor, 242: conductor, 242a: conductor, 242A: conductive film, 242b: conductor, 242B: conductor, 243: region, 243a: region, 243b: region, 244: insulator, 244A: insulator, 245: opening, 246: conductor, 246A: conductor, 248: conductor, 250: insulator, 250a: insulator, 250A: insulator, 250b: insulator, 250B: insulator, 250C: insulator, 252: insulator, 260: conductor, 260a: conductor, 260A: conductive film, 260b: conductor, 260B: conductive film, 260C: conductor, 270: insulator, 270A: insulator, 272: insulator, 272A: insulator, 273: insulator, 273A: insulator, 280: insulator, 281: insulator, 282: insulator, 286: insulator, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 400: transistor, 600: cell, 601: cell, 1001: wiring, 1002: wiring, 1003: wiring, 1004: wiring, 1005: wiring, 1006: wiring, 1100: USB memory, 1101: housing, 1102: cap, 1103: USB connector, 1104: substrate, 1105: memory chip, 1106: controller chip, 1110: SD card, 1111: housing, 1112: connector, 1113: substrate, 1114: memory chip, 1115: controller chip, 1150: SSD, 1151: housing, 1152: connector, 1153: substrate, 1154: memory chip, 1155: memory chip, 1156: controller chip, 1400: DOSRAM, 1405: controller, 1410: row circuit, 1411: decoder, 1412: word line driver circuit, 1413: column selector, 1414: sense amplifier driver circuit, 1415: column circuit, 1416: global sense amplifier array, 1417: input/output circuit, 1420: sense amplifier array, 1422: memory cell array, 1423: sense amplifier array, 1425: local memory cell array, 1426: local sense amplifier array, 1444: switch array, 1445: memory cell, 1445a: memory cell, 1445b: memory cell, 1446: sense amplifier, 1447: global sense amplifier, 1600: NOSRAM, 1610: memory cell array, 1611: memory cell, 1612: memory cell, 1613: memory cell, 1614: memory cell, 1615: memory cell, 1615a: memory cell, 1615b: memory cell, 1640: controller, 1650: row driver, 1651: row decoder, 1652: word line driver, 1660: column driver, 1661: column decoder, 1662: driver, 1663: DAC, 1670: output driver, 1671: selector, 1672: ADC, 1673: output buffer, 2000: robot, 2001: arithmetic device, 2002: sensor, 2003: light, 2004: lift, 2005: driver portion, 2006: communication means, 2007: speaker, 2008: microphone, 2009: display portion, 2010: light-emitting portion, 2011: moving mechanism, 3000: system, 3001: robot, 3002: arithmetic device, 3003: boom, 3004: arm, 3005: container, 3006: container, 3007: object, 3008: housing, 3009: sensor, 3010: communication means, 3011: communication means, 3021: plate, 3022: bar, 3023: plate, 3024: plate, 3025: spatula, 4010: arithmetic portion, 4011: analog arithmetic circuit, 4012: DOSRAM, 4013: NOSRAM, 4014: FPGA, 4020: control portion, 4021: CPU, 4022: GPU, 4023: PLL, 4025: PROM, 4026: memory controller, 4027: power supply circuit, 4028: PMU, 4030: input/output portion, 4031: external memory control circuit, 4032: audio codec, 4033: video codec, 4034: general-purpose input/output module, 4035: communication module, 4041: AI system, 4041_n: AI system, 4041_1: AI system, 4041A: AI system, 4041B: AI system, 4098: bus line, 4099: network, 7000: AI system IC, 7001: lead, 7002: printed circuit board, 7003: circuit portion, 7004: circuit board, 7031: Si transistor layer, 7032: wiring layer, 7033: OS transistor layer.

This application is based on Japanese Patent Application Serial No. 2017-151412 filed with Japan Patent Office on Aug. 4, 2017, the entire contents of which are hereby incorporated by reference.

The invention claimed is:

1. A semiconductor device comprising:
an oxide;
a first conductor and a second conductor over the oxide;
a third conductor over the oxide;
a first insulator between the oxide and the third conductor, the first insulator covering a first side surface of the third conductor and a second side surface of the third conductor;
a second insulator over the third conductor and the first insulator;
a third insulator over the first conductor and in contact with a first side surface of the second insulator;
a fourth insulator over the second conductor and in contact with a second side surface of the second insulator;

a fourth conductor in contact with a top surface and a side surface of the third insulator, the fourth conductor electrically connected to the first conductor; and
a fifth conductor in contact with a top surface and a side surface of the fourth insulator, the fifth conductor electrically connected to the second conductor,
wherein the first insulator is between the third insulator and the first side surface of the third conductor, and
wherein the first insulator is between the fourth insulator and the second side surface of the third conductor.

2. The semiconductor device according to claim 1,
wherein the first insulator has a first thickness between the oxide and the third conductor and a second thickness between the third conductor and each of the first conductor and the second conductor, and
wherein the first thickness is smaller than the second thickness.

3. The semiconductor device according to claim 1,
wherein the first insulator comprises a fifth insulator between the oxide and the third conductor and comprises the fifth insulator and a sixth insulator between the third conductor and each of the first conductor and the second conductor.

4. The semiconductor device according to claim 1, further comprising:
a seventh insulator; and
an eighth insulator,
wherein the seventh insulator is between the first conductor and the third insulator,
wherein the seventh insulator is an oxide comprising at least one of aluminum and hafnium,
wherein the eighth insulator is between the second conductor and the fourth insulator, and
wherein the eighth insulator is an oxide comprising at least one of aluminum and hafnium.

5. The semiconductor device according to claim 1, further comprising a ninth insulator,
wherein the ninth insulator is between the third conductor and the first insulator, and
wherein the ninth insulator is an oxide comprising at least one of aluminum and hafnium.

6. The semiconductor device according to claim 1, wherein the second insulator comprises an oxide comprising at least one of aluminum and hafnium or a nitride comprising silicon.

7. The semiconductor device according to claim 1, wherein the third insulator and the fourth insulator comprise an oxide comprising at least one of aluminum and hafnium or a nitride comprising silicon.

8. The semiconductor device according to claim 1,
wherein the oxide comprises In, an element M, and Zn, and
wherein the element M is Al, Ga, Y, or Sn.

9. The semiconductor device according to claim 1, wherein the first conductor and the second conductor comprise at least one of aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum.

10. The semiconductor device according to claim 1, wherein the first conductor and the second conductor comprise at least one of tantalum nitride, titanium nitride, a nitride comprising titanium and aluminum, a nitride comprising tantalum and aluminum, ruthenium oxide, ruthenium nitride, an oxide comprising strontium and ruthenium, and an oxide comprising lanthanum and nickel.

11. The semiconductor device according to claim 1, further comprising a second oxide,
wherein the second oxide is between the oxide and the third first insulator, and
wherein the second oxide is in contact with a side surface of the first conductor and a side surface of the second conductor.

12. A semiconductor device comprising:
an oxide;
a first conductor and a second conductor over the oxide;
a third conductor over the oxide;
a first insulator between the oxide and the third conductor, the first insulator covering a side surface of the third conductor;
a fourth conductor in contact with a top surface of the first conductor; and
a fifth conductor in contact with a top surface of the second conductor,
wherein the first insulator is between the first conductor and the third conductor,
wherein the first insulator is between the second conductor and the third conductor,
wherein the first insulator has a first thickness between the oxide and the third conductor and a second thickness between the third conductor and each of the first conductor and the second conductor, and
wherein the first thickness is smaller than the second thickness.

13. The semiconductor device according to claim 12, wherein the first insulator comprises a second insulator between the oxide and the third conductor and comprises the second insulator and a third insulator between the third conductor and each of the first conductor and the second conductor.

14. The semiconductor device according to claim 12, further comprising a fourth insulator,
wherein the fourth insulator is between the third conductor and the first insulator, and
wherein the fourth insulator is an oxide comprising at least one of aluminum and hafnium.

15. The semiconductor device according to claim 12,
wherein the oxide comprises In, an element M, and Zn, and
wherein the element M is Al, Ga, Y, or Sn.

16. A semiconductor device comprising:
an oxide;
a first conductor and a second conductor over the oxide;
a third conductor over the oxide;
a first insulator between the oxide and the third conductor, the first insulator covering a first side surface of the third conductor and a second side surface of the third conductor;
a second insulator over the third conductor and the first insulator;
a third insulator over the first conductor and in contact with a first side surface of the second insulator;
a fourth insulator over the second conductor and in contact with a second side surface of the second insulator;
a fifth insulator between the first insulator and each of the first conductor and the second conductor;
a fourth conductor in contact with a top surface and a side surface of the third insulator, the fourth conductor electrically connected to the first conductor; and
a fifth conductor in contact with a top surface and a side surface of the fourth insulator, the fifth conductor electrically connected to the second conductor, wherein the first insulator is between the third insulator and the first side surface of the third conductor, and wherein the first insulator is between the fourth insulator and the second side surface of the third conductor.

17. The semiconductor device according to claim 16, wherein the first insulator has a first thickness between the oxide and the third conductor and a second thickness between the third conductor and each of the first conductor and the second conductor, and wherein the first thickness is smaller than the second thickness.

18. The semiconductor device according to claim 16, wherein the first insulator comprises a sixth insulator between the oxide and the third conductor and comprises the sixth insulator and a seventh insulator between the third conductor and each of the first conductor and the second conductor.

19. The semiconductor device according to claim 16, further comprising:

an eighth insulator; and a ninth insulator, wherein the eighth insulator is between the first conductor and the third insulator, wherein the eighth insulator is an oxide comprising at least one of aluminum and hafnium, wherein the ninth insulator is between the second conductor and the fourth insulator, and wherein the ninth insulator is an oxide comprising at least one of aluminum and hafnium.

20. The semiconductor device according to claim 16, wherein the oxide comprises In, an element M, and Zn, and wherein the element M is Al, Ga, Y, or Sn.

* * * * *